United States Patent
Kinoshita

(10) Patent No.: US 8,248,837 B2
(45) Date of Patent: Aug. 21, 2012

(54) NONVOLATILE SEMICONDUCTOR MEMORY DEVICE AND READING METHOD OF NONVOLATILE SEMICONDUCTOR MEMORY DEVICE

(75) Inventor: Kentaro Kinoshita, Tottori (JP)

(73) Assignee: Fujitsu Limited, Kawasaki (JP)

( * ) Notice: Subject to any disclaimer, the term of this patent is extended or adjusted under 35 U.S.C. 154(b) by 189 days.

(21) Appl. No.: 12/553,172

(22) Filed: Sep. 3, 2009

(65) Prior Publication Data

US 2009/0323397 A1 Dec. 31, 2009

Related U.S. Application Data

(63) Continuation of application No. PCT/JP2007/054672, filed on Mar. 9, 2007.

(51) Int. Cl.
*G11C 11/00* (2006.01)
(52) U.S. Cl. .................................................. 365/148
(58) Field of Classification Search .................. 365/100, 365/148, 189.16
See application file for complete search history.

(56) References Cited

U.S. PATENT DOCUMENTS

| | | | | |
|---|---|---|---|---|
| 6,097,625 | A * | 8/2000 | Scheuerlein | 365/171 |
| 6,906,965 | B2 * | 6/2005 | Cioaca | 365/189.05 |
| 7,495,984 | B2 * | 2/2009 | Kim et al. | 365/210.1 |
| 7,532,497 | B2 * | 5/2009 | Kinoshita | 365/100 |
| 2006/0056232 | A1 * | 3/2006 | Koga | 365/158 |
| 2006/0120205 | A1 * | 6/2006 | Odagawa et al. | 365/232 |
| 2007/0159867 | A1 * | 7/2007 | Muraoka et al. | 365/100 |
| 2008/0123392 | A1 | 5/2008 | Kinoshita | |
| 2008/0170428 | A1 | 7/2008 | Kinoshita | |

FOREIGN PATENT DOCUMENTS

| WO | 2006/137110 A1 | 12/2006 |
|---|---|---|
| WO | 2007/023569 A1 | 3/2007 |

OTHER PUBLICATIONS

International Search Report of PCT/JP2007/054672, Mailing Date of May 29, 2007.
I. G. Baek et al., "Highly Scalable Non-Volatile Resistive Memory Using Simple Binary Oxide Driven by Asymmetric Unipolar Voltage Pulses," IEDM Techincal Digest, 2004, pp. 587-590.
A. Beck et al. "Reproducible Switching Effect in Thin Oxide Films for Memory Applications," Applied Physics Letters, Jul. 3, 2000, pp. 139-141, vol. 77, No. 1.

* cited by examiner

*Primary Examiner* — Hoai V Ho
*Assistant Examiner* — Min Huang
(74) *Attorney, Agent, or Firm* — Westerman, Hattori, Daniels & Adrian, LLP

(57) ABSTRACT

A nonvolatile semiconductor memory device includes a memory cell including a resistance memory element which memorizes a high resistance state or a low resistance state, switches the high resistance state and the low resistance state by voltage application, one end of the resistance memory element being coupled to a bit line, the other end of the resistance memory element being coupled to a source line via the first transistor; and a resistor whose resistance value is higher than a resistance value of the resistance memory element in the low resistance state and lower than a resistance value of the resistance memory element in the high resistance state, one end of the resistor being coupled to said one end of the resistance memory element and the bit line, the other end of the resistor being coupled to the source line via the second transistor.

9 Claims, 31 Drawing Sheets

NONVOLATILE SEMICONDUCTOR MEMORY DEVICE AND READING METHOD OF NONVOLATILE SEMICONDUCTOR MEMORY DEVICE

CROSS-REFERENCE TO RELATED APPLICATION

This application is a Continuation of PCT application No. PCT/JP2007/54672, which was filed on Mar. 9, 2007, and which designated the United States of America, the entire contents of which are incorporated herein by reference.

FIELD

The embodiments discussed herein are related to a nonvolatile semiconductor memory device and reading method of a nonvolatile semiconductor memory device.

BACKGROUND

Recently, as a new memory device, a nonvolatile semiconductor memory device called ReRAM (Resistance Random Access Memory) is noted. The ReRAM uses resistance memory elements which have a plurality of resistance states of different resistance values and have the resistance states changed by external application of electric stimuli, and is used as a memory element by corresponding the high resistance state and the low resistance state of the resistance memory elements to, e.g., "0" and "1" of information. The ReRAM, which can realize high speed, large capacities, low electric power consumption, etc., is very prospective.

Related references are as follows:

A. Beck et al., "Reproducible switching effect in thin oxide films for memory applications", Applied Physics Letters, Volume 77, Number 1, p. 139-141 (2000), and I. G. Baek et al., "Highly Scalable Non-volatile Resistive Memory using simple Binary Oxide Driven by Asymmetric Unipolar Voltage Pulses", IEDM Technical Digest, p. 587-590 (2004).

SUMMARY

According to an aspect of the embodiment, a nonvolatile semiconductor memory device including a memory cell including a resistance memory element which memorizes a high resistance state or a low resistance state, switches the high resistance state and the low resistance state by voltage application, one end of the resistance memory element being coupled to a bit line, the other end of the resistance memory element being coupled to a source line via the first transistor, and a resistor whose resistance value is higher than a resistance value of the resistance memory element in the low resistance state and lower than a resistance value of the resistance memory element in the high resistance state, one end of the resistor being coupled to the one end of the resistance memory element and the bit line, the other end of the resistor being coupled to the source line via the second transistor.

According to another aspect of the embodiment, a nonvolatile semiconductor memory device including a memory cell including a resistance memory element which memorizes a high resistance state or a low resistance state, switches the high resistance state and the low resistance state by voltage application, one end of the resistance memory element being coupled to a bit line, the other end of the resistance memory element being coupled to a source line via the first transistor, and a resistor including another resistance memory element whose resistance value is higher than a resistance value of the resistance memory element in the high resistance state and is a minimum resistance value of the resistance memory element in the high resistance state or lower, one end of the resistor being coupled to said one end of the resistance memory element and the bit line, the other end of the resistor being coupled to the source line via the second transistor.

According to further another aspect of the embodiment, a nonvolatile semiconductor memory device including a memory cell including a resistance memory element which memorizes a high resistance state or a low resistance state, switches the high resistance state and the low resistance state by voltage application, one end of the resistance memory element being coupled to a bit line, the other end of the resistance memory element being coupled to a source line via the first transistor, and the second transistor having a drain terminal coupled to said one end of the resistance memory element and the bit line and having a source terminal coupled to the source line, when information written in the memory cell is read, a voltage is applied to a gate terminal of the second transistor so that a resistance value between the source terminal of the second transistor and the drain terminal of the second transistor is larger than a resistance value of the resistance memory element in the low resistance state and smaller than a resistance value of the resistance memory element in the high resistance state.

According to further another aspect of the embodiment, a nonvolatile semiconductor memory device including a memory cell including a resistance memory element which memorizes a high resistance state or a low resistance state, switches the high resistance state and the low resistance state by voltage application, one end of the resistance memory element being coupled to a bit line, the other end of the resistance memory element being coupled to a source line via the first transistor, the resistance memory element including the first electrode, a resistance memory layer formed over the first electrode and the second electrode formed over the resistance memory layer, and a dopant impurity for decreasing the electric resistance of the resistance memory layer being implanted in the resistance memory layer.

According to further another aspect of the embodiment, a reading method of a nonvolatile semiconductor memory device including a memory cell including a resistance memory element which memorizes a high resistance state or a low resistance state, switches the high resistance state and the low resistance state by voltage application, one end of the resistance memory element being coupled to a bit line, the other end of the resistance memory element being coupled to a source line via the first transistor, and a resistor whose resistance value is higher than a resistance value of the resistance memory element in the low resistance state and lower than a resistance value of the resistance memory element in the high resistance state, one end the resistor being coupled to said one end of the resistance memory element and the bit line, the other end of the resistor being coupled to the source line via the second transistor, information written in the memory cell being read, based on a current flowing in the bit line when a prescribed voltage is applied to a gate terminal of the first transistor so that the first transistor is turned on-state, a prescribed voltage is applied to a gate terminal of the second transistor so that the second transistor is turned on-state, the source line is grounded, and a prescribed voltage is applied to the bit line.

According to further another aspect of the embodiment, a reading method of a nonvolatile semiconductor memory device including a memory cell including a resistance memory element which memorizes a high resistance state or a low resistance state, switches the high resistance state and the low resistance state by voltage application, one end of the resistance memory element being coupled to a bit line, the other end of the resistance memory being coupled to a source line via the first transistor, and the second transistor having a drain terminal coupled to said one end of the resistance memory element and the bit line and having the source terminal coupled to the source line, information written in the memory cell being read, based on a current flowing in the bit line when a first voltage is applied to a gate terminal of the first transistor so that the first transistor is turned on-state, a second voltage which is lower than the first voltage to a gate terminal of the second transistor so that a resistance value between the source terminal of the second transistor and the drain terminal of the second transistor becomes larger than a resistance value of the resistance memory element in the low resistance state and smaller than a resistance value of the resistance memory element in the high resistance state, the source line is grounded, and a prescribed voltage is applied to the bit line.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

The resistance memory element includes a resistance memory material whose resistance state is changed by the application of voltages sandwiched between a pair of electrodes. As the typical resistance memory material is known the transition metal content oxide material.

Figure 31:
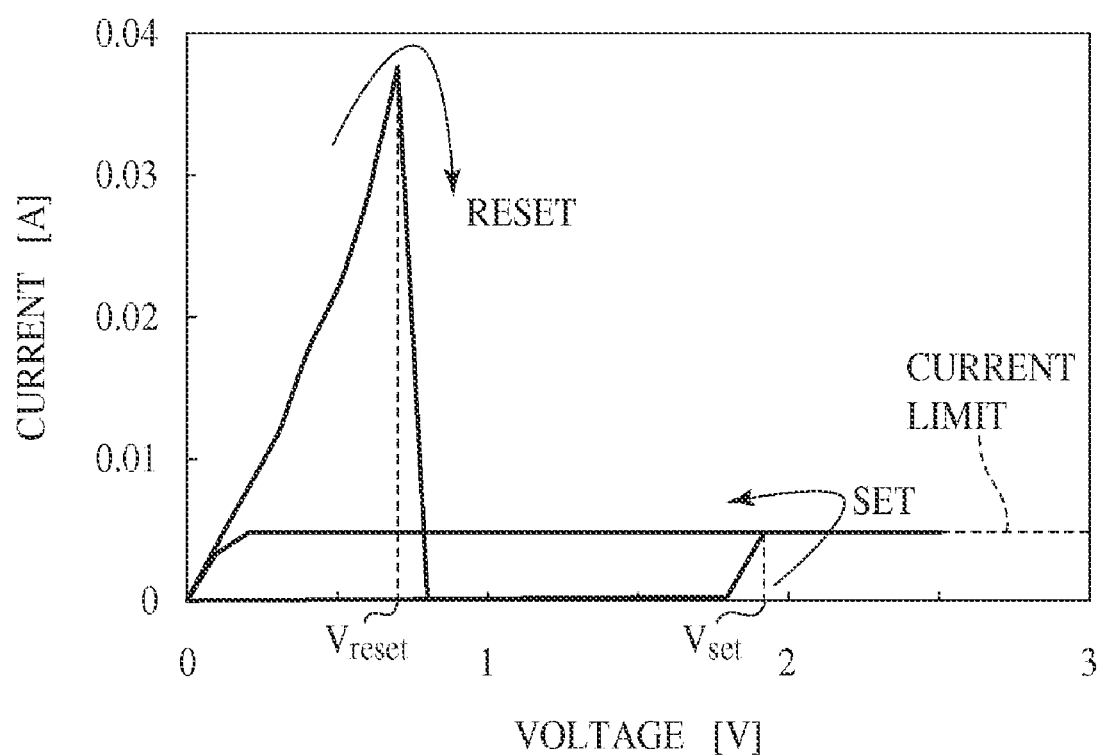
FIG. 31 is a graph (Part 5) of the current-voltage characteristics of the resistance memory element.

FIG. 31 is a graph of the current-voltage characteristics of the resistance memory element. As illustrated in FIG. 31, as a voltage is applied gradually increasingly to the resistance memory element in the high resistance state, the resistance value abruptly decreases when the voltage exceeds a certain value (reset voltage $V_{set}$), and the resistance memory element transits to the low resistance state. This operation is called "set". On the other hand, a voltage is applied gradually decreasingly to the resistance memory element in the low resistance state, the resistance value abruptly increases when the voltage exceeds a certain value (reset voltage $V_{reset}$), and the resistance memory element transits to the high resistance state. This operation is called "reset".

These operations permit the resistance states of the resistance memory element to be controlled only by simply applying voltages to the resistance memory elements.

The read of data can be made by measuring the value of a voltage of the resistance memory element when a prescribed read current is flowed in the resistance memory element.

However, the resistance memory element has large scatter of the resistance value in the high resistance state. Accordingly, there is a risk that read errors might take place when the resistance memory element is simply used.

Figure 1A:
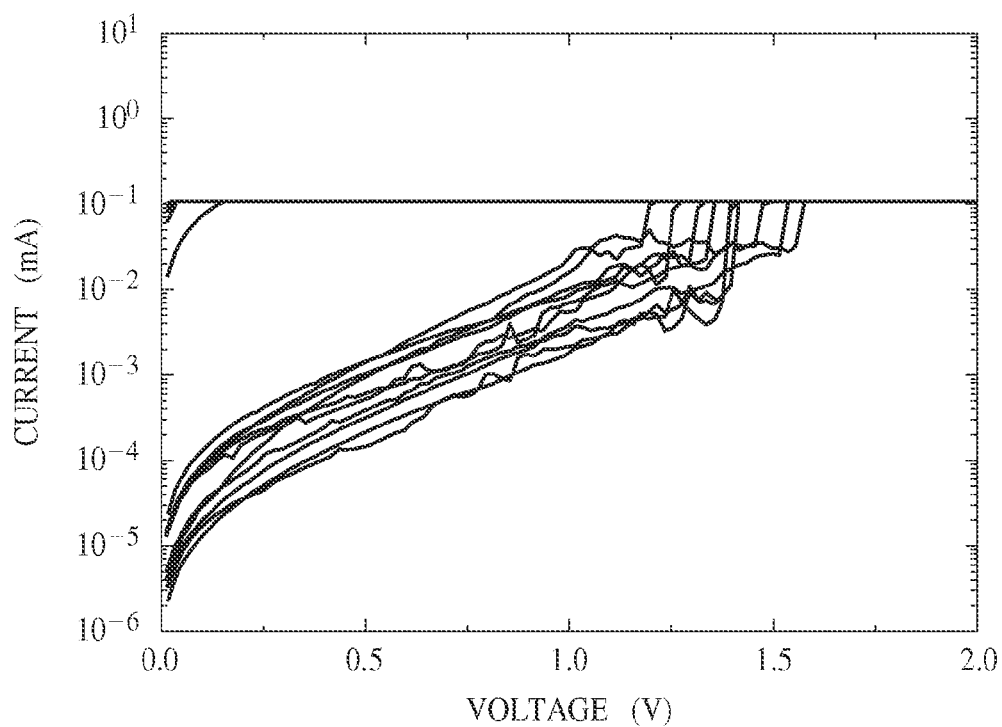
FIGS. 1A and 1B are graphs (Part 1) of the current-voltage characteristics of the resistance memory element.

FIG. 1A is a graph of the current-voltage characteristics of a resistance memory element given when the set and the reset were repeated 10 times. In measuring the current-voltage characteristics illustrated in FIG. 1A, the applied voltage to the resistance memory element in the high resistance state was gradually increased. The size of the resistance memory element was 1.5 µm×1.5 µm. As the material of the upper electrode and the lower electrode of the resistance memory element, Pt was used. As the material of the resistance memory layer of the resistance memory element, $NiO_X$ was used.

As seen in FIG. 1A, the measurement was made on one and the same resistance memory element, the resistance value in the high resistance state has the scatter of about 10 to 100 times.

Figure 2A:
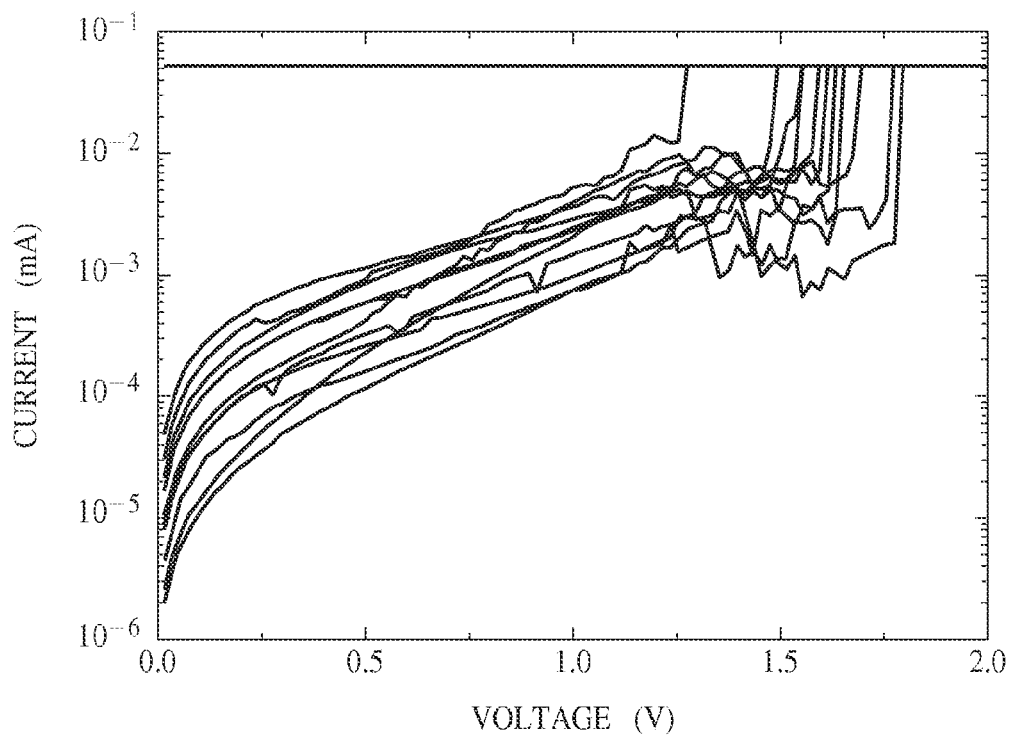
FIGS. 2A and 2B are graphs (Part 2) of the current-voltage characteristics of the resistance memory element.

FIG. 2A is a graph of the current-voltage characteristics of twelve resistance memory elements arbitrarily selected. In measuring the current-voltage characteristics illustrated in FIG. 2A, the applied voltage to the resistance memory elements in high resistance state was gradually increased. The size of the resistance memory elements was 1.5 μm×1.5 μm, as above. As the material of the lower electrodes and the upper electrodes of the resistance memory elements was Pt as above. As the material of the resistance memory layer of the resistance memory elements, $NiO_X$ was used as above.

As seen in FIG. 2A, also among the discrete resistance memory elements, the resistance value in the high resistance state has the scatter of about 10 to 100 times.

Figure 1B:
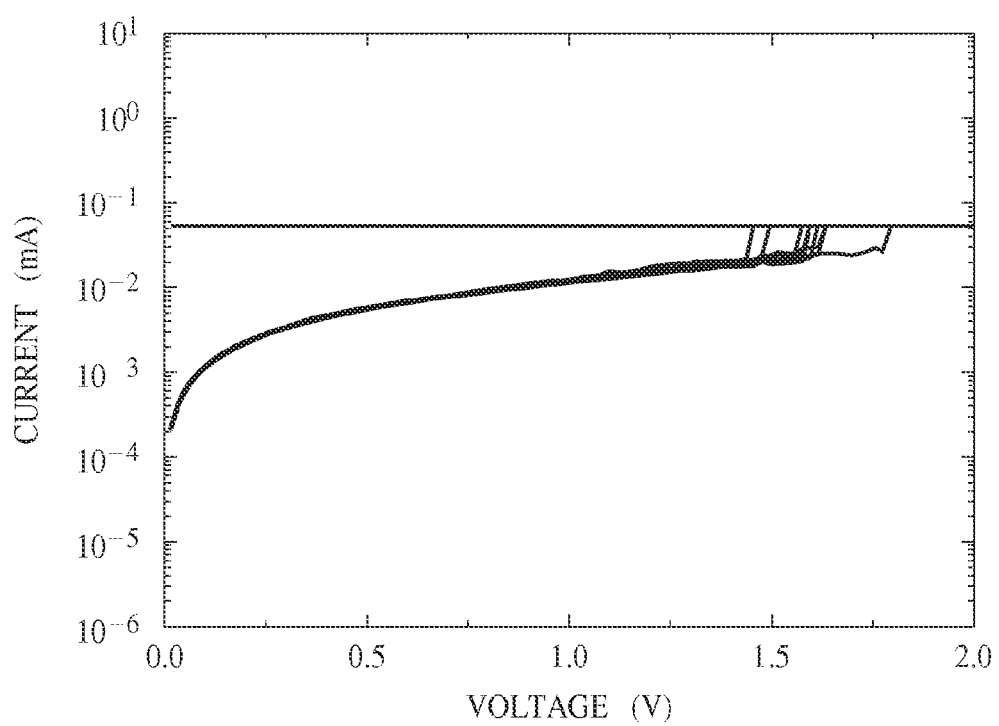

FIG. 1B is a graph of the current-voltage characteristics of the resistance memory element given when a resistor was connected to the resistance memory element in parallel, and the set and the reset were repeated 10 times. As the resistor connected in parallel with the resistance memory element, the resistor whose resistance values was relatively small and whose scatter of the resistance value was very small was used. In the current-voltage characteristics illustrated in FIG. 1A, the lowest value of the electric resistance of the resistance memory element in the high resistance state was about 700 kΩ. Accordingly, the resistance value of the resistor connected in parallel with the resistance memory element was set at 100 kΩ.

As seen in FIG. 1B, with the resistor whose resistance value is relatively small being connected in parallel with the resistance memory element, the scatter of the current-voltage characteristics is much decreased.

Figure 2B:
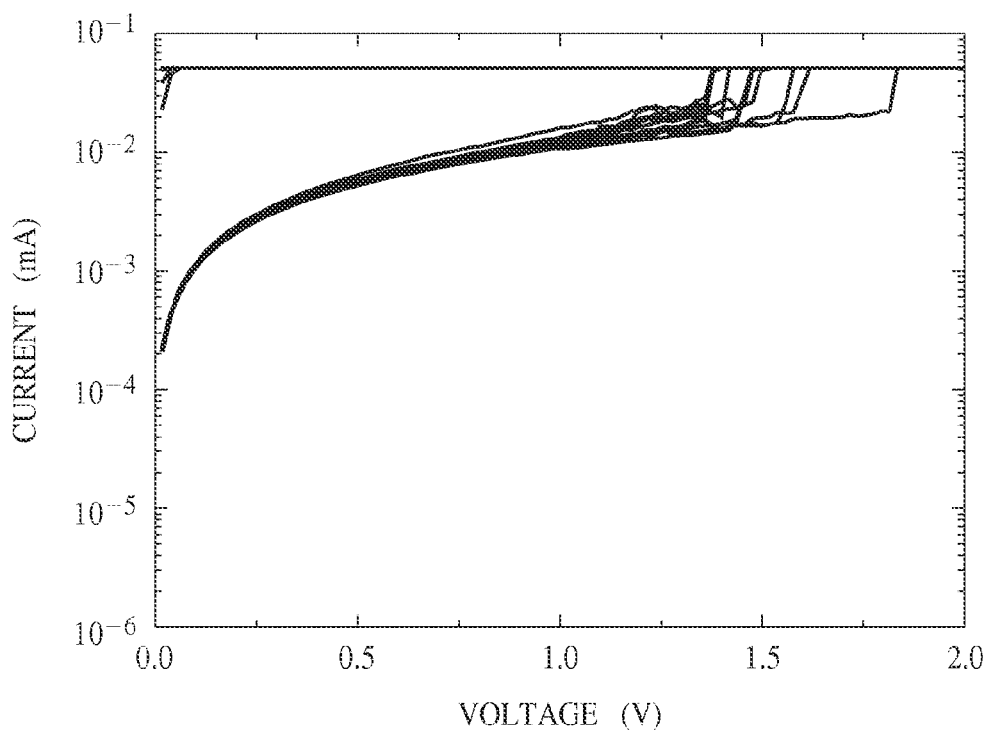

FIG. 2B is a graph of the current-voltage characteristics of twelve resistance memory elements arbitrarily selected having resistors connected in parallel with the respective resistance memory elements. As the resistors connected in parallel with the resistance memory elements, resistors whose resistance values were relatively small and whose scatter of the resistance values were very small were used. In the current-voltage characteristics illustrated in FIG. 2A, the lowest value of the electric resistance of the resistance memory elements in the high resistance state were about 700 kΩ. Accordingly, the resistance value of the resistors connected in parallel with the resistance memory elements were set at 100 kΩ.

As seen in FIG. 2B, with the resistors whose resistance values are relatively small being connected in parallel with the resistance memory elements, the scatter of the current-voltage characteristics are much decreased.

For the following reason, the scatter of the current-voltage characteristics can be much decreased by thus connecting a resistor whose resistance value is relatively small in parallel with the resistance memory element.

That is, because the resistance value of the resistor connected in parallel with the resistance memory element is sufficiently lower than the resistance value of the resistance memory element in the high resistance state, the resistance value of the resistor connected in parallel with the resistance memory element is dominant in the combined resistance of the resistor and the resistance memory element. When the resistance memory element of 700 kΩ and the resistor of 100 kΩ are connected in parallel with each other, the value of the combined resistance is 87.5 kΩ. The scatter of the resistance value of the resistor connected in parallel with the resistance memory element is very small. Therefore, even when the resistance value of the resistance memory element much scatter, the value of the combined resistance of the resistance memory element and the resistor hardly scatters. Accordingly, when a resistor whose resistance value is relatively small and whose scatter of the resistance value is relatively small is connected in parallel with the resistance memory element, the scatter of the current-voltage characteristics is much decreased.

As described above, a resistor whose resistance value is relatively small and whose scatter of the resistance value is relative small is connected in parallel with a resistance memory element, whereby the scatter of the current-voltage characteristics can be decreased.

The scatter of the current-voltage characteristics can be decreased also as follows.

Figure 3A:
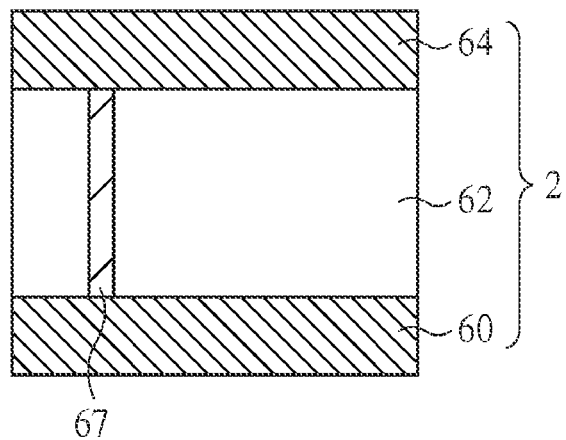
FIGS. 3A and 3B are a schematic sectional view and an equivalent circuit of the resistance memory element.
Figure 3B:
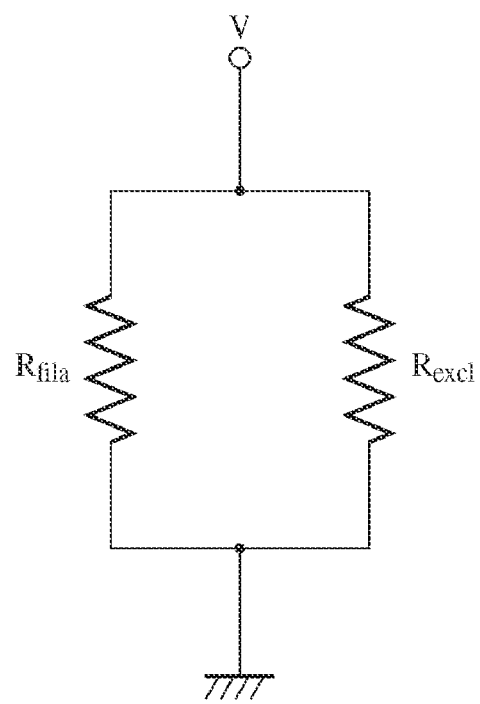

FIG. 3A is a schematic sectional view of the resistance memory element. FIG. 3B is a view of an equivalent circuit of the resistance memory element.

As illustrated in FIG. 3A, the resistance memory element 62 comprises a lower electrode 60 of, e.g., Pt, a resistance memory layer 62 of, e.g., $NiO_X$, and an upper electrode 64 of, e.g., Pt. In the resistance memory element 2, a region (filament region) 67 where the resistance change takes place is considered to be a partial region of the resistance memory element 2.

Accordingly, the equivalent circuit of the resistance memory element 2 is considered to have, as illustrated in FIG. 3B, the resistance $R_{fila}$ of the filament region 67 and the resistance $R_{excl}$ of the region except the filament region 67 connected in parallel with each other.

The resistance $R_{excl}$ of the region except the filament region is set sufficiently small, whereby the resistance vale of the resistance $R_{excl}$ of the region except the filament region 67 is dominant in the combined resistance of the resistance $R_{fila}$ of the filament region 67 and the resistance $R_{excl}$ of the region except the filament region 67. The scatter of the resistance $R_{fila}$ of the filament region 67 is large, but the scatter of the resistance $R_{excl}$ of the region except the filament region 67 is very small. Accordingly, the resistance $R_{excl}$ of the region except the filament region 67 is made sufficiently low, whereby even when the resistance $R_{fila}$ of the filament region 67 is largely scatter, the value of the combined resistance of the resistance $R_{fila}$ of the filament region 67 and the resistance $R_{excl}$ of the region except the filament region 67 hardly scatters.

Figure 4A:
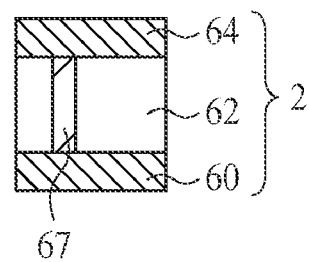
FIGS. 4A and 4B are graphs (Part 3) of the current-voltage characteristics of the resistance memory element.
Figure 4B:
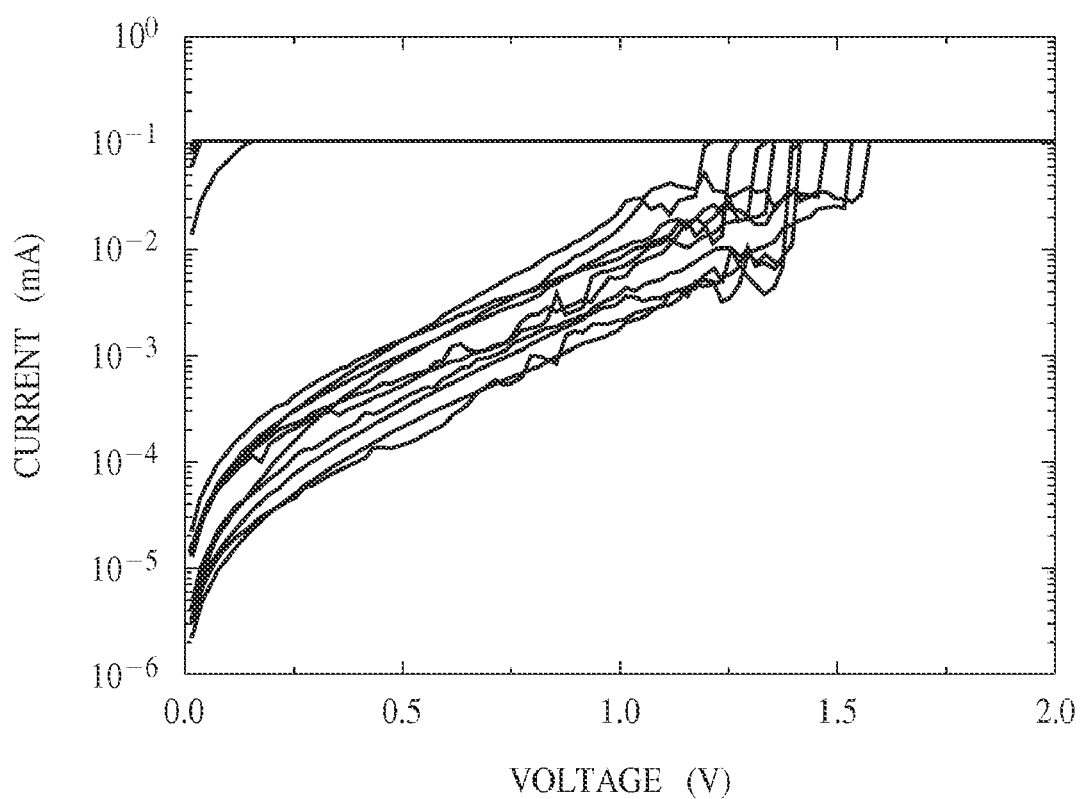

FIG. 4A is a schematic sectional view of the resistance memory element of a 1.5 μm×1.5 μm size. FIG. 4B is a graph of the current-voltage characteristics of the resistance memory element illustrated in FIG. 4A.

In the resistance memory element 2 illustrated in FIG. 4A, because the area of the region except the filament region 67 is not so large, the resistance $R_{excl}$ of the region except the filament region 67 is not sufficiently small in comparison with the resistance $R_{fila}$ of the filament region 67. Accordingly, the resistance value of the resistance $R_{excl}$ of the region except the filament region 67 is not dominant in the combined resistance of the resistance $R_{fila}$ of the filament region 67 and the resistance $R_{excl}$ of the region except the filament region 67.

As seen in FIG. 4B, in the 1.5 μm×1.5 μm resistance memory element, the scatter of the current-voltage characteristics is large.

Figure 5A:
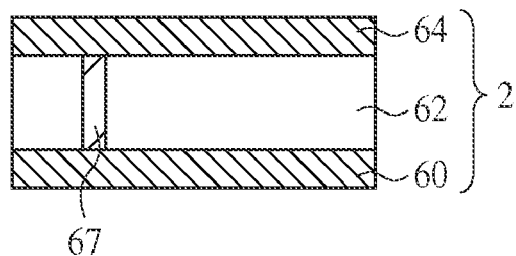
FIGS. 5A and 5B are graphs (Part 4) of the current-voltage characteristics of the resistance memory element.
Figure 5B:
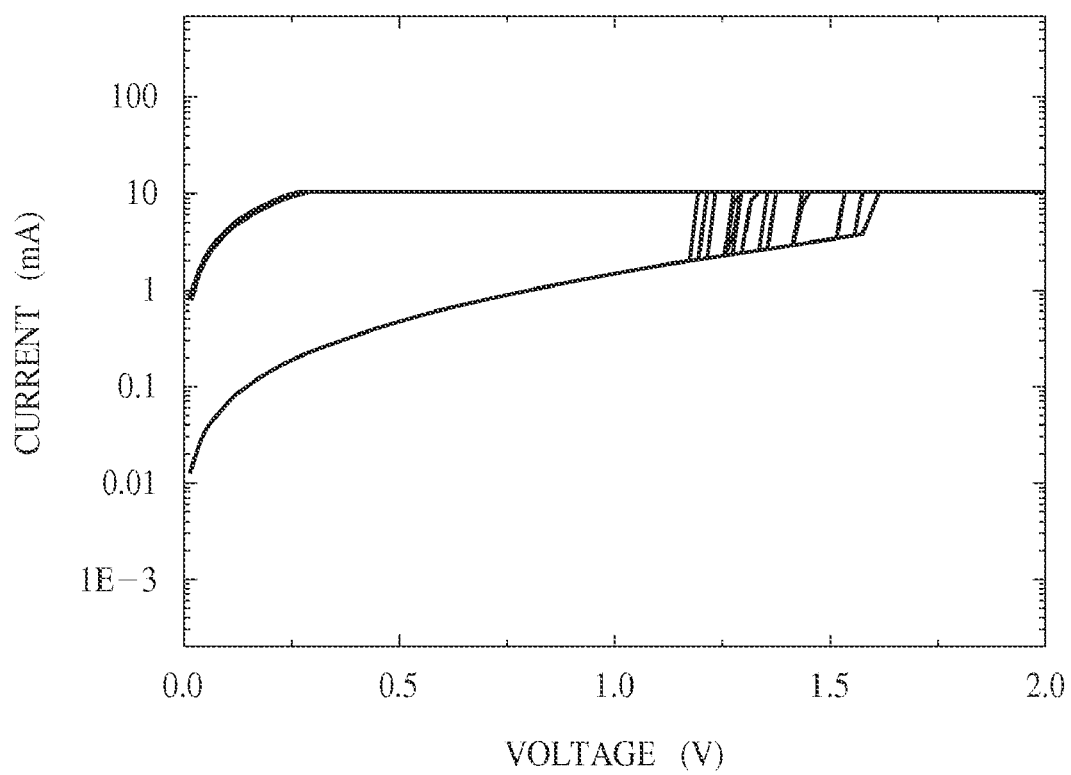

FIG. 5A is a schematic sectional view of the resistance memory element of a 170 μm×170 μm. FIG. 5B is a graph of the current-voltage characteristics of the resistance memory element illustrated in FIG. 5A.

In the resistance memory element 2 illustrated in FIG. 5A, because the area of the region except the filament region 67 is sufficiently large, the resistance $R_{excl}$ of the region except the filament region 67 is sufficiently small in comparison with the resistance $R_{fila}$ of the filament region 67. Accordingly, in the combined resistance of the resistance $R_{fila}$ of the filament region 67 and the resistance $R_{excl}$ of the region except the filament region 67, the resistance value of the resistance $R_{excl}$ of the region except the filament region 67 is dominant.

As seen in FIG. 5B, in the resistance memory element 2 of a 170 μm×170 μm size, the scatter of the current-voltage characteristics is very small.

As described above, the resistance $R_{excl}$ of the region except the filament region 67 is made sufficiently small, whereby the same effect as the effect obtained by connecting a resistor of a relatively small resistance value in parallel with the resistance memory element can be obtained. Thus, also by making sufficiently small the resistance $R_{excl}$ of the region except the filament region 67, the scatter of the current-voltage characteristics can be much decreased.

Preferred embodiments of the present invention will be explained with reference to accompanying drawings.

[a] First Embodiment

Figure 6:
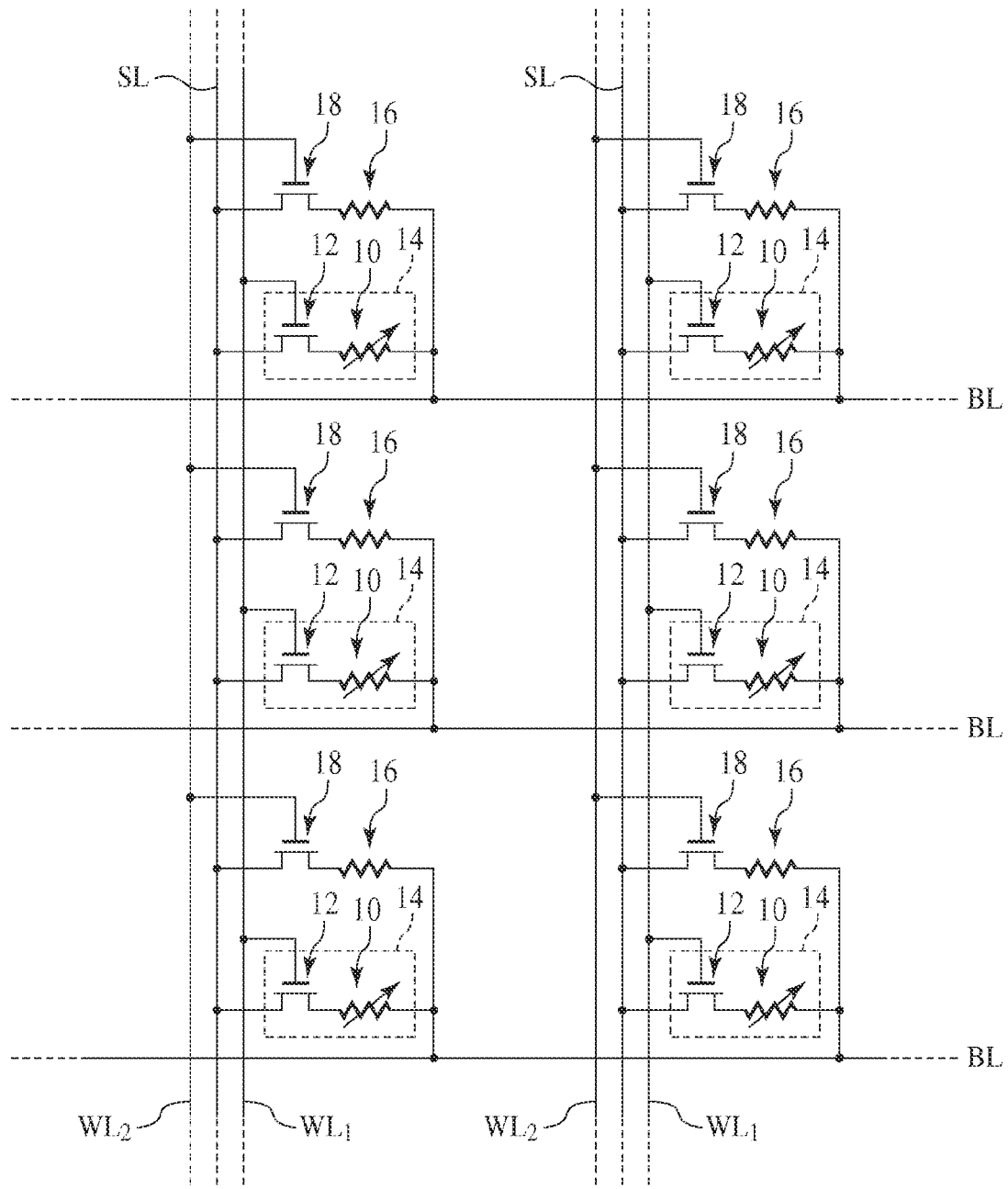
FIG. 6 is the circuit diagram of the nonvolatile semiconductor memory device according to a first embodiment.
Figure 7:
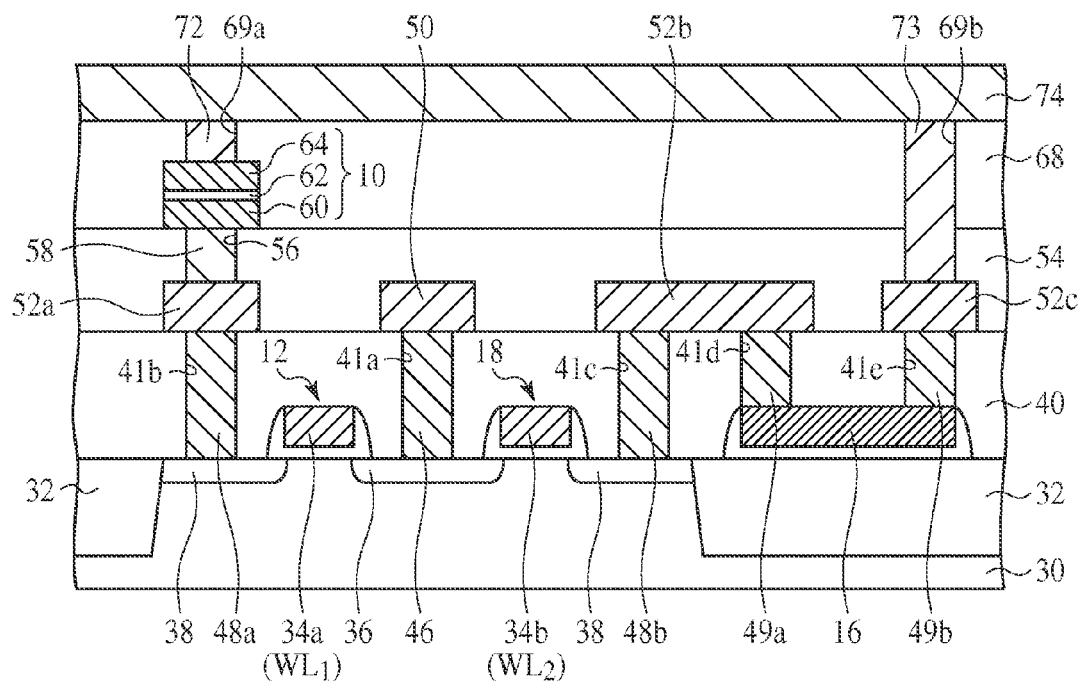
FIG. 7 is a sectional view of the nonvolatile semiconductor memory device according to the first embodiment, which illustrates the structure thereof.

The nonvolatile semiconductor memory device according to a first embodiment and its reading method will be explained with reference to FIGS. 6 and 7. FIG. 6 is the circuit diagram of the nonvolatile semiconductor memory device according to the present embodiment. FIG. 7 is a sectional view of the nonvolatile semiconductor memory device according to the present embodiment, which illustrates the structure thereof.

(Circuit Structure of Nonvolatile Semiconductor Memory Device)

First, the circuit structure of the nonvolatile semiconductor memory device according to the present embodiment will be explained with reference to FIG. 6.

As illustrated in FIG. 6, a plurality of word lines WL1, WL2 and a plurality of source lines SL are arranged row-wise (longitudinally in the drawing). A plurality of bit lines BL are arranged column-wise (transversely in the drawing).

At the respective intersections between the word lines WL1, WL2 and the bit lines BL, memory cell 14 each including a resistance memory 10 and the first transistor (selective transistor) 12 are formed.

The resistance memory element 10 memorizes a high resistance state and a low resistance state, and the high resistance state and the low resistance state are switched by voltage application. When a voltage higher than a reset voltage and lower than a set voltage is applied to the resistance memory element 10 in the low resistance state, the resistance memory element 10 in the low resistance state is changed to the high resistance state. On the other hand, a voltage which is higher than the set voltage to the resistance memory element 10 in the high resistance state is applied, the resistance memory element 10 is changed from the high resistance state into the low resistance state.

The resistance value $R_{low}$ of the resistance memory element 10 in the low resistance state is, e.g., about 500Ω to 5 kΩ. The resistance value $R_{low}$ of the resistance memory element 10 in the low resistance state is, e.g., about 1 kΩ here.

On the other hand, the resistance value $R_{high}$ of the resistance memory element 10 in the high resistance state is, e.g., about 50 kΩ to 500 MΩ. The resistance value $R_{high}$ of the resistance memory element 10 in the high resistance state is thus largely scatters. The maximum value of the resistance value $R_{high}$ of the resistance memory element 10 in the high resistance state is, e.g., about 10 MΩ. The minimum value of the resistance value $R_{high}$ of the resistance memory element 10 in the high resistance state is, e.g., about 100 kΩ here.

In each of the memory cells 14, the resistance memory element 10 has one end electrically connected to the associated bit line BL. In each memory cell 14, the other end of the resistance memory element 10 is electrically connected to one, i.e., the drain terminal, of the source/drain diffused layers of the first transistor 12.

In each memory cell 14, the other end, i.e., the source terminal, of the source/drain diffused layers of the first transistor 12 is electrically connected to the associated source line SL. In each memory cell 14, the gate electrode, i.e., the gate terminal, of the first transistor 12 is electrically connected to the associated word line WL1.

In each memory cell 14, a resistor (an electric resistor, a resistance element) 16 is connected in parallel with the memory cell 14, and the second transistor 18 is connected serially to the resistor 16.

In each memory cell 14, the resistor 16 has one end electrically connected to one end of the resistance memory element 10 and to the associated bit line BL. In each memory cell 14, the other end of the resistor 16 is electrically connected to one, i.e., the drain terminal, of the source/drain diffused layers of the second transistor 18.

In each memory cell 14, the other, i.e., the source terminal, of the source/drain diffused layers of the second transistor 18 is electrically connected to the associated source line SL. In each memory cell 14, the gate electrode, i.e., the gate terminal, of the second transistor 18 is electrically connected to the associated second word line WL2.

The resistance value of the resistors 16 connected in parallel with the memory cells 14 is set sufficiently large for the resistance value of the resistance memory element 10 in the low resistance state and sufficiently small for the minimum value of the resistance of the resistance memory element 10 in the high resistance state. The resistance value of the resistance memory element 10 in the low resistance state is, e.g., about 1 kΩ. On the other hand, the minimum value of the resistance of the resistance memory element 10 in the high resistance state is, e.g., about 100 kΩ. The resistance value of the resitor 16 is, e.g., 10 kΩ here.

To the ends of the bit lines BL, a column decoder (control circuit) (not illustrated) for suitably selecting the bit lines BL is connected. To the column decoder, a read circuit (not illustrated) is connected.

Such read circuit is for reading information written in the memory cells 14, based on currents flowing in the bit lines of the selected column.

To the ends of the word lines WL1, WL2, a row selector (control circuit) (not illustrated) for suitably selecting the word lines WL1, WL2 is connected. To the ends of the source lines SL, another row selector (control circuit) (not illustrated) for grounding the source lines SL is connected.

Thus, the nonvolatile semiconductor memory device according to the present embodiment is constituted.

(Structure of the Nonvolatile Semiconductor Memory Device)

Next, the structure of the nonvolatile semiconductor memory device according to the present embodiment will be explained with reference to FIG. 7.

As illustrated in FIG. 7, device isolation regions 32 for defining device regions are formed on a semiconductor substrate 30.

On the semiconductor substrate 30 with the device regions defined, the word lines WL1 and the word lines WL2 are formed with a gate insulation film formed therebetween. The word lines WL1 function also as the gate electrodes 34a of the first transistors. The word lines WL2 function also as the gate electrodes 34b of the second transistors. The word lines WL1 and the word lines WL2 are extended vertically as viewed in the drawing of FIG. 7.

In the semiconductor substrate 30 on both sides of each word line WL1 and in the semiconductor substrate 30 on both sides of the each word line WL2, the source/drain diffused layers 36, 38 are formed.

The gate electrode 34a functioning also as the word line WL1, and the source/drain diffused layers 36, 38 form the first transistor 12.

The gate electrode 34b functioning also as the word line WL2, and the source/drain diffused layers 36, 38 form the second transistor 18.

One source/drain diffused layer 36 of the first transistor 12, and one source/drain diffused layer 36 of the second transistor 18 are formed of the common source/drain diffused layer 36.

On the device isolation region 32, the resistor 16 of, e.g., polysilicon is formed.

On the semiconductor substrate 30 with the first transistor 12, the second transistor 18 and the resistor 16 formed on, an inter-layer insulation film 40 is formed.

In the inter-layer insulation film 40, a contact plug 46 connected to the source/drain diffused layer 36, a contact plug 48a connected to the source/drain diffused layer 38, a contact plug 48b connected to the source/drain diffused layer 38, a contact plug 49a connected to one end of the resistor 16 and a contact plug 49b connected to the other end of the resistor 16 are buried.

On the inter-layer insulation film 40, the source line 50 (SL) electrically connected to the source/drain diffused layer 36 via the contact plug 46, a relay interconnection 52a electrically connected to the source/drain diffused layer 38 via the contact plug 48a, a relay interconnection 52b electrically connecting the contact plug 48b and the contact plug 49a to each other, and a relay interconnection 52c electrically connecting the resistor 16 via the contact plug 49b are formed. The source line 50 are formed in parallel with the word line WL1 and the word line WL2, extended vertically as viewed in the drawing.

On the inter-layer insulation film 40 with the source line 50 and the relay interconnections 52a-52c formed on, an inter-layer insulation film 54 is formed. In the inter-layer insulation film 54, a contact plug 58 is buried, connected to the relay interconnection 52a.

On the inter-layer insulation film 54 with the contact plug 58 buried in, the resistance memory element 10 is formed. The resistance memory element 10 comprises a lower electrode 60 electrically connected to the source/drain diffused layer 38 via the contact plug 58, etc., a resistance memory layer 62 of a resistance memory material formed on the lower electrode 60, and an upper electrode 64 formed on the resistance memory layer 62. The lower electrode 60 and the upper electrode 64 are formed of, e.g., platinum. The resistance memory layer 62 is formed of, e.g., $NiO_X$.

On the inter-layer insulation film 54 with the resistance memory element 10 formed on, an inter-layer insulation film 68 is formed. In the inter-layer insulation film 68, a contact plug 72 is buried, connected to the upper electrode 64. In the inter-layer insulation film 68 and the inter-layer insulation film 54, a contact plug 73 is buried, connected to the relay interconnection 52c.

On the inter-layer insulation film 68 with the contact plugs 72, 73 buried in, the bit line 74 (BL) is formed. The bit line 74 is extended in the horizontal direction as viewed in the drawing. The bit line 74 is electrically connected to the upper electrode 64 of the resistance memory element 10 via the contact plug 72. The bit line 74 is electrically connected to the end of the resistor 16 via the contact plug 73, etc.

Thus, the nonvolatile semiconductor memory device according to the present embodiment is constituted.

As described above, in the nonvolatile semiconductor memory device according to the present embodiment, the resistor 16 whose resistance value is relatively small and whose scatter of the resistance value is relatively small is brought into parallel connection with the resistance memory element 10 when information written in the resistance memory element 10 is read. Because the resistance value of the resistor 16 to be connected in parallel with the resistance memory element 10 is sufficiently low in comparison with the resistance value of the resistance memory element 10 in the high resistance state, the resistance value of the resistor 16 connected in parallel with the resistance memory element 10 is dominant in the combined resistance of the resistor 16 and the resistance memory element 10. The scatter of the resistance value of the resistor 16 connected in parallel with the resistance memory element 10 is very small. Accordingly, even if the resistance value of the resistance memory element 10 largely scatter, the value of the combined resistance of the resistance memory element 10 and the resistor 16 hardly scatters. Thus, according to the present embodiment, the scatter of the read current can be made small, and resultantly the nonvolatile semiconductor memory device can effectively prevent read errors.

Next, the writing method and the reading method of the nonvolatile semiconductor memory device according to the present embodiment will be explained with reference to FIG. 6.

(Writing Method)

First, the reset of the resistance memory elements 10, i.e., the write of the high resistance state in the resistance memory elements 10 will be explained with reference to FIG. 6.

When the high resistance state is written in the resistance memory element 10, the word line WL1 connected to a memory cell 14 to be written is selected by the row selector (not illustrated). Specifically, a prescribed voltage is applied by the row selector to the word line WL1 connected to the memory cell 14 to be written. The source line SL is connected to a prescribed reference potential, e.g., the ground potential. Thus, the first transistor 12 of the memory cell 14 to be written is turned on. No voltage is applied to the word line WL2 connected to the second transistor 18 when the write is made in the resistance memory element 10.

Then, the bit line BL connected to the memory cell 14 to be written is selected by the column selector (not illustrated). Specifically, a prescribed voltage is applied for a prescribed period of time to the bit line BL connected to the memory cell 14 to be written.

Thus, the high resistance state is written in the resistance memory element 10 of the memory cell 14 to be written.

Next, the set of the resistance memory elements 10, i.e., the write of the low resistance state in the resistance memory elements 10 will be explained with reference to FIG. 6.

When the low resistance state is written in the resistance memory elements 10, the word line WL1 connected to the memory cell 14 to be written is selected by the row selector (not illustrated). Specifically, a prescribed voltage is applied by the row selector to the word line WL1 connected to the memory cell 14 to be written. The source line SL is connected to a prescribed reference potential, e.g., the ground potential. Thus, the first transistor 12 of the memory cell 14 to be written is turned on.

When the write is made in the resistance memory element 10, no voltage is applied to the word line WL2 connected to the second transistor 18.

Then, the bit line BL connected to the memory cell 14 to be written is selected by the column selector (not illustrated). Specifically, a prescribed voltage is applied for a prescribed period of time to the bit line BL connected to the memory cell 14 to be written.

Thus, the low resistance state is written in the resistance memory element 10 of the memory cell 14 to be written.

(Reading Method)

Next, the reading method of the nonvolatile semiconductor memory device according to the present embodiment will be explained with reference to FIG. 6.

When information written in the resistance memory elements 10 of the memory cells 14 is read, the word line WL1 connected to the memory cell 14 to be read is selected by the row selector (not illustrated). Specifically, a prescribed voltage is applied by the row selector to the word line WL1 connected to the memory cell 14 to be read. The source line SL is connected to a prescribed reference potential, e.g., the ground potential. Thus, the first transistor 12 of the memory cell 14 to be read is turned on-state.

The word line WL2 connected to the memory cell 14 to be read is selected by the row selector (not illustrated). Specifically, a prescribed voltage is applied by the row selector to the word line WL2 connected to the memory cell 14 to be read. Thus, the second transistor 18 of the memory cell 14 to be read is turned on-state.

Next, the bit line BL connected to the memory cell 14 to be read is selected by the column selector (not illustrated). Thus, the bit line BL selected by the column selector is connected to the read circuit (not illustrated). When the high resistance state has been written in the resistance memory element 10 of the memory cell 14 to be read, a relatively small current flows in the bit line BL. On the other hand, when the low resistance state has been written in the resistance memory element 10 of the memory cell 14 to be read, a relatively large current flows in the bit line BL. The read circuit detects by the sense amplifier the current flowing in the bit line BL and judges whether the resistance memory element 10 has the low resistance state or the high resistance state. That is, the read circuit reads information written in the resistance memory element 10, based on the current flowing in the bit line BL.

In the present embodiment, when information written in a resistance memory element 10 is read, the resistor 16 whose resistance value is relatively small and whose scatter of the resistance value is relatively small is brought into the parallel connection with the resistance memory element 10, whereby the scatter of the read current can be made small. Thus, according to the present embodiment, the nonvolatile semiconductor memory device can effectively prevent read errors.

(Method for Manufacturing the Nonvolatile Semiconductor Memory Device)

Next, the method for manufacturing the nonvolatile semiconductor memory device according to the present embodiment will be explained with reference to FIGS. 8A to 10B. FIGS. 8A to 10B are sectional views of the nonvolatile semiconductor memory device in the steps of the method for manufacturing the nonvolatile semiconductor memory device, which illustrate the manufacturing method.

Figure 8A:
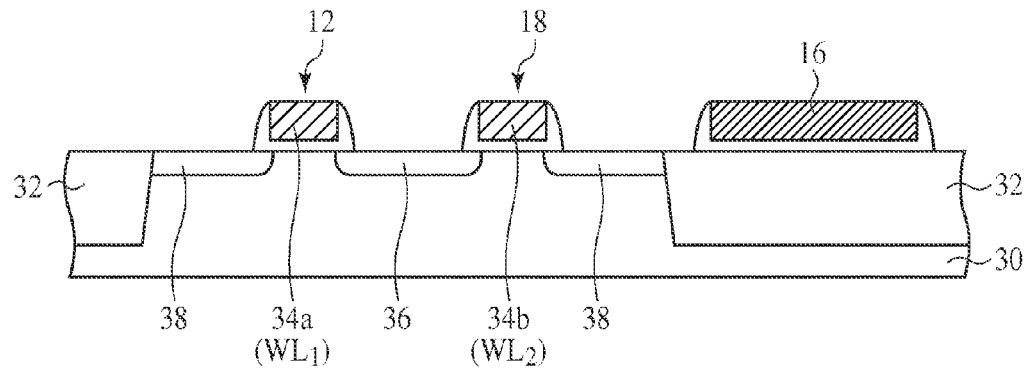
FIGS. 8A to 10B are sectional views of the nonvolatile semiconductor memory device according to the first embodiment in the steps of the method for manufacturing the nonvolatile semiconductor memory device, which illustrate the manufacturing method.

First, as illustrated in FIG. 8A, the device isolation regions 32 for defining the device regions are formed in the semiconductor substrate 30 by, e.g., STI (Shallow Trench Isolation). The semiconductor substrate 30 is, e.g., a silicon substrate.

Next, in the same way as in the method for manufacturing the ordinary MOS transistor, on the semiconductor substrate 30, the first transistor 12 including the gate electrode 34a and the source/drain diffused layers 36, 38, and the second transistor 18 including the gate electrode 34b and the source/drain diffused layers 36, 38 are formed. On the device isolation region 32, the resistor 16 of polysilicon is formed.

Then, on the semiconductor substrate 30 with the first transistor 12, the second transistor 18 and the resistor 16 formed on, a silicon oxide film is formed by, e.g., CVD.

Then, the surface of the silicon oxide film is planarized by, e.g., CMP. Thus, the inter-layer insulation film 40 of silicon oxide film is formed.

Next, the contact hole 41a arriving at the source/drain diffused layer 36, the contact holes 41b, 41c arriving at the source/drain diffused layers 38, the contact hole 41d arriving at one end of the resistor 16, and the contact hole 41e arriving at the other end of the resistor 16 are formed in the inter-layer insulation film 40 by photolithography.

Next, a barrier film and a tungsten film are formed by, e.g., CVD.

Figure 8B:
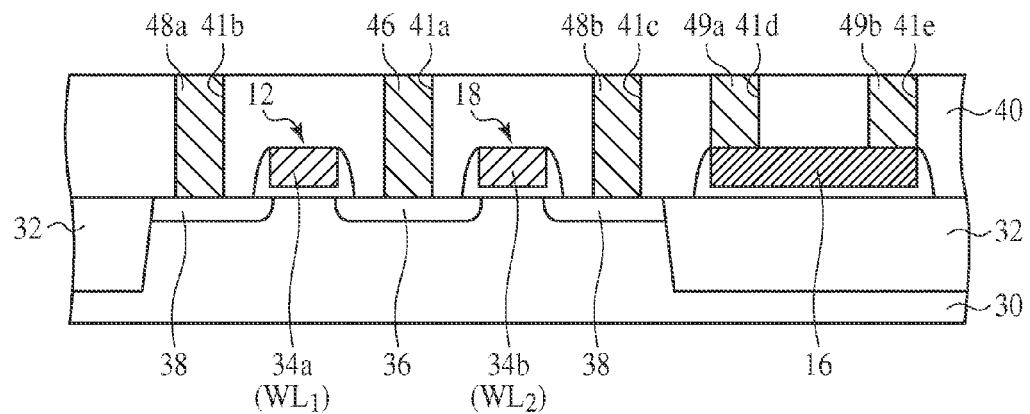
Figure 8C:
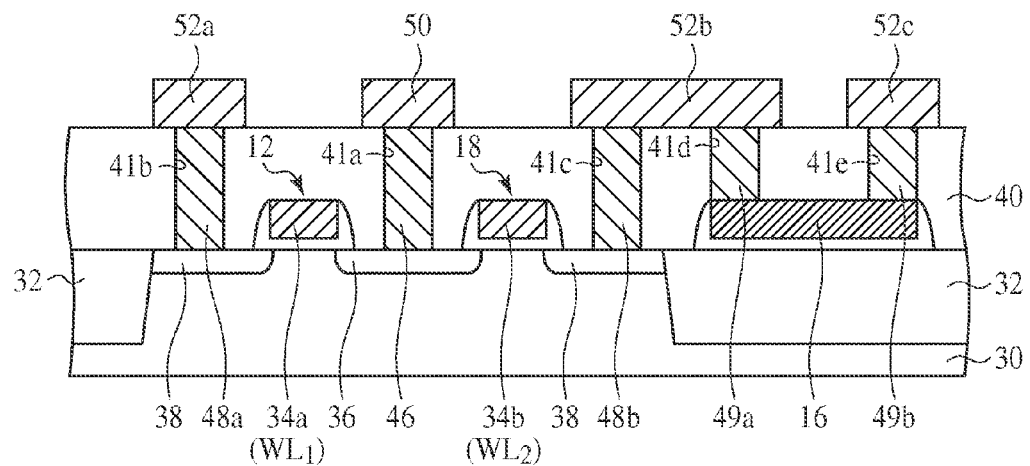

Next, the contact plugs 46, 48a, 48b, 49a, 49b of tungsten are buried respectively in the contact holes 41a-41e by, e.g., etch back (see FIG. 8B).

Then, by, e.g., CVD, a conduction film is formed on the inter-layer insulation film 40 with the contact plugs 46, 48a, 48b, 49a, 49b buried in.

Then, the conduction film is patterned by photolithography. Thus, the source line 50 and the relay interconnections 52a-52c of the conduction film are formed (see FIG. 8C).

Then, by, e.g., CVD, a silicon oxide film is formed on the inter-layer insulation film 40 with the source line 50 and the relay interconnections 52a-52c formed on.

Then, the surface of the silicon oxide film is planarized by, e.g., CMP. Thus, the inter-layer insulation film 54 of silicon oxide film is formed.

Next, by photolithography, the contact hole 56 arriving at the relay interconnection 52a is formed in the inter-layer insulation film 54.

Next, a barrier film and a tungsten film are formed by, e.g., CVD.

Figure 9A:
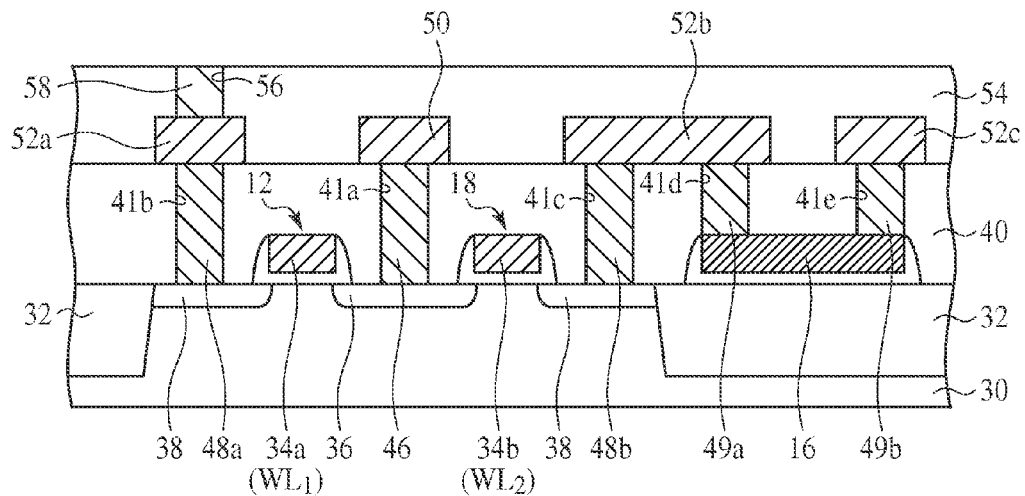
Figure 9B:
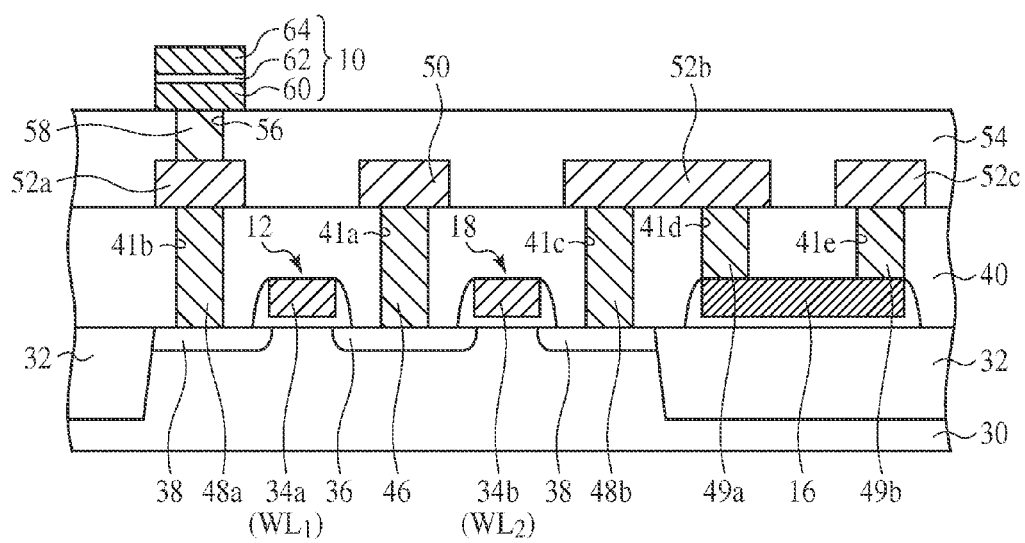

Next, by, e.g., etch back, the conduct plug 58 of tungsten is buried in the contact hole 56 (see FIG. 9A).

Then, by, e.g., sputtering, a platinum film, for example, is formed on the inter-layer insulation film 54 with the contact plug 58 buried in. The platinum film is to be the lower electrode 80 of the resistance memory element 10.

Next, an $NiO_X$ film is formed on the platinum film by, e.g., laser abrasion, sol-gel process, sputtering, MOCVD or others. The $NiO_X$ film is to be the resistance memory layer 62 of the resistance memory element.

Next, a platinum film, for example, is formed on the $NiO_X$ film by, e.g., sputtering. The platinum film is to be the upper electrode 84 of the resistance memory element 10.

Thus, the layer film of the platinum film, the $NiO_X$ film and the platinum film is formed.

Then, the layer film is patterned by photolithography. Thus, the resistance memory element 10 comprising the lower electrode 60 of platinum film, the resistance memory layer 62 of $NiO_X$ film, and an upper electrode 64 of platinum film is formed (see FIG. 9B).

Then, by, e.g., CVD, a silicon oxide film is formed on the inter-layer insulation film 54 with the resistance memory element 10 formed on.

Next, the surface of the silicon oxide film is planarized by, e.g., CMP. Thus, the inter-layer insulation film 68 of silicon oxide film is formed.

Next, the contact hole 69a arriving at the upper electrode 64 of the resistance memory element 10, and the contact hole 69b arriving at the relay interconnection 52c are formed by photolithography.

Next, a barrier film and a tungsten film are formed by, e.g., CVD.

Figure 10A:
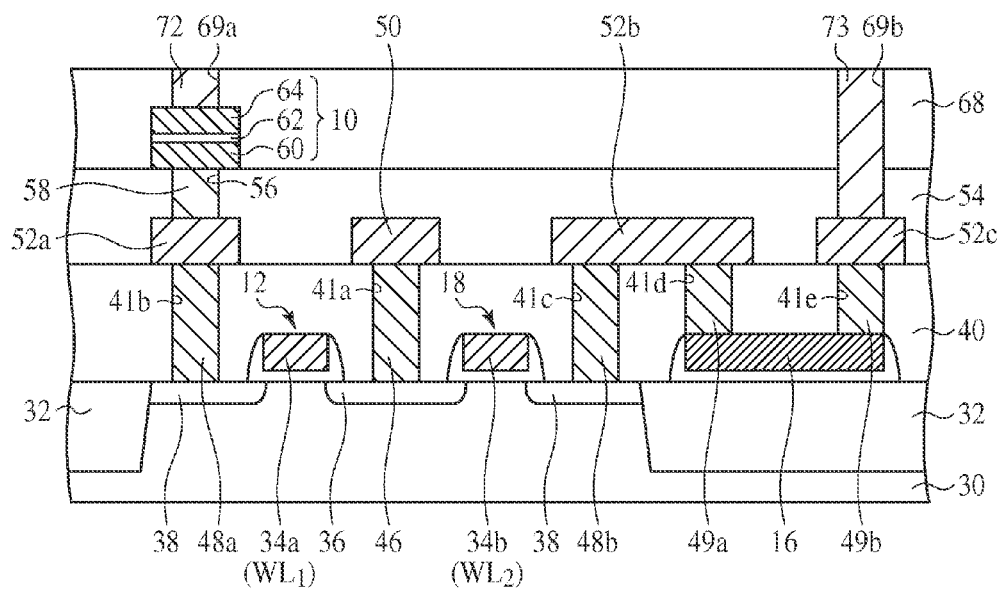
Figure 10B:
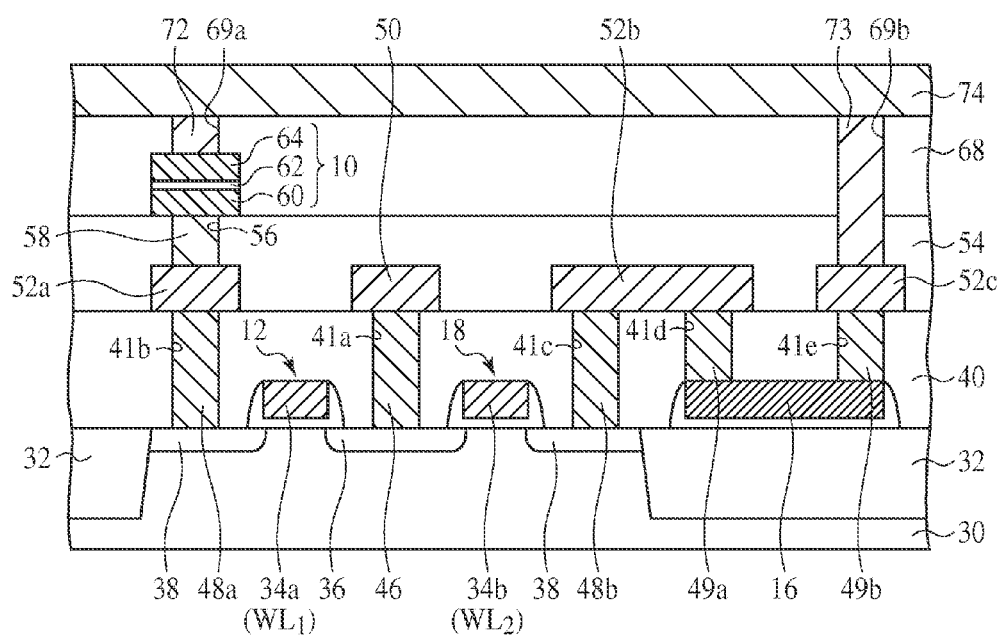

Then, by etch back, the contact plugs 72, 73 of tungsten film are buried in the contact holes 69a, 69b (see FIG. 10A).

Next, by, e.g., sputtering, a conduction film is formed on the inter-layer insulation film 68 with the contact plugs 72, 73 buried in.

Next, the conduction film is patterned by photolithography. Thus, the bit line 74 of the conduction film is formed (see FIG. 10B).

Thus, the nonvolatile semiconductor memory device according to the present embodiment is manufactured.

[b] Second Embodiment

Figure 11:
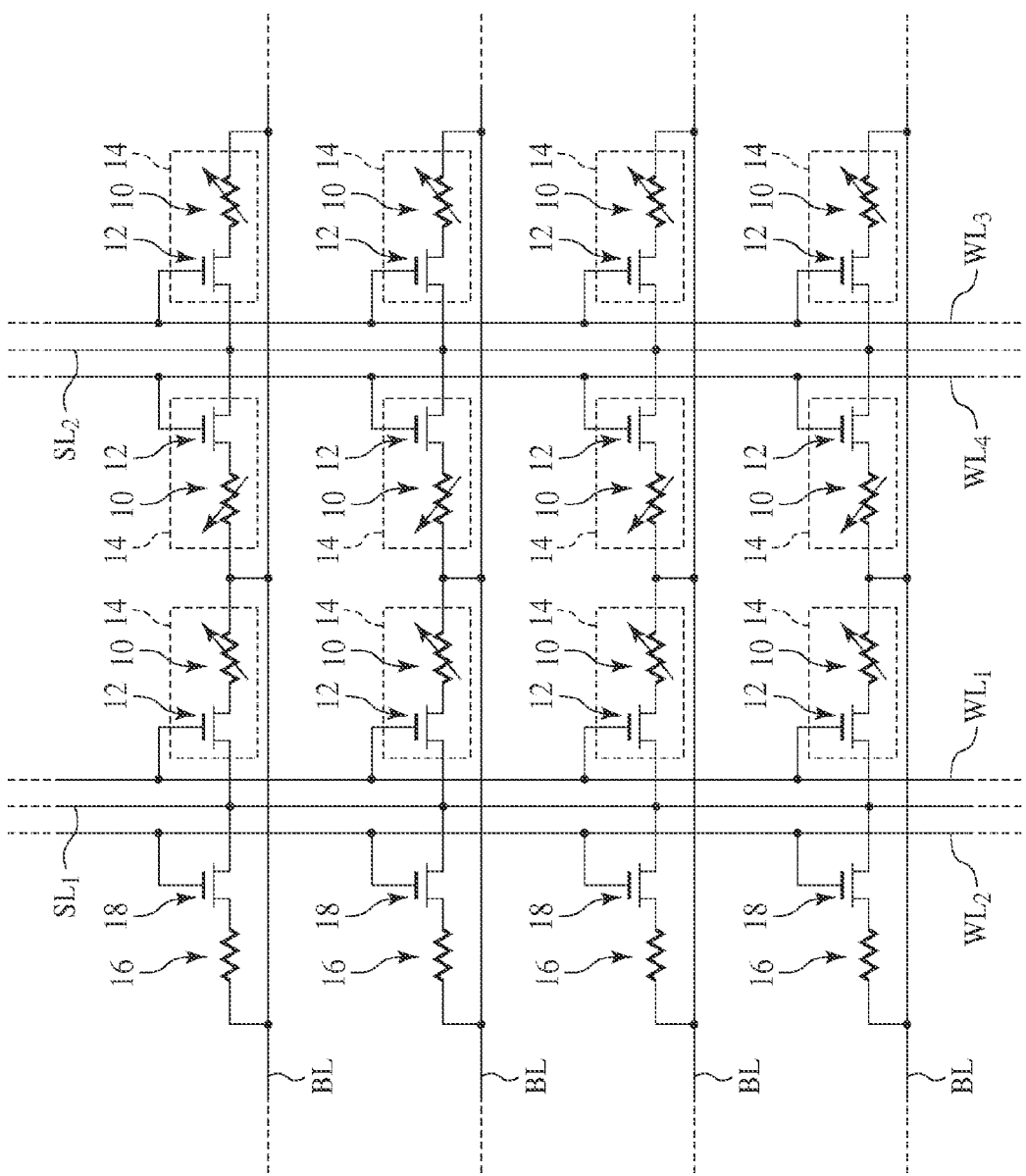
FIG. 11 is the circuit diagram of the nonvolatile semiconductor memory device according to a second embodiment, which illustrates the structure.
Figure 12:
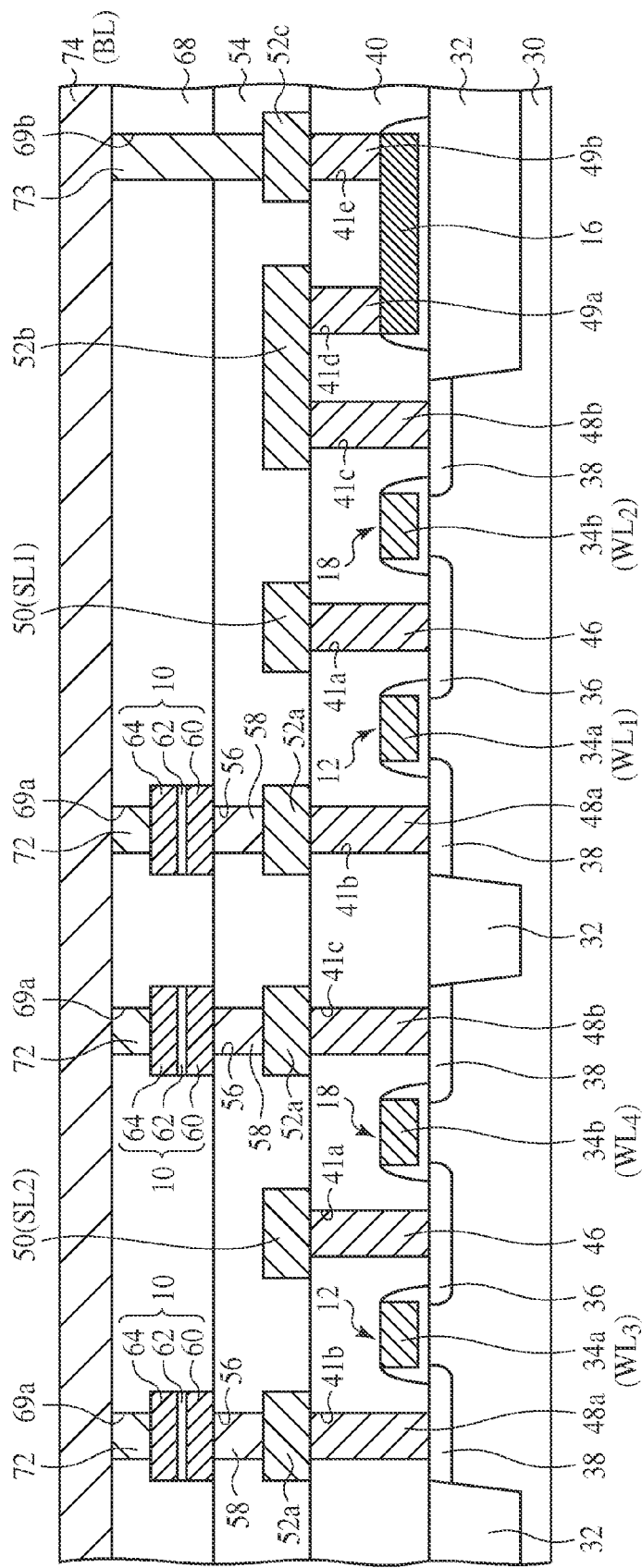
FIG. 12 is a sectional view of the nonvolatile semiconductor memory device according to the second embodiment.

The nonvolatile semiconductor memory device according to a second embodiment and the its reading method will be explained with reference to FIGS. 11 and 12. FIG. 11 is the circuit diagram of the nonvolatile semiconductor memory device according to the present embodiment. FIG. 12 is a sectional view of the nonvolatile semiconductor memory device according to the present embodiment, which illustrates the structure thereof. The same members of the present embodiment as those of the nonvolatile semiconductor memory device and its reading method according to the first embodiment illustrated in FIGS. 1A to 10B are represented by the same reference numbers not to repeat or to simplify their explanation.

The nonvolatile semiconductor memory device according to the present embodiment is characterized mainly in that a resistor 16 is common among a plurality of memory cells 14 preset in one and the same column.

As illustrated in FIG. 11, a plurality of word lines WL1, WL2, WL3, WL4, . . . , and a plurality of source lines SL are arranged row-wise (longitudinally in the drawing). A plurality of bit lines BL are arranged in column-wise (transversely) in the drawing.

At the respective intersections between the word lines WL1, WL3, WL4, . . . , and the bit lines BL, memory cells 14 each including a resistance memory element 10 and the first transistor (selective transistor) 12 are formed.

At the respective intersections between the word lines WL2 and the bit lines BL, resistors 16 and the second transistors 18 are formed. The resistors 16 and the second transistors 18 are provided in one set for each of the plural bit lines BL.

In each memory cell 14, the resistance memory element 10 has one end electrically connected to the bit line BL. In each memory cell 14, the other end of the resistance memory element 10 is electrically connected to one, i.e., the drain terminal, of the source/drain diffused layers of the first transistor 12.

In each memory cell 14, the other, i.e., the source terminal, of the source/drain diffused layers of the first transistor 12 is electrically connected to the associated source line SL1, SL2. In each memory cell 14, the gate electrode, i.e., the gate terminal, of the first transistor 12 is electrically connected to the associated word lines WL1, WL3, WL4, . . . .

In each column, the resistor 16 has one end electrically connected to the bit line BL. That is, one ends of the respective resistance memory elements 10 present in one and the same column are connected commonly to the resistor 16 via the bit line BL.

In each column, the other end of the resistor 16 is electrically connected to one, i.e., the drain terminal, of the source/drain diffused layers of the second transistor 18.

In each column, the other, i.e., the source terminal, of the source/drain diffused layers of the second transistor 18 is electrically connected to the source line SL1.

In each column, the gate electrode, i.e., the gate terminal, of the second transistor 18 is electrically connected to the word line WL2.

To the ends of the bit lines BL, a column selector (not illustrated) for suitably selecting the bit lines BL is connected. To the ends of the word lines WL1, WL2, WL3, WL4, . . . , a row selector (not illustrated) for suitably selecting the word lines WL1, 2L2, WL3, WL4, . . . is connected. To the ends of the source lines SL, another row selector (not illustrated) for suitably selecting the source line SL1, SL2 is connected.

Thus, the nonvolatile semiconductor memory device according to the present embodiment is constituted.

(Structure of the Nonvolatile Semiconductor Memory Device)

Next, the structure of the nonvolatile semiconductor memory device according to the present embodiment will be explained with reference to FIG. 12.

As illustrated in FIG. 12, device isolation regions 32 for defining device regions are formed on a semiconductor substrate 30.

On the semiconductor substrate 30 with the device regions defined, the word line WL1, the word line WL2, the word line WL3 and the word line WL4 are formed with a gate insulation film formed therebetween. The word lines WL1, the word line WL3, the word line WL4, . . . function also as the gate electrodes 34a of the first transistors. The word line WL2 functions also as the gate electrode 34b of the second transistor.

The word lines WL1, WL2, WL3, WL4 are extended vertically as viewed in the drawing of FIG. 12.

The source/drain diffused layers 36, 38 are formed in the semiconductor substrate 30 on both sides of the word line WL1, in the semiconductor substrate 30 on both sides of the word line WL2, in the semiconductor substrate on both sides of the word line WL3 and in the semiconductor substrate 30 on both sides of the word line WL4.

The gate electrode 34a functioning also as the word line WL1, and the source/drain diffused layers 36, 38 form the first transistor 12.

The gate electrode 34a functioning also as the word line WL2, and the source/drain diffused layers 36, 38 form the second transistor 18.

The gate electrode 34a functioning also as the word line WL3, and the source/drain diffused layers 36, 38 form the first transistor 12.

The gate electrode 34a functioning as the word line WL4, and the source/drain diffused layers 36, 38 form the first transistor 12.

One source/drain diffused layer 36 of the first transistor 12 and one source/drain diffused layer 36 of the second transistor 18 are formed of the common source/drain diffused layer 36.

One source/drain diffused layer 36 of the first transistor 12 and one source/drain diffused layer 36 of the first transistor 12 are formed of the common source/drain diffused layer 36.

On the device isolation region 32, the resistor 16 of, e.g., polysilicon is formed.

The inter-layer insulation film 40 is formed on the semiconductor substrate 30 with the first transistors 12, the second transistors 18 and the resistor 16 formed on.

In the inter-layer insulation film 40, contact plugs 46 connected to the source/drain diffused layers 36, a contact plug 48a connected to the source/drain diffused layer 38, a contact plug 48b connected to the source/drain diffused layer 38, a contact plug 49a connected to one end of the resistor 16, and a contact plug 49b connected to the other end of the resistor 16 are buried.

On the inter-layer insulation film 40, source lines 50 (SL1, SL2) electrically connected to the source/drain diffused layers 36 via the contact plugs 46, relay interconnections 52a electrically connected to the source/drain diffused layers 38 via the contact plugs 48a, a relay interconnection 52b electrically interconnecting the contact plug 48b and the contact plug 49a, a relay interconnection 52c electrically connected to the end of the resistor 16 via the contact plug 49b are formed. The source lines 50 are formed in parallel with the word lines WL1, WL2, WL3, WL4, . . . , extended vertically as viewed in the drawing.

On the inter-layer insulation film 40 with the source lines 50 (SL1, SL2) and the relay interconnections 52a-52c formed on, the inter-layer insulation film 54 is formed. In the inter-layer insulation film 54, contact plugs 58 connected to the relay interconnections 52a are buried.

On the inter-layer insulation film 54 with the contact plugs 58 buried in, the resistance memory elements 10 are formed.

On the inter-layer insulation film 54 with the resistance memory elements 10 formed on, the inter-layer insulation film 68 is formed. In the inter-layer insulation film 68, contact plugs 72 connected to the upper electrodes 64 are buried. In the inter-layer insulation film 68 and the inter-layer insulation film 54, a contact plug 73 connected to the relay interconnection 52c is buried.

On the inter-layer insulation film 68 with the contact plugs 72, 73 buried in, the bit line 74 (BL) is formed. The bit line 74 extended in the horizontal direction as viewed in the drawing. The bit line 74 is electrically connected to the upper electrode 64 of the resistance memory element 10 via the contact plug 72. The bit line 74 is electrically connected to the end of the resistor 16 via the contact plug 73, etc.

Thus, the nonvolatile semiconductor memory device according to the present embodiment is constituted.

As described above, the resistor 16 may be common among a plurality of memory cells 14 present in one and the same column.

Next, the writing method and the reading method of the nonvolatile semiconductor memory device according to the present embodiment will be explained with reference to FIG. 11.

(Writing Method)

First, the reset of the resistance memory elements 10, i.e., the write of the high resistance state into the resistance memory elements 10 will be explained with reference to FIG. 11.

When the high resistance state is written into a resistance memory element 10, the word line WL1, WL3, WL4, . . . connected to the memory cell 14 to be written are selected by a row selector (not illustrated). Specifically, a prescribed voltage is applied by the row selector to the word line WL1, WL3, WL4, . . . connected to the memory cell 14 to be written. The source lines SL1, SL2 are connected to a prescribed reference potential, e.g., the ground potential. Thus, the first transistor 12 of the memory cell 14 to be written is turned on-state. When the write is made in the resistance memory element 10, no voltage is applied to the word line WL2 connected to the second transistor 18.

Next, the bit line connected to the memory cell 14 to be written is selected by a column selector (not illustrated). Specifically, a prescribed voltage is applied for a prescribed period of time to the bit line BL connected to the memory cell 14 to be written.

Thus, the high resistance state is written into the resistance memory element 10 of the memory cell 14 to be written.

Next, the set of the resistance memory element 10, i.e., the write of the low resistance state in the resistance memory elements 10 will be explained with reference to FIG. 11.

When the low resistance state is written in a resistance memory element 10, the word line WL1, WL3, WL4, . . . connected to the memory cell 14 to be written is selected by the row selector (not illustrated). Specifically, a prescribed voltage is applied by the row selector to the word line WL1, WL3, WL4, . . . connected to the memory cell 14 to be written. The source lines SL1, SL2 are connected to a prescribed reference potential, e.g., the ground potential. Thus, the first transistor 12 of the memory cell 14 to be written is turned on-state.

When the write is made in the resistance memory element 10, no voltage is applied to the word line WL2 connected to the second transistor 18.

The bit line BL connected to the memory cell 14 to be written is selected by the column selector (not illustrated). Specifically, a prescribed voltage is applied for a prescribed period of time to the bit line BL connected to the memory cell 14 to be written.

Thus, the low resistance state is written in the resistance memory element 10 of the memory cell 14 to be written.

(Reading Method)

Next, the reading method of the nonvolatile semiconductor memory device according to the present embodiment will be explained with reference to FIG. 11.

When information written in the resistance memory elements 10 of the memory cells 14, the word line WL1, WL3, WL4, . . . connected to a memory cell 14 to be read is selected by the row selector (not illustrated). Specifically, a prescribed voltage is applied by the row selector to the word line WL1, WL3, WL4, . . . connected to the memory cell 14 to be read. The source lines SL1, SL2 are connected to a prescribed reference potential, e.g., the ground potential. Thus, the first transistor 12 of the memory cell 14 to be read is turned on-state.

The word line WL2 connected to the second transistor 18 is selected by the row selector (not illustrated). Specifically, a prescribed voltage is applied by the row selector to the word line WL2 connected to the second transistor 18. Thus, the second transistor 18 is turned on-state.

Then, the bit line BL connected to the memory cell 14 to be read is selected by the column selector (not illustrated). Thus, the bit line BL selected by the column selector is connected to the read circuit (not illustrated). When the high resistance state has been written in the resistance memory element 10 of the memory cell 14 to be read, a relatively small current flows in the bit line BL. On the other hand, when the low resistance state has been written in the resistance memory element 10 of the memory cell 14 to be read, a relatively large current flows in the bit line BL. The read circuit detects the current flowing in the bit line BL by the sense amplifier and judges whether the resistance memory element 10 has the low resistance state or the high resistance state. That is, the read circuit reads information written in the resistance memory element 10, based on the current flowing in the bit line BL.

Thus, the resistor 16 may be common among a plurality of memory cells 14 present in one and the same column.

[c] Third Embodiment

Figure 13:
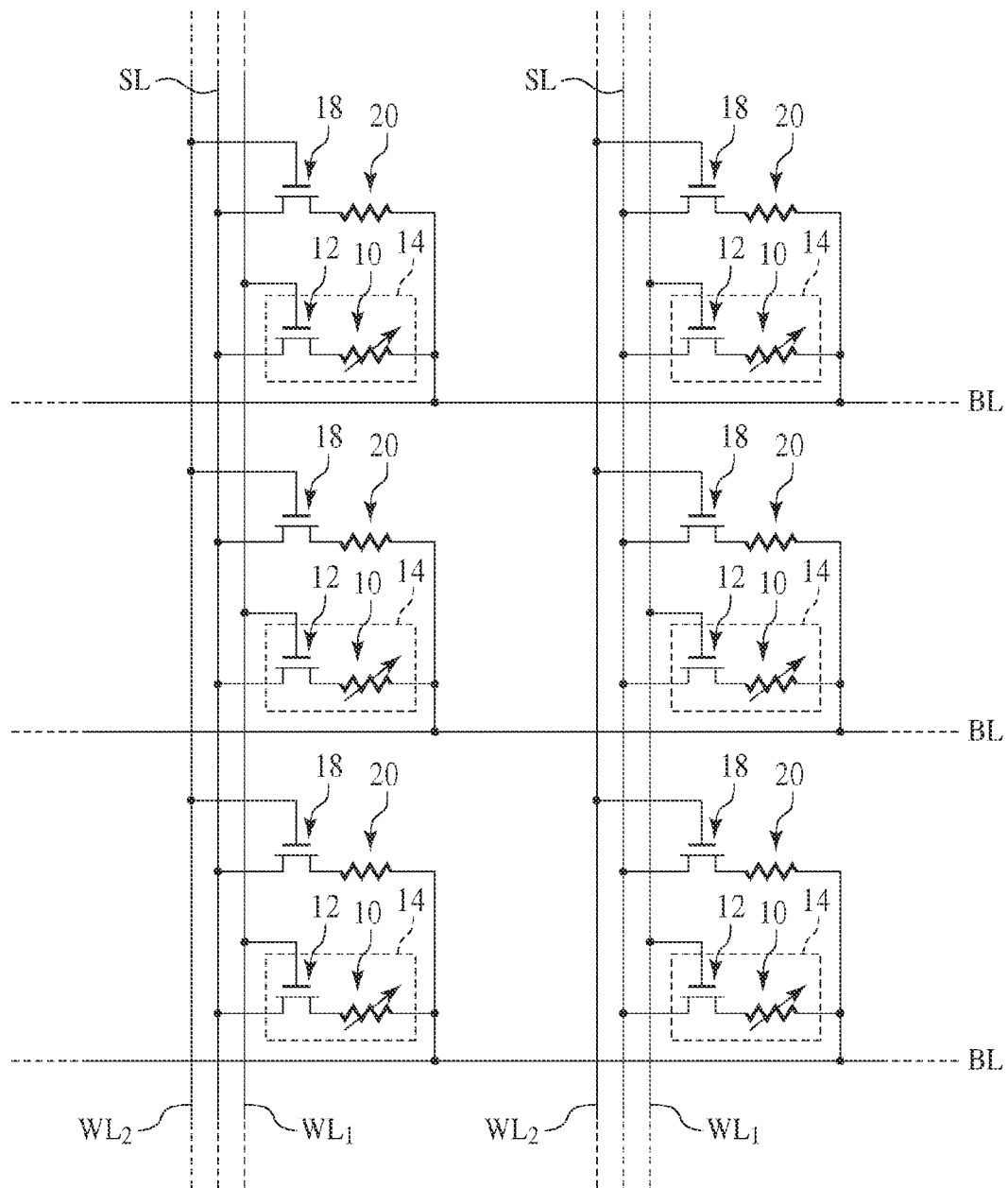
FIG. 13 is the circuit diagram of the nonvolatile semiconductor memory device according to a third embodiment, which illustrates the structure.
Figure 14:
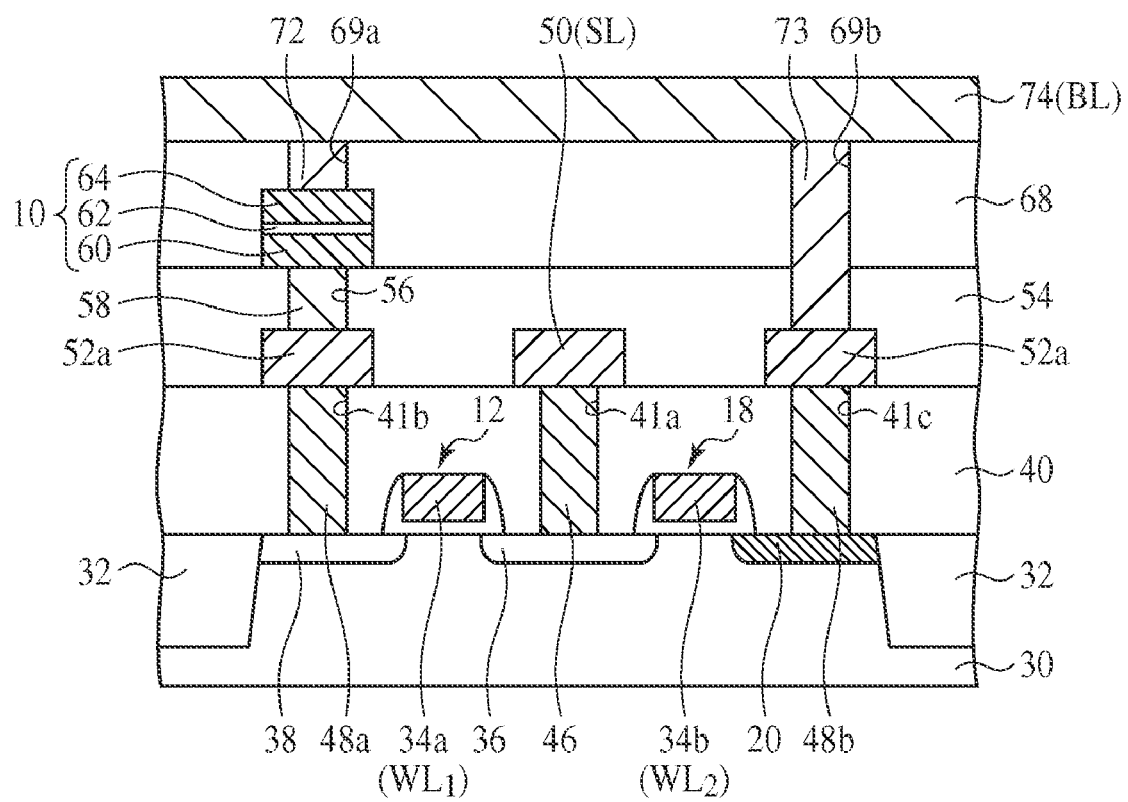
FIG. 14 is a sectional view of the nonvolatile semiconductor memory device according to the third embodiment, which illustrates the structure.

The nonvolatile semiconductor memory device according to a third embodiment will be explained with reference to FIG. 13. FIG. 13 is the circuit diagram of the nonvolatile semiconductor memory device according to the present embodiment. FIG. 14 is a sectional view of the nonvolatile semiconductor memory device according to the present embodiment which illustrates the structure thereof. The same members of the present embodiment as those of the nonvolatile semiconductor memory device and its reading method according to the first or the second embodiment illustrated in FIGS. 1A to 12 are represented by the same reference numbers not to repeat or to simplify their explanation.

The nonvolatile semiconductor memory device according to the present embodiment is characterized mainly in that the resistors 20 to be connected in parallel with the resistance memory elements 10 when the read is made is formed of an impurity diffused layer.

(Circuit Structure of Nonvolatile Semiconductor Memory Device)

First, the circuit structure of the nonvolatile semiconductor memory device according to the present embodiment will be explained with reference to FIG. 13.

As illustrated in FIG. 13, in each memory cell 14, the resistance memory element 10 has one end electrically connected to the associated bit line BL. In each memory cell 14, the other end of the resistance memory element 10 is electrically connected to one, i.e., the drain terminal, of the source/drain diffused layers of the first transistor 12.

In each memory cell 14, the other, i.e., the source terminal, of the source/drain diffused layers of the first transistor 12 is electrically connected to the associated source line SL. In each memory cell 14, the gate electrode, i.e., the gate terminal, of the first transistor 12 is electrically connected to the associated word line WL1.

In each memory cell 14, the resistor 20 is connected in parallel with the memory cell 14, and the second transistor 18 is connected serially with the resistor 20.

In each memory cell 14, the resistor 20 has one end electrically connected to one end of the resistance memory element 10 and the associated bit line BL. In each memory cell 14, the other end of the resistor 20 is electrically connected to one, i.e., the drain terminal, of the source/drain diffused layers of the second transistors 18.

In each memory cell 14, the other, i.e., the source terminal, of the source/drain diffused layers of the second transistor 18 is electrically connected to the associated source line SL. In each memory cell 14, the gate electrode, e.g., the gate terminal, of the second transistor 18 is electrically connected to the associated second word line WL2.

The resistance value of the resistor 20 connected in parallel with the memory cell 14 is set sufficiently large for the resistance value of the resistance memory element 10 in the low resistance state and sufficiently small for the minimum value of the resistance of the resistance memory element 10 in the high resistance state. The resistance value of the resistance memory element 10 in the low resistance state is, e.g., 1 kΩ. On the other hand, the minimum value of the resistance of the resistance memory element 10 in the high resistance state is, e.g., 100 kΩ. The resistance value of the resistor 20 is, e.g., 10 kΩ here.

Thus, the nonvolatile semiconductor memory device according to the present embodiment is constituted.

(Structure of the Nonvolatile Semiconductor Memory Device)

Next, the structure of the nonvolatile semiconductor memory device according to the present embodiment will be explained with reference to FIG. 14.

As illustrated in FIG. 14, device isolation regions 32 for defining device regions are formed on a semiconductor substrate 30.

On the semiconductor substrate 30 with the device regions defined, a word line WL1 and a word line WL2 are formed with the gate insulation film formed therebetween. The word line WL1 functions also as the gate electrode 34a of the first transistor. The word line WL2 functions as the gate electrode 34b of the second transistor. The word line WL1 and the word line WL2 are extended vertically as viewed in the drawing of FIG. 7.

In the semiconductor substrate 30 on both sides of the word line WL1, the source/drain diffused layers 36, 38 are formed.

The gate electrode 34a functioning also as the word line WL1, and the source/drain diffused layers 36, 38 form the first transistor 12.

In the semiconductor substrate 30 on one side of the word line WL2, the source/drain diffused layer 36 is formed. One source/drain diffused layer 36 of the first transistor 12 and one source/drain diffused layer 36 of the second transistor 18 are formed of the common source/drain diffused layer 36.

In the semiconductor substrate 30 on the other side of the word line WL2, the resistor 20 of a impurity diffused layer is formed. The impurity diffused layer 20 functions as the source/drain diffused layer of the second transistor and also as the resistor 20 to be connected in parallel with the resistance memory element 10 when the read is made. The impurity concentration of the impurity diffused layer 20, which functions as the resistor is set lower than the impurity concentration of the source/drain diffused layers 36, 38. The impurity concentration of the impurity diffused layer 20 is set lower than the impurity concentration of the source/drain diffused layers 36, 38 so that the resistance value of the impurity diffused layer 20 is set relatively large. The resistance value of the resistor 20 of the impurity diffused layer is set sufficiently large for the resistance value of the resistance memory element 10 in the low resistance state and sufficiently small for the resistance value of the resistance memory element 10 in the highs resistance state. The resistance value of the source/drain diffused layers 36, 38 is smaller than the resistance value of the resistance memory element 10 in the low resistance state.

The gate electrode 34b functioning also as the word line WL2, the source/drain diffused layer 36 and the source/drain diffused layer 20 functioning also as the resistor form the second transistor 18.

An inter-layer insulation film 40b is formed on the semiconductor substrate 30 with the first transistor 12, the second transistor 18 and the resistor 16 formed on.

In the inter-layer insulation film 40, a contact plug 46 connected to the source/drain diffused layer 36, a contact plug 48a connected to the source/drain diffused layer 38, and a contact plug 48b connected to the resistor 20 formed of the impurity diffused layer are buried.

On the inter-layer insulation film 40, the source line 50(SL) electrically connected to the source/drain diffused layer 36, a relay interconnection 52a electrically connected to the source/drain diffused layer 38 via the contact plug 48a, and a relay interconnection 52a electrically connected to the resistor 20 via the contact plug 48b are formed. The source line 50 is formed in parallel with the word lines WL1, WL2 and extended vertically as viewed in the drawing.

On the inter-layer insulation film 40 with the source line 50 and the relay interconnection 52a formed on, ran inter-layer insulation film 54 is formed. In the inter-layer insulation film 54, a contact plug 58 connected to the relay interconnection 52a is buried.

On the inter-layer insulation film 54 with the contact plug 58 buried in, the resistance memory element 10 is formed.

On the inter-layer insulation film 54 with the resistance memory element 10 formed on, an inter-layer insulation film 68 is formed. In the inter-layer insulation film 68, a contact plug 72 connected to the upper electrode 64 is buried. In the inter-layer insulation film 68 and the inter-layer insulation film 54, a contact plug 73 connected to the relay interconnection 52a is buried.

On the inter-layer insulation film 68 with the contact plugs 72, 73 buried in, a bit line 74(BL) is formed. The bit line 74 is extended in the horizontal direction as viewed in the drawing. The bit line 74 is electrically connected to the upper electrode 64 of the resistance memory element 10 via the contact plug 72. The bit line 74 is electrically connected to the resistor 20 via the contact plug 73, etc.

Thus, the nonvolatile semiconductor memory device according to the present embodiment is constituted.

As described above, the resistor 20, which is brought into connection in parallel with the resistance memory element 10 when the read is made may be formed of an impurity diffused layer.

The writing method and the reading method of the nonvolatile semiconductor memory device according to the present embodiment are the same as the writing method and the reading method of the nonvolatile semiconductor memory device according to the first embodiment, and their explanation will not be repeated.

(Method of the Manufacturing the Nonvolatile Semiconductor Memory Device)

Next, the method of the manufacturing the nonvolatile semiconductor memory device according to the present embodiment will be explained with reference to FIGS. 15A to 18B. FIGS. 15A to 18B are sectional views of the nonvolatile semiconductor memory device according to the present embodiment in the steps of the method for manufacturing the nonvolatile semiconductor memory device, which illustrate the method.

Figure 15A:
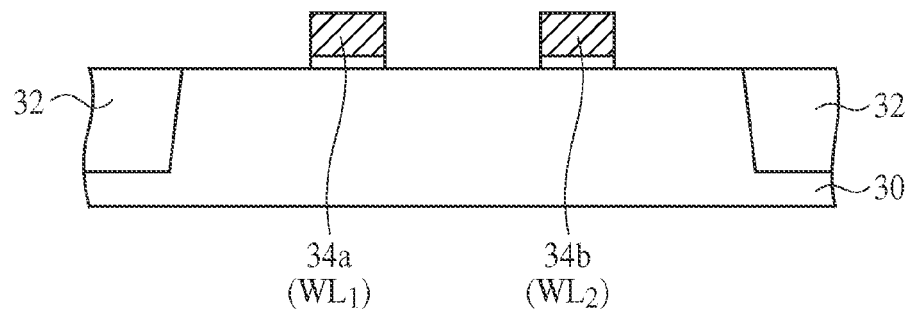
FIGS. 15A to 18B are sectional views of the nonvolatile semiconductor memory device according to the third embodiment in the steps of the method for manufacturing the nonvolatile semiconductor memory device, which illustrate the manufacturing method.

First, as illustrated in FIG. 15A, the device isolation regions 32 for defining the device region are formed in the semiconductor substrate 30 by, e.g., STI.

Then, in the same way as the ordinary MOS transistor manufacturing method, the gate electrodes 34a, 34b are formed on the semiconductor substrate 30 with the gate insulation film formed therebetween.

Then, a photoresist film 76 is formed on the entire surface by spin coating.

Next, by photolithography, an opening 78 for exposing the regions for the source/drain diffused layers 36, 38 to be formed in is formed.

Figure 15B:
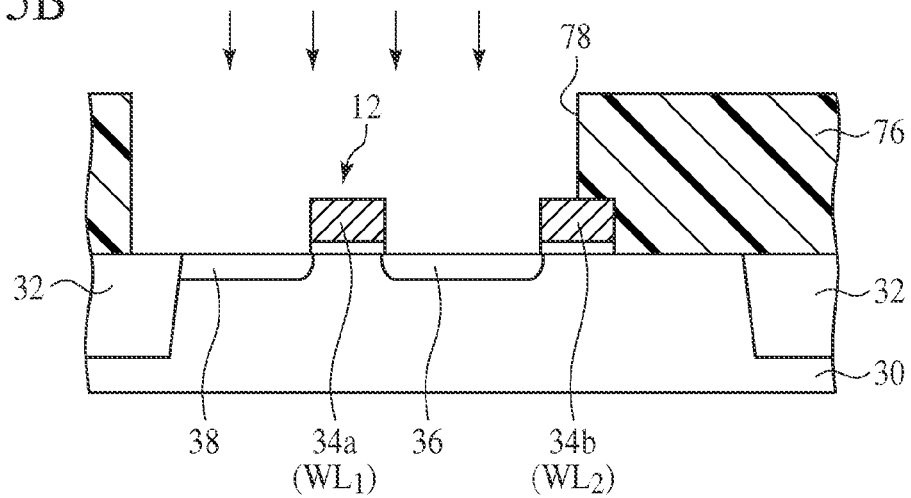

Next, a dopant impurity is implanted into the semiconductor substrate 30 by, e.g., ion implantation with the photoresist film 76 and the gate electrodes 34a, 34b as the mask (see FIG. 15B). Thus, the first transistor 12 including the gate electrode 34a and the source/drain diffused layers 36, 38 is formed. Then, the photoresist film 76 is released.

Then, a photoresist film 80 is formed on the entire surface by spin coating.

Next, by photolithography, an opening 82 for exposing the region for the impurity diffused layer 20, which functions as the resistor, to be formed in is formed in the photoresist film 80.

Figure 15C:
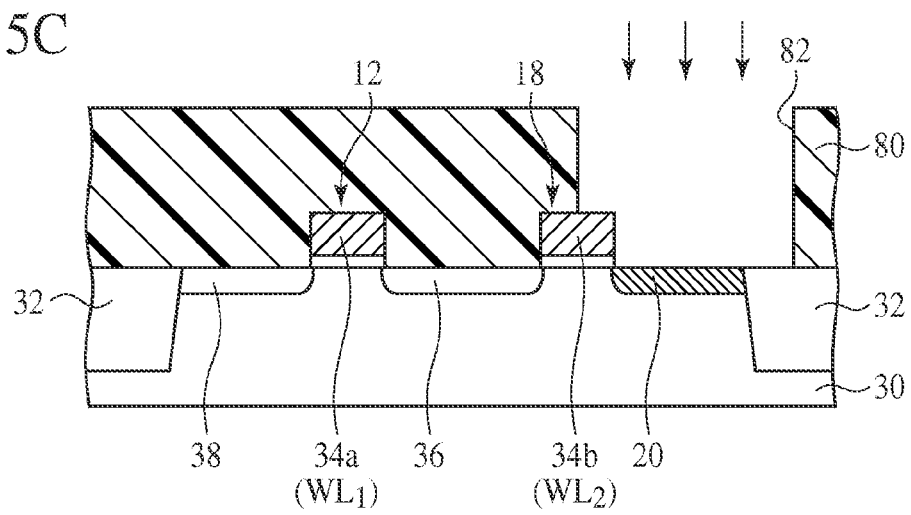

Then, a dopant impurity is implanted into the semiconductor substrate 30 by, e.g., ion implantation with the photoresist film 80 and the gate electrode 34b as the mask (see FIG. 15C). Thus, the second transistor 18 including the gate electrode 34b, the source/drain diffused layer 36 and the source/drain diffused layer 20, which functions as the resistor, is formed. Then, the photoresist film 80 is released (see FIG. 16A).

Then, a silicon oxide film is formed by, e.g., CVD on the semiconductor substrate 30 with the first transistor 12, the second transistor 18 and the resistor 20 formed on.

Next, the surface of the silicon oxide film is planarized by, e.g., CMP. Thus, the inter-layer insulation film 40 of silicon oxide film is formed.

Next, in the inter-layer insulation film 40, the contact hole 41a arriving at the source/drain diffused layer 36, the contact hole 41b arriving at the source/drain diffused layer 38 and the contact hole 41c arriving at the end of the resistor 20 are formed by photolithography.

Then, a barrier film and a tungsten film are formed by, e.g., CVD.

Figure 16A:
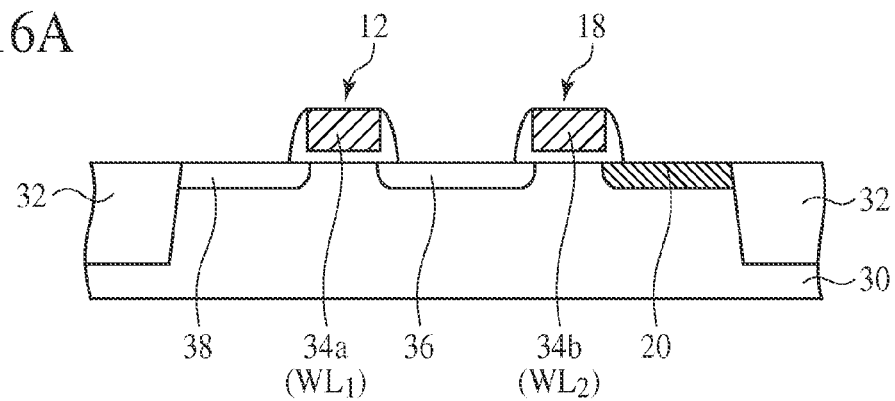
Figure 16B:
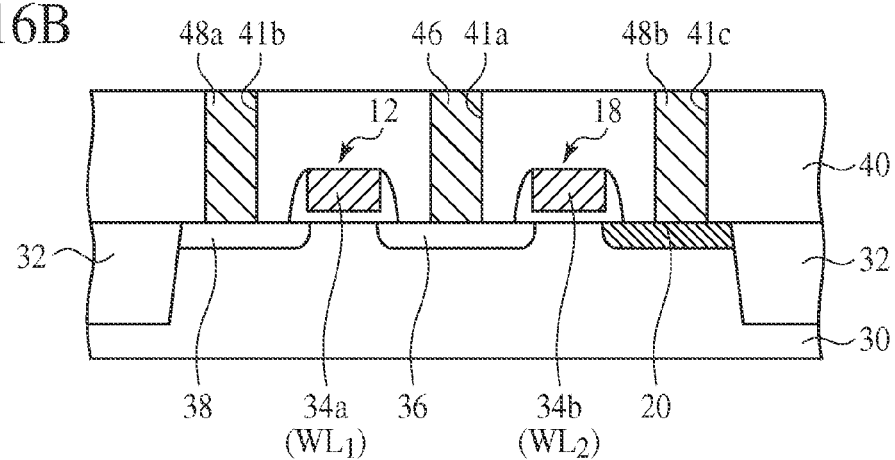
Figure 16C:
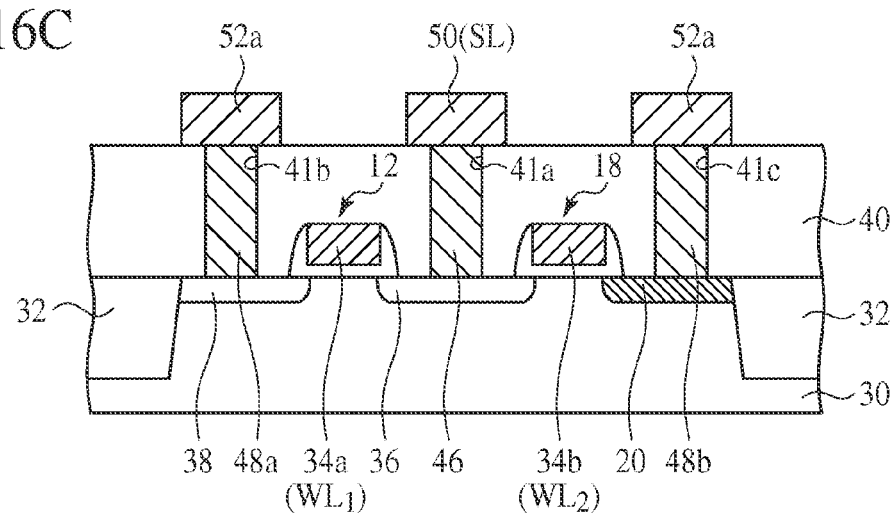

Then, by, e.g., etch back, the contact plugs 46, 48a, 48b of tungsten are buried respectively in the contact holes 41a-41c (see FIG. 16B).

Next, on the interlayer insulation film 40 with the contact pugs 46, 48a, 48b buried in, a conduction film is formed by, e.g., CVD.

Next, the conduction film is patterned by photolithography. Thus, the source line 50 (SL) and the relay interconnection 52a which are formed of the conduction film are formed (see FIG. 16C).

Next, on the inter-layer insulation film 40 with the source line 50 and the relay interconnection 52a formed on, a silicon oxide film is formed by, e.g., CVD.

Next, the surface of the silicon oxide film is planarized by, e.g., CMP. Thus, an inter-layer insulation film 54 of silicon oxide film is formed.

Next, by photolithography, the contact hole 56 arriving at the relay interconnection 52a is formed in the inter-layer insulation 54.

Next, a barrier film and a tungsten film are formed by, e.g., CVD.

Figure 17A:
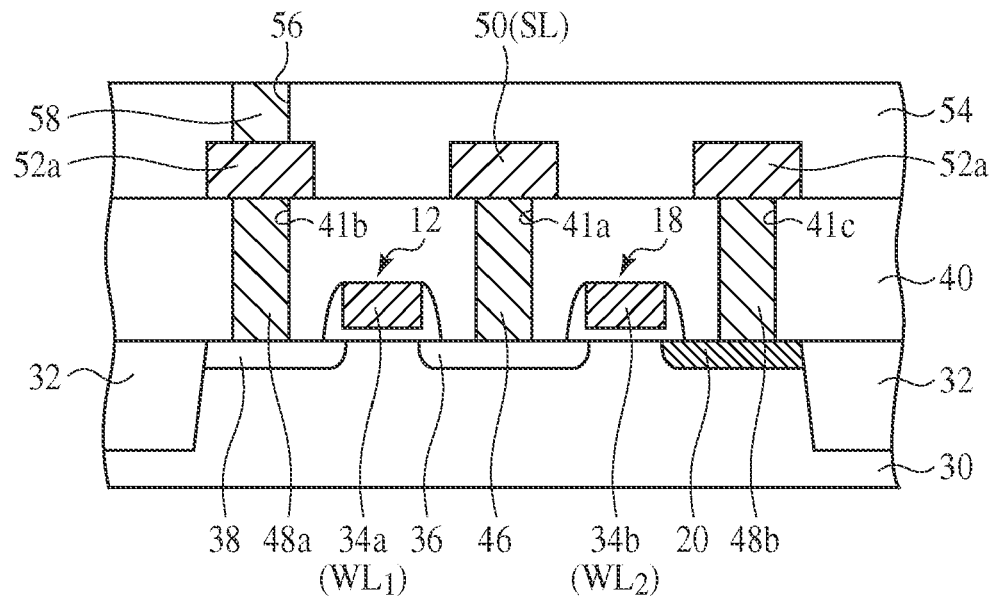
Figure 17B:
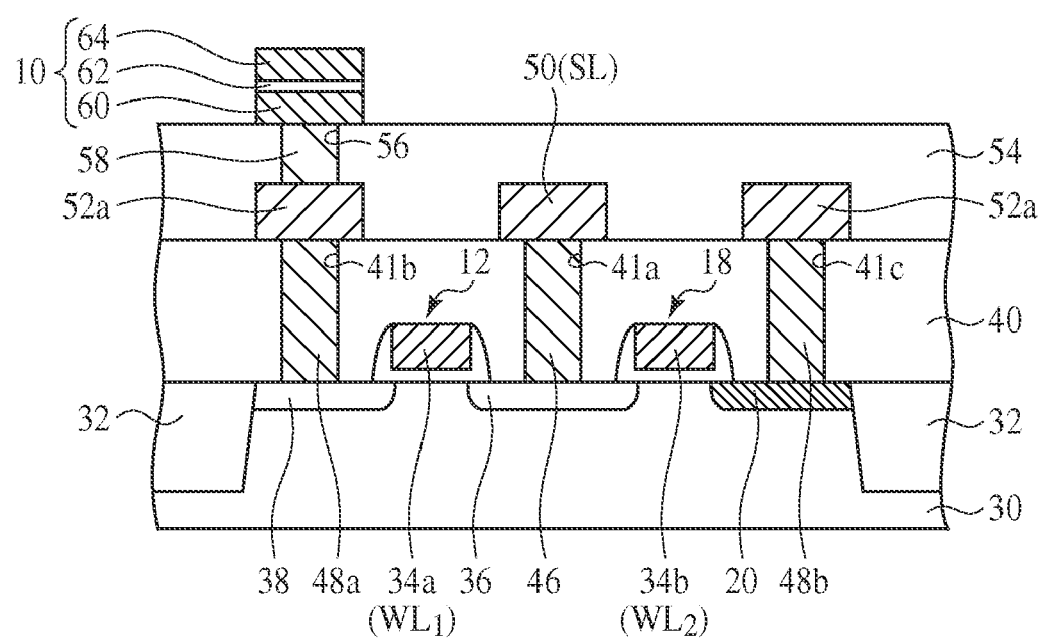

Next, by, e.g., etching back, the contact plug 58 of tungsten is buried in the contact hole 56 (see FIG. 17A).

Then, on the inter-layer insulation film 54 with the contact plug 58 buried in, a platinum film, for example, is formed by, e.g., sputtering. The platinum film is to be the lower electrode 80 of the resistance memory element 10.

Next, on the platinum film, an $NiO_X$ film is formed by, e.g., laser abrasion, sol gel process, sputtering, MOCVD or others. The $NiO_X$ film is to be resistance memory layer 62 of the resistance memory element.

Then, a platinum film, for example, is formed on the $NiO_X$ film by, e.g., sputtering. The platinum film is to be the upper electrode 84 of the resistance memory element 10.

Thus, the layer film of the platinum film, the $NiO_X$ film and the platinum film is formed.

Then, the layer film is patterned by photolithography. Thus, the resistance memory element 10 of the lower electrode 60 of the platinum film, the resistance memory layer 62 of the $NiO_X$ film and the upper electrode 64 of the platinum film is formed (see FIG. 17B).

Then, a silicon oxide film is formed by, e.g., CVD on the inter-layer insulation film 54 with the resistance memory element 10 formed on.

Next, the surface of the silicon oxide film is planarized by, e.g., CMP. Thus, an inter-layer insulation film 68 of silicon oxide film is formed.

Next, by photolithography, the contact hole 69a arriving at the upper electrode 64 of the resistance memory element 10 and the contact hole 69b arriving at the relay interconnection 52c are formed.

Next, a barrier film and a tungsten film are formed by, e.g., CVD.

Figure 18A:
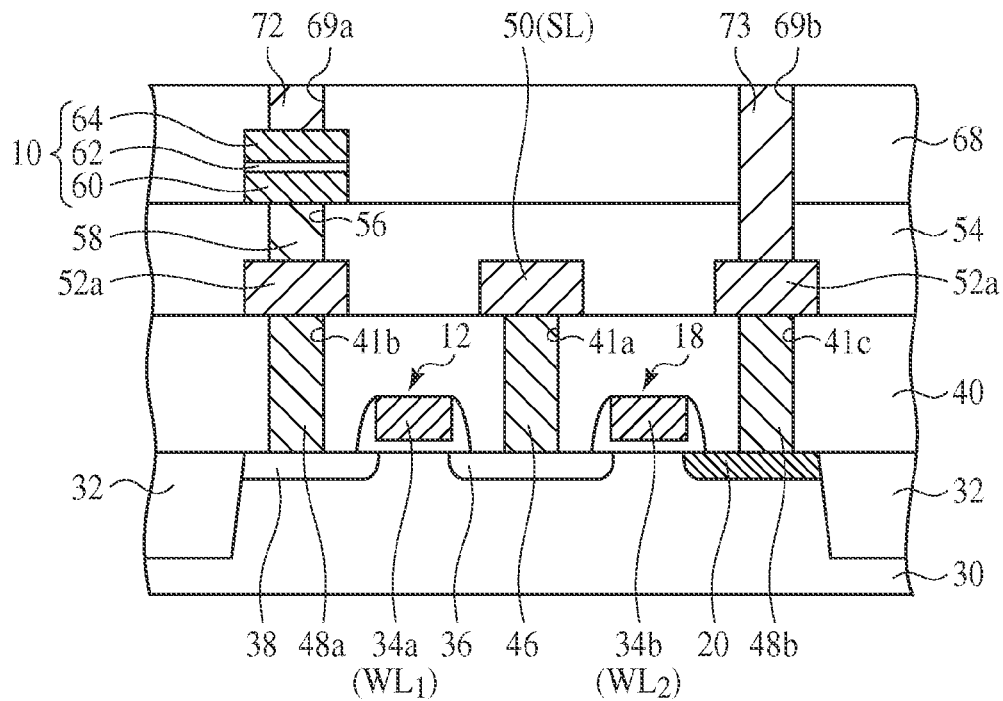
Figure 18B:
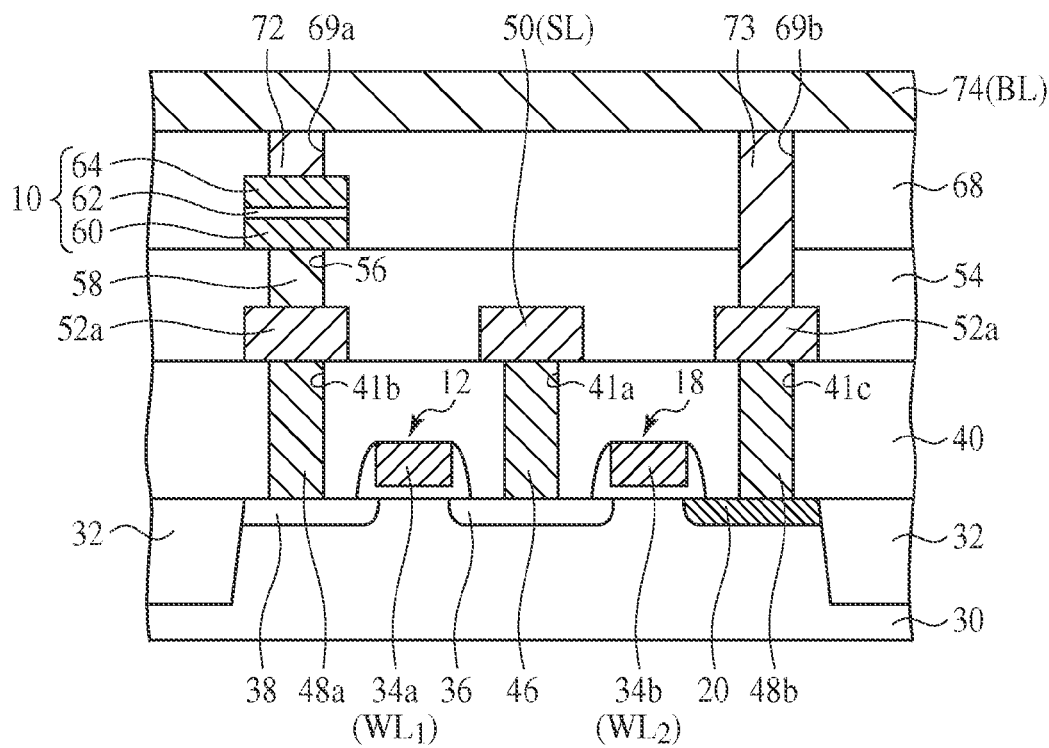

Then, by etching back, the contact plugs 72, 73 of tungsten film are buried in the contact holes 69a, 69b (see FIG. 18A).

Next, by, e.g., sputtering, a conduction film is formed on the inter-layer insulation film 68 with the contact plugs 72, 73 buried in.

Then, the conduction film is patterned by photolithography. Thus, the bit line 74 of the conduction film is formed (see FIG. 18B).

Thus, the nonvolatile semiconductor memory device according to the present embodiment is manufactured.

[d] Fourth Embodiment

Figure 19:
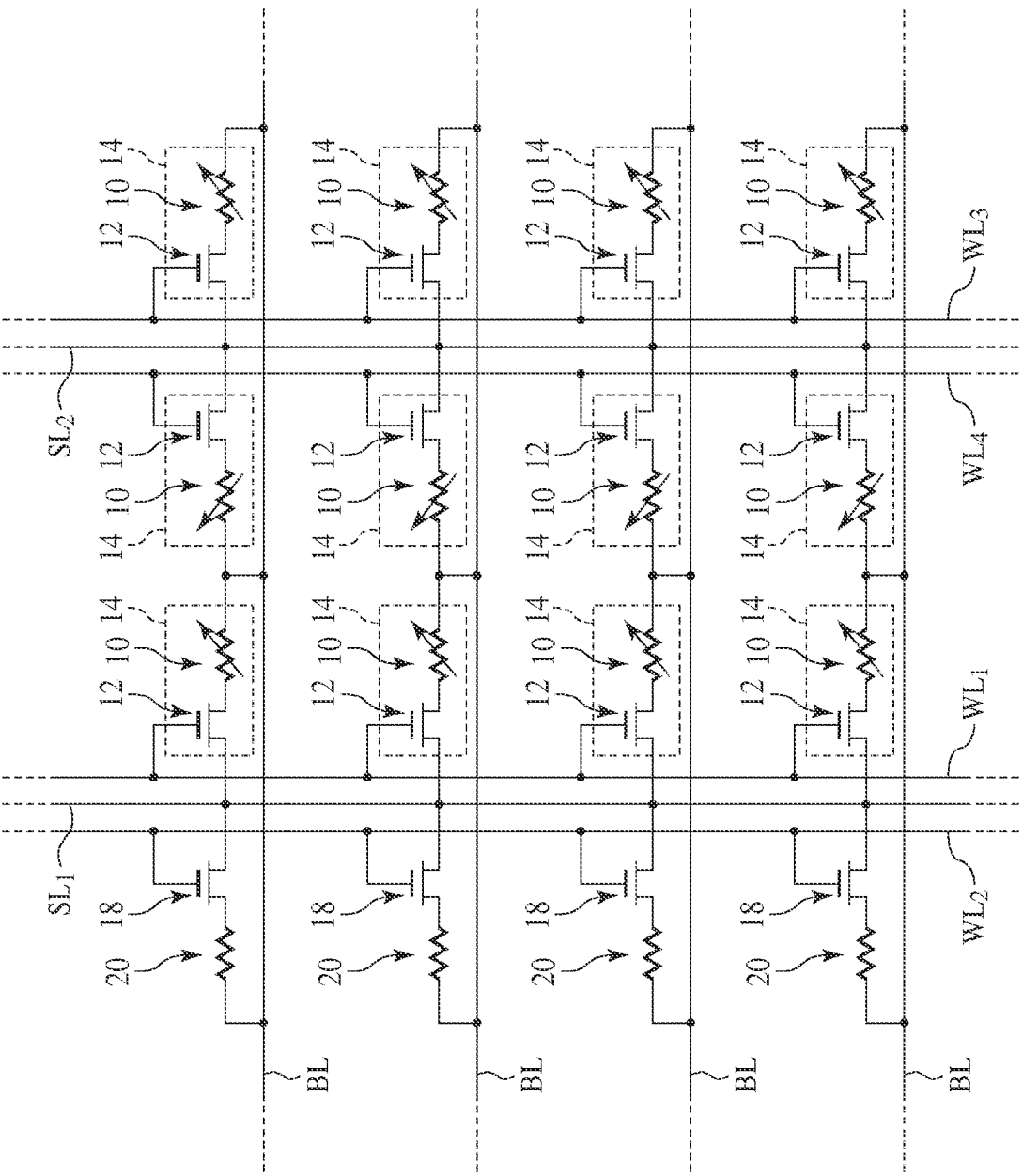
FIG. 19 is the circuit diagram of the nonvolatile semiconductor memory device according to a fourth embodiment.

The nonvolatile semiconductor memory device according to a fourth embodiment will be explained with reference to FIG. 19. FIG. 19 is the circuit diagram of the nonvolatile semiconductor memory device according to the present embodiment. The same members of the present embodiment as those of the nonvolatile semiconductor memory device and its reading method according to the first to the third embodiments illustrated in FIGS. 1A to 18B are represented by the same reference numbers not to repeat or to simplify their explanation.

The nonvolatile semiconductor memory device according to the present embodiment is characterized mainly in that a resistor 20 formed of an impurity diffused layer is common among a plurality of memory cells 14 present in one and the same column, as is the resistor 16 of the nonvolatile semiconductor memory device according to the second embodiment.

As illustrated in FIG. 19, in each column, the resistor 20 of an impurity diffused layer has one end electrically connected to the associated bit line BL. In other words, one ends of the resistance memory elements 10 present in one and the same column are connected to the common resistor 20 via the associated bit line BL.

In each column, the other end of the resistor 20 of the impurity diffused layer is electrically connected to one, i.e., the drain terminal, of the source/drain diffused layers of the second transistor 18.

Thus, the nonvolatile semiconductor memory device according to the present embodiment is constituted.

As described above, a resistor 20 of an impurity diffused layer may be common among a plurality of memory cells 14 present in one and the same column.

The writing method and the reading method of the nonvolatile semiconductor memory device according to the present embodiment are the same as the writing method and the reading method of the nonvolatile semiconductor memory device according to the second embodiment, and their explanation will not be repeated.

[e] Fifth Embodiment

Figure 20:
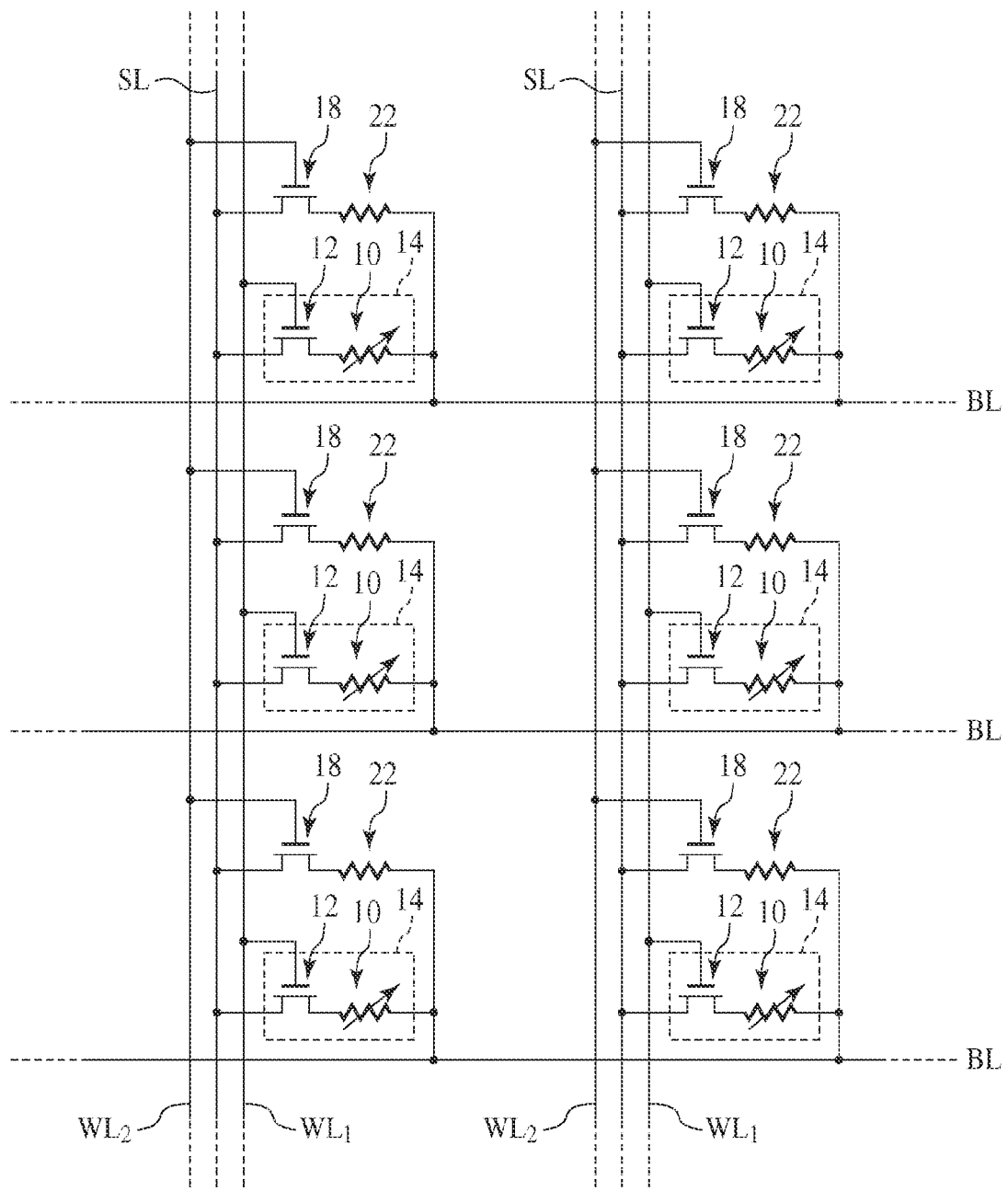
FIG. 20 is the circuit diagram of the nonvolatile semiconductor memory device according to a fifth embodiment.
Figure 21:
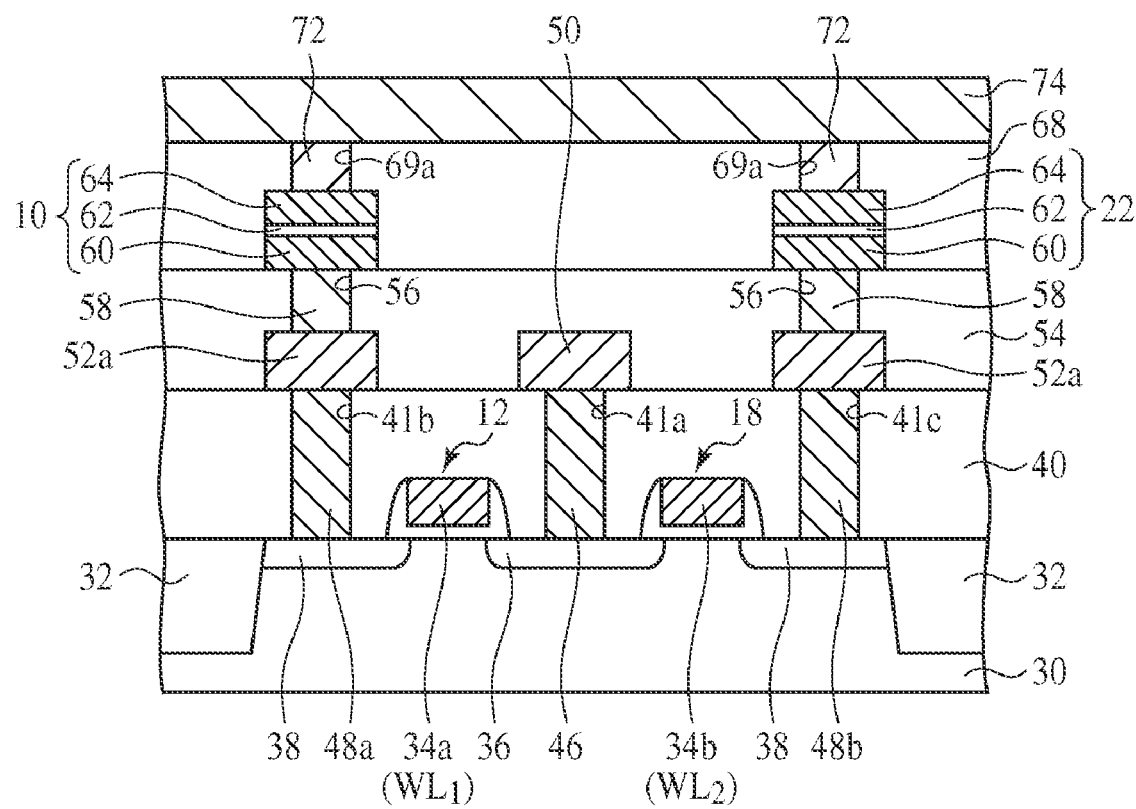
FIG. 21 is a sectional view of the nonvolatile semiconductor memory device according to the fifth embodiment, which illustrates the structure.

The nonvolatile semiconductor memory device according to a fifth embodiment will be explained with reference to FIGS. 20 and 21. FIG. 20 is the circuit diagram of the nonvolatile semiconductor memory device according to the present embodiment. FIG. 21 is a sectional view of the nonvolatile semiconductor memory device according to the present embodiment. The same members of the present embodiment as those of the nonvolatile semiconductor memory device and its reading method according to the first to the fourth embodiments illustrated in FIGS. 1A to 19 are represented by the same reference numbers not to repeat or to simplify their explanation.

The nonvolatile semiconductor memory device according to the present embodiment is characterized mainly in that a resistor 22 comprises another resistance memory element formed of the same layer structure as the resistance memory element 10.

(Circuit Structure of the Nonvolatile Semiconductor Memory Device)

First, the circuit structure of the nonvolatile semiconductor memory device according to the present embodiment will be explained with reference to FIG. 20.

As illustrated in FIG. 20, in each memory cell 14, the resistor 22 is connected in parallel with the memory cell 14, and the second transistor 18 is connected serially with the resistor 22.

In each memory cell 14, the resistor 22 has one end electrically connected to one end of the resistance memory element 10 and to the associated bit line BL. In each memory cell 14, the other end of the resistor 16 is electrically connected to one end, i.e., the drain terminal, of the source/drain diffused layers of the second transistor 18.

The resistor 22 comprises another resistance memory element of the same layer structure as the resistance memory element 10. As the resistance memory element used as the resistor 22, a resistance memory element which is in the initial state without having been subjected to forming processing, i.e., which has not exhibited the resistance memory characteristics that the high resistance state and the low resistance state are reversibly switched can be used. When the resistance value of the resistance memory element in the initial state is smaller than the resistance value of the resistance memory element in the high resistance state or is equal to the minimum value of the resistance of the resistance memory element in the high resistance state, the resistance memory element in the initial state can be used as the resistor 22.

When the resistance value of the resistance memory element in the initial state is larger than the minimum value of the resistance of the resistance memory element in the high resistance state, the write may be made in the resistor 22 so that the resistance value of the resistor 22 comprising the resistance memory element becomes equal to the minimum value of the resistance of the resistance memory element 10 in the high resistance state. The resistance value of the resistor 22 is retained equal to the minimum value of the resistance of the resistance memory element 10 in the high resistance state unless another write is made for the resistor 22 having the resistance value set equal to the minimum value of the resistance of the resistance memory element 10 in the high resistance state. Thus, the resistor 22 can contribute to decreases of scatter of the read current.

Thus, the nonvolatile semiconductor memory device according to the present embodiment is constituted.

(Structure of the Nonvolatile Semiconductor Memory Device)

Then, the structure of the nonvolatile semiconductor memory device according to the present embodiment will be explained with reference to FIG. 21.

As illustrated in FIG. 21, device isolation regions 32 for a defining device region are formed on a semiconductor substrate 30.

On the semiconductor substrate 30 with the device region defined, a word line WL1 and a word line WL2 are formed with a gate insulation film formed therebetween. The word line WL1 functions as the gate electrode 34a of the first transistor. The word line WL2 functions as the gate electrode 34b of the second transistor.

Source/drain diffused layers 36, 38 are formed in the semiconductor substrate 30 on both sides of the word line WL1 and in the semiconductor substrate 30 on both sides of the word line WL2.

The gate electrode 34a functioning also as the word line WL1, and the source/drain diffused layers 36, 38 form the first transistor 12.

The gate electrode 34b functioning as the word line WL2, and the source/drain diffused layers 36, 38 form the second transistor 18.

One source/drain diffused layer 36 of the first transistor 12, and one source/drain diffused layer 36 of the second transistor 18 are formed of the common source/drain diffused layer 36.

An inter-layer insulation film 40 is formed on the semiconductor substrate 30 with the first transistor 12 and the second transistor 18 formed on.

In the inter-layer insulation film 40, a contact plug 46 connected to the source/drain diffused layer 36, a contact plug 48a connected to the source/drain diffused layer 38, and a contact plug 48b connected to the source/drain diffused layer 38 are buried.

On the inter-layer insulation film 40, a source line 50(SL) electrically connected to the source/drain diffused layer 36 via the contact plug 46, a relay interconnection 52a electrically connected to the source/drain diffused layer 38 via the contact plug 48a, and a relay interconnection 52a electrically connected to the source/drain diffused layer 38 via the contact plug 48b are formed.

An inter-layer insulation film 54 is formed on the inter-layer insulation film 40 with the source line 50 and the relay interconnections 52a formed on. In the inter-layer insulation film 54, contact plugs 58 connected to the relay interconnections 52a are buried.

A resistance memory element 10 is formed on the inter-layer insulation film 54 with the contact plug 58 buried in. The resistance memory element 10 comprises a lower electrode 60 electrically connected to the source/drain diffused layer 38 via the contact plug 58, etc., a resistance memory layer 62 formed of a resistance memory material on the lower electrode 60, and an upper electrode 64 formed on the resistance memory layer 62. As the material of the lower electrode 60 and the upper electrode 64, platinum, for example, is used. As the material of the resistance memory layer 62, $NiO_X$, for example, is used.

On the inter-layer insulation film 54 with the contact plug 58 buried in, the resistor 22 of the resistance memory element of the same structure as the resistance memory element 10 is formed. The resistor 22 comprises a lower electrode 60 electrically connected to the source/drain diffused layer 38 via the contact plug 58, etc., a resistance memory layer 62 formed of a resistance memory material on the lower electrode 60, and an upper electrode 64 formed on the resistance memory layer 62. As the material of the lower electrode 60 and the upper electrode 64, platinum, for example, is used. As the material of the resistance memory layer 62, $NiO_X$, for example, is used.

An inter-layer insulation film 68 is formed on the inter-layer insulation film 54 with the resistance memory element 10 and the resistor 22 formed on. In the inter-layer insulation film 68, a contact plug 72 connected to the upper electrode 64 of the resistance memory element 10, and a contact plug 72 connected to the upper electrode 64 of the resistor 22 are buried.

A bit line 74(BL) is formed on the inter-layer insulation film 68 with the contact plugs 72 buried in. The bit line 74 is electrically connected to the upper electrode 64 of the resistance memory element 10 via the contact plug 72. The bit line 74 is electrically connected to the upper electrode of the resistor 22 via the contact plug 72.

Thus, the nonvolatile semiconductor memory device according to the present embodiment is constituted.

Thus, the resistor 22 may comprise the resistance memory element of the same structure as the resistance memory element 10.

The writing method and the reading method of the nonvolatile semiconductor memory device according to the present embodiment are the same as the writing method and the reading method of the nonvolatile semiconductor memory device according to the first embodiment, and their explanation will not be repeated.

[f] Sixth Embodiment

Figure 22:
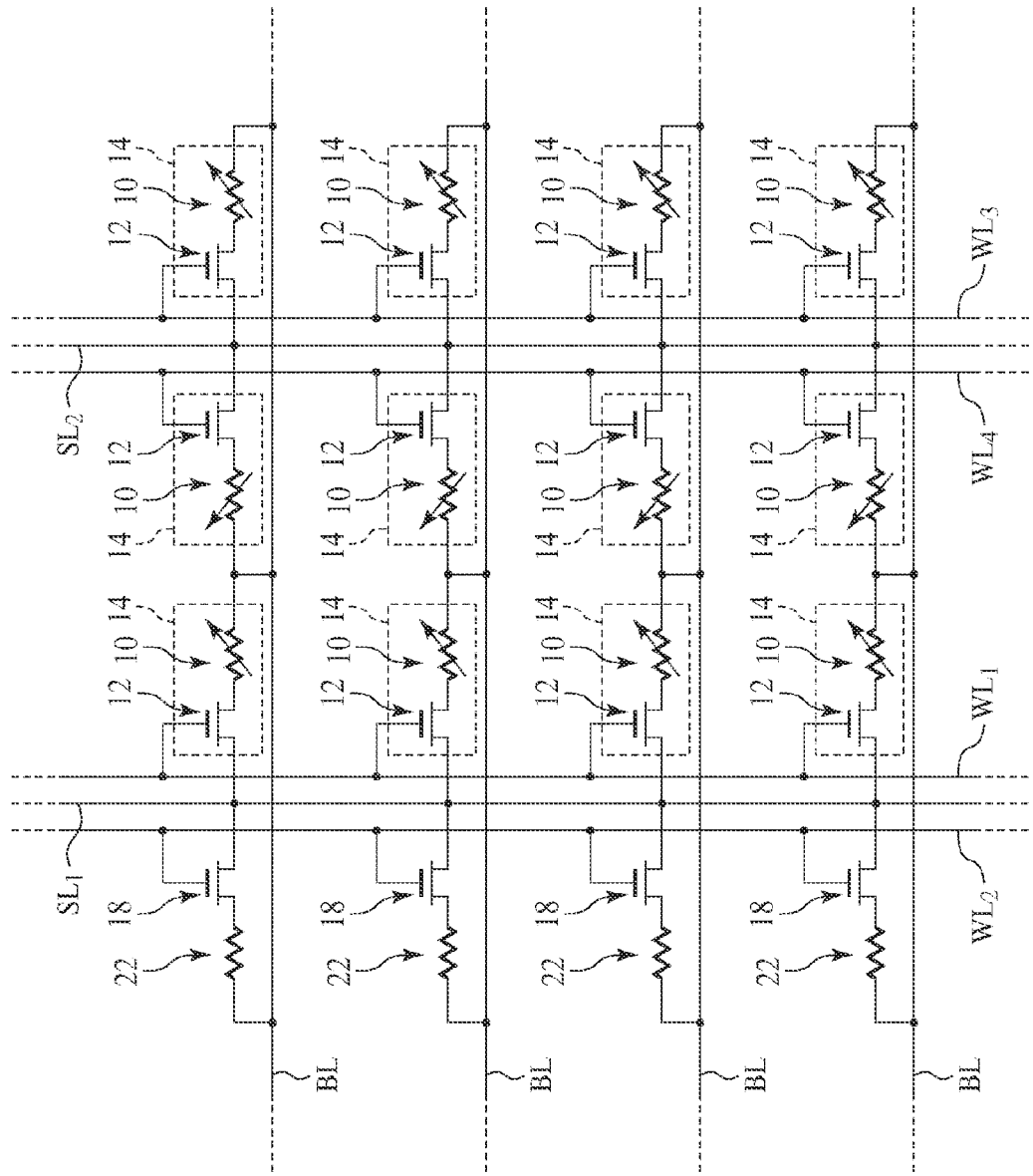
FIG. 22 is the circuit diagram of the nonvolatile semiconductor memory device according to a sixth embodiment.

The nonvolatile semiconductor memory device according to a sixth embodiment will be explained with reference to FIG. 22. FIG. 22 is the circuit diagram of the nonvolatile semiconductor memory device according to the present embodiment. The same members of the present embodiment as those of the nonvolatile semiconductor memory device and its reading method according to the first to the fifth embodiment illustrated in FIGS. 1A to 21 are represented by the same reference numbers not to repeat or to simplify their explanation.

The nonvolatile semiconductor memory device according to the present embodiment is characterized mainly in that a resistor 22 comprising a resistance memory element of the same structure as the resistance memory element 10 is arranged to be common among a plurality of memory cells 14 present in one and the same column as in the resistor 16 of the nonvolatile semiconductor memory device according to the second embodiment.

As illustrated in FIG. 22, in each column, the resistor 22 comprising the resistance memory element has one end electrically connected to the associated bit line BL. That is, the respective resistance memory elements 10 present in one and same column have one ends connected to the common resistor 22 via the associated bit line BL.

In each column, the other end of the resistor 22 comprising the resistance memory element is electrically connected to one, i.e., the drain terminal, of the source/drain diffused layers of the second transistors 18.

Thus, the nonvolatile semiconductor memory device according to the present embodiment is constituted.

As described above, a resistor 22 comprising the resistance memory element may be common among a plurality of memory cells 14 present in one and the same column.

The writing method and the reading method of the nonvolatile semiconductor memory device according to the present embodiment are the same as the writing method and the reading method of the nonvolatile semiconductor memory device according to the second embodiment, and their explanation will not be repeated.

[g] Seventh Embodiment

Figure 23:
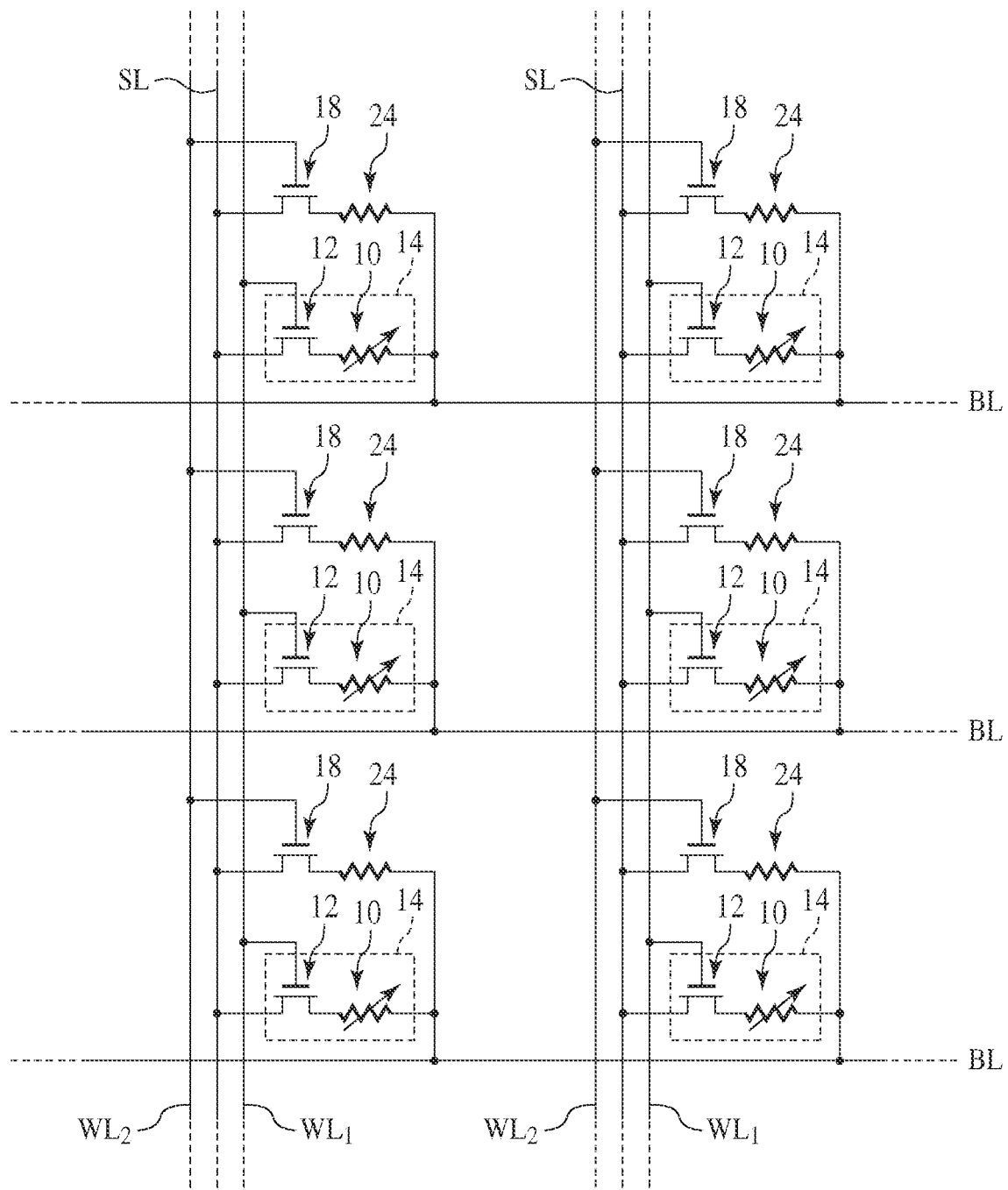
FIG. 23 is the circuit diagram of the nonvolatile semiconductor memory device according to a seventh embodiment.
Figure 24:
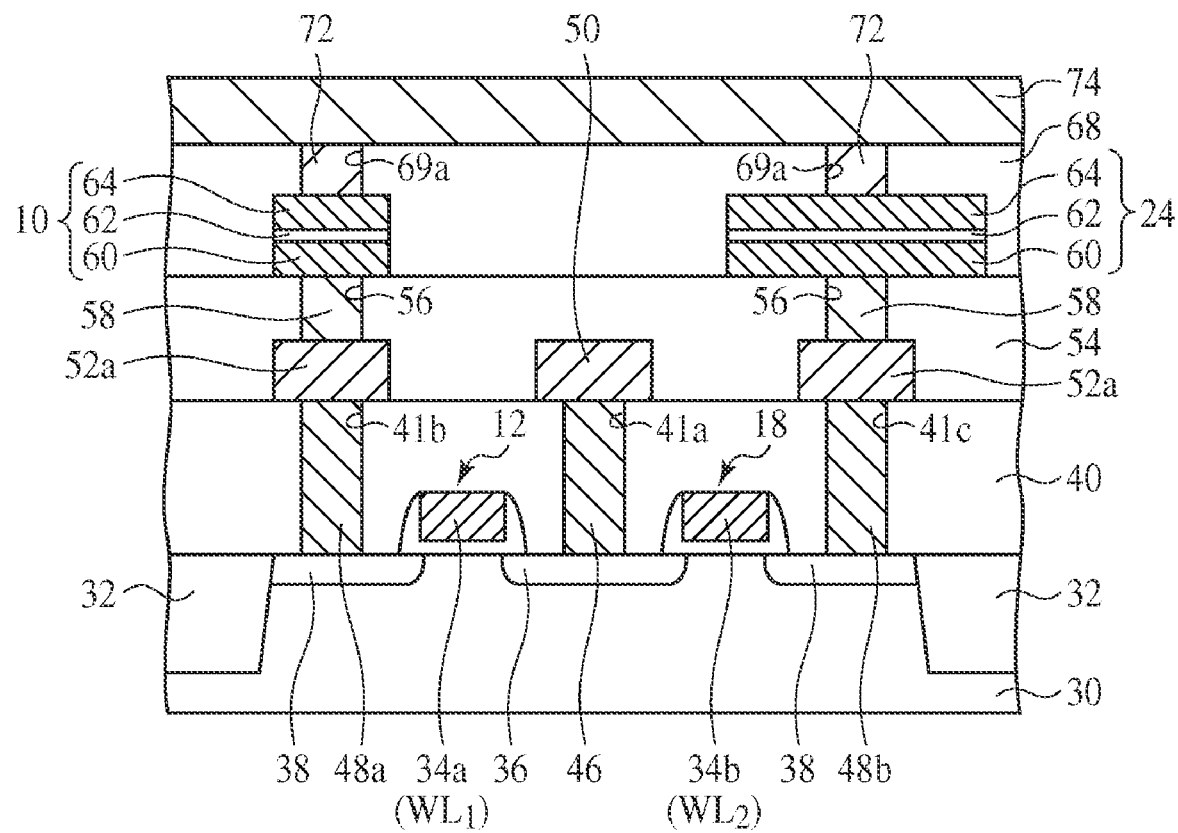
FIG. 24 is a sectional view of the nonvolatile semiconductor memory device according to the seventh embodiment, which illustrates the structure.

The nonvolatile semiconductor memory device according to a seventh embodiment will be explained with reference to FIGS. 23 and 24. FIG. 23 is the circuit diagram of the nonvolatile semiconductor memory device according to the present embodiment. FIG. 24 is a sectional view of the nonvolatile semiconductor memory device according to the present embodiment. The same members of the present embodiment as those of the nonvolatile semiconductor memory device and its reading method according to the first to the sixth embodiments illustrated in FIGS. 1A to 22 are represented by the same reference numbers not to repeat or to simplify their explanation.

The nonvolatile semiconductor memory device according to the present embodiment is characterized mainly in that the resistors 24 comprise resistance memory elements other than the resistance memory elements 10, whose device area is larger than the device area of the resistance memory elements 10.

(Circuit Structure of the Nonvolatile Semiconductor Memory Device)

First, the circuit structure of the nonvolatile semiconductor memory device according to the present embodiment will be explained with reference to FIG. 23.

As illustrated in FIG. 23, in each memory cell 14, the resistor 24 is connected in parallel with the memory cell 14, and the second transistor 18 is connected serially with the resistor 24.

In each memory cell 14, one end of the resistor 24 is connected to one end of the resistance memory element 10 and the associated bit line BL. In each memory cell 14, the other end of the resistor 16 is electrically connected to one, i.e., the drain terminal, of the source/drain diffused layers of the second transistor 18.

The resistor 24 comprises the resistance memory element whose device area is larger than the device area of the resistance memory element 10. That is, the resistor 24 comprises the resistance memory element whose opposed area between the lower electrode 60 and the upper electrode 64 is larger than that of the resistance memory element 10.

As described above with reference to FIGS. 3A and 3B, the region (filament region) 67, where the resistance change take place in the resistance memory element is considered to be a partial region of the resistance memory element. The equivalent circuit of the resistance memory element has the resistor $R_{fila}$ of the filament region 67 and the resistor $R_{excl}$ of the region other than the filament region 67 connected in parallel with each other. Accordingly, the opposed area between the lower electrode 60 and the upper electrode 64 of the resistance memory element is set sufficiently large, whereby the resistance value of the resistance memory element can be made small.

In the present embodiment, the opposed area S1 between the lower electrode 60 and the upper electrode 64 of the resistor 24 is set larger than the opposed area S2 between the lower electrode 60 and the upper electrode 64 of the resistance memory element 10, whereby the resistance value of the resistor 24 can be made smaller than the resistance value of the resistance memory element 10.

When the opposed area between the lower electrode 60 and the upper electrode 64 of the resistor 24 is S1, and the opposed area between the lower electrode 60 and the upper electrode 64 of the resistance memory element 10 is S2, it is preferable to set the opposed area S1 five times or more times the opposed area S2. The opposed area S1 is set five times or more the opposed area S2, whereby the resistance value of the resistor 24 can be made sufficiently small for the resistance value of the resistance memory element 10.

As the resistance memory element used as the resistor 24, a resistance memory element which is in the initial state without having been subjected to forming processing, i.e., which has not exhibited the resistance memory characteristics that the high resistance state and the low resistance state are reversibly switched can be used. When the resistance value of the resistor 24 of the resistance memory element in the initial state is smaller than the resistance value of the resistance memory element 10 in the high resistance state, the resistance memory element in the initial state can be used as the resistor 24.

When the resistance value of the resistor 24 of the resistance memory element in the initial state is larger than the minimum value of the resistance of the resistance memory element 10 in the high resistance state, the write is made for the resistor 24 so that the resistance value of the resistor 24 of the resistance memory element becomes smaller than the minimum value of the resistance of the resistance memory element 10 in the high resistance state. The resistance value of the resistor 24 is retained smaller than the minimum value of the resistance of the resistance memory element 10 in the high resistance state unless the write is made again for the resistor 24 whose resistance value set smaller than the minimum value of the resistance of the resistance memory element 10 in the high resistance state.

Thus, the nonvolatile semiconductor memory device according to the present embodiment is constituted.

(Structure of the Nonvolatile Semiconductor Memory Device)

Next, the structure of the nonvolatile semiconductor memory device according to the present embodiment will be explained with reference to FIG. 24.

As illustrated in FIG. 24, on an inter-layer insulation film 54 with contact plugs 58 buried in, the resistance memory element 10 is formed. The resistance memory element 10 comprises a lower electrode 60 electrically connected to the source/drain diffused layer 38 via the contact plug 58, etc., a resistance memory layer 62 of a resistance memory material formed on the lower electrode 60, and an upper electrode 64 formed on the resistance memory layer 62. As the material of the lower electrode 60 and the upper electrode 64, platinum, for example, is used. As the material of the resistance memory layer 62, $NiO_X$, for example, is used.

On the inter-layer insulation film 54 with the contact plugs 58 buried in, the resistor 24 of a resistance memory element whose opposed area between the lower electrode 60 and the upper electrode 64 is larger than the resistance memory element 10 is formed. The resistor 24 comprises a lower electrode 60 electrically connected to the source/drain diffused layer 38 via the contact plug 58, etc., a resistance memory layer 62 formed of a resistance memory material on the lower electrode 60, and an upper electrode 64 formed on the resistance memory layer 62. As the material of the lower electrode 60 and the upper electrode 64, platinum, for example, is used. As the material of the resistance memory layer 62, $NiO_X$ film, for example, is used.

On the inter-layer insulation film 54 with the resistance memory element 10 and the resistor 14 formed on, an inter-layer insulation film 68 is formed. In the inter-layer insulation film 68, a contact plug 72 connected to the upper electrode 64 of the resistance memory element 10, and a contact plug 72 connected to the upper electrode 64 of the resistor 24 are buried.

On the inter-layer insulation film 68 with the contact plugs 72 buried in, the bit line 74(BL) is formed. The bit line 74 is electrically connected to the upper electrode 64 of the resistance memory element 10 via the contact plug 72. The bit line 74 is electrically connected also to the upper electrode of the resistor 124 via the contact plug 72.

Thus, the nonvolatile semiconductor memory device according to the present embodiment is constituted.

As described above, as the resistor 24, a resistance memory element whose opposed area between the lower electrode 60 and the upper electrode 64 is larger than that of the resistance memory element 10 may be used.

The writing method and the reading method of the nonvolatile semiconductor memory device according to the present embodiment are the same as the writing method and the reading method of the nonvolatile semiconductor memory device according to the first embodiment, and their explanation will no be repeated.

[h] Eighth Embodiment

Figure 25:
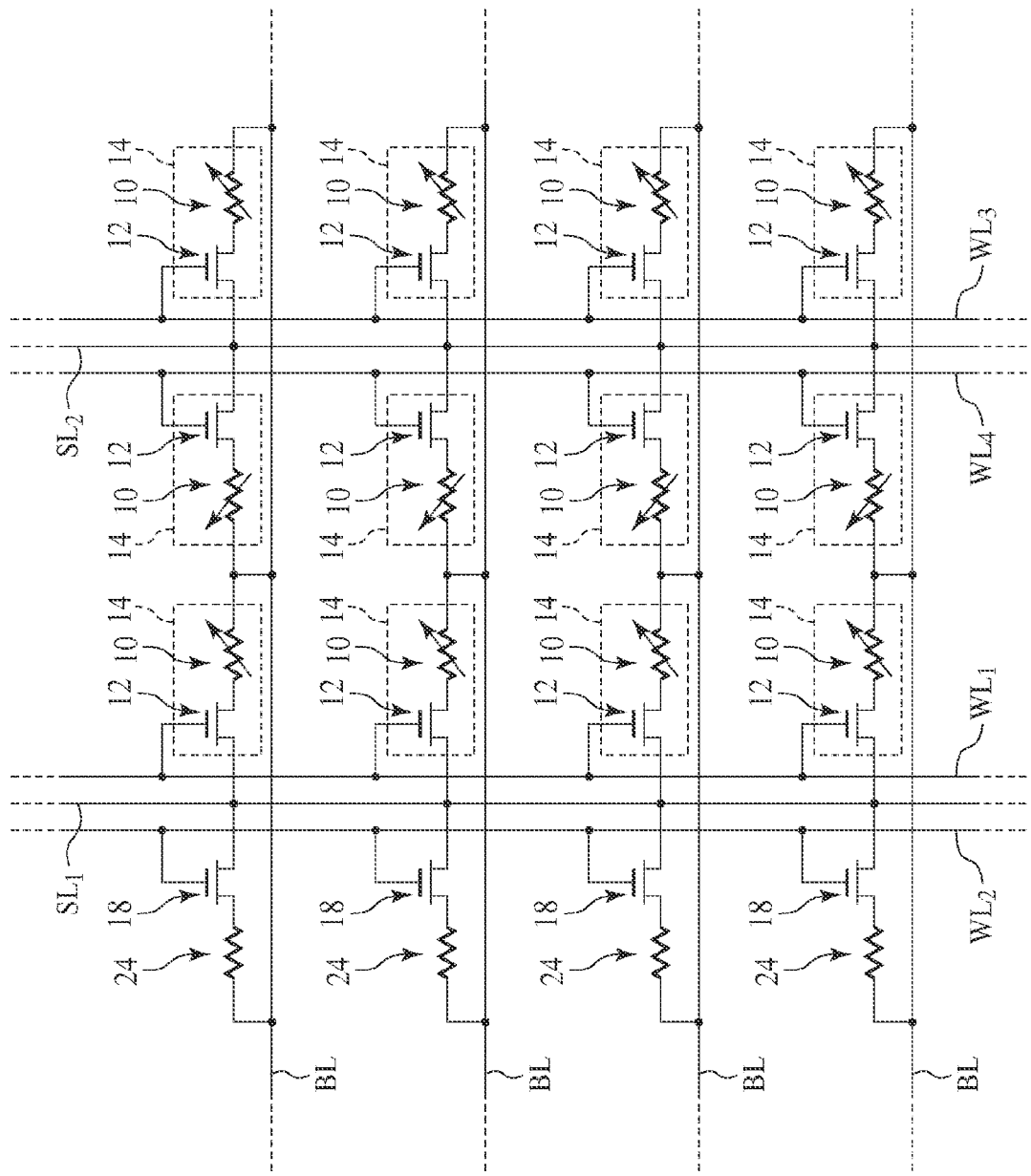
FIG. 25 is the circuit diagram of the nonvolatile semiconductor memory device according to an eighth embodiment.

The nonvolatile semiconductor memory device according to an eighth embodiment will be explained with reference to FIG. 25. FIG. 25 is the circuit diagram of the nonvolatile semiconductor memory device according to the present embodiment. The same members of the present embodiment as those of the nonvolatile semiconductor memory device and its reading method according to the first to the seventh embodiments illustrated in FIGS. 1A to 24 are represented by the same reference numbers not to repeat or to simplify their explanation.

The nonvolatile semiconductor memory device according to the present embodiment is characterized mainly in that a resistor 24 comprising another resistance memory element whose device area is larger than the resistance memory element 10 is common among a plurality of memory cells 14 present in one and the same column, as is the resistor 16 of the nonvolatile semiconductor memory device according to the second embodiment.

As illustrated in FIG. 25, in each column, the resistor 24 comprising the resistance memory element has one end electrically connected to the associated bit line BL. That is, one ends of the respective resistance memory elements present 10 in one and the same column are connected to the common resistor 24 via the associated bit line BL.

In each column, the other end of the resistor 24 of the resistance memory element is electrically connected to one source/drain diffused layer, i.e., the drain terminal, of the second transistor 18.

Thus, the nonvolatile semiconductor memory device according to the present embodiment is constituted.

As described above, the resistor 24 comprising the resistance memory element may be common among a plurality of memory cells 14 present in one and the same column.

The writing method and the reading method of the nonvolatile semiconductor memory device according to the present embodiment are the same as the writing method and the reading method of the nonvolatile semiconductor memory device according to the second embodiment, and their explanation will not be repeated.

[i] Ninth Embodiment

Figure 26:
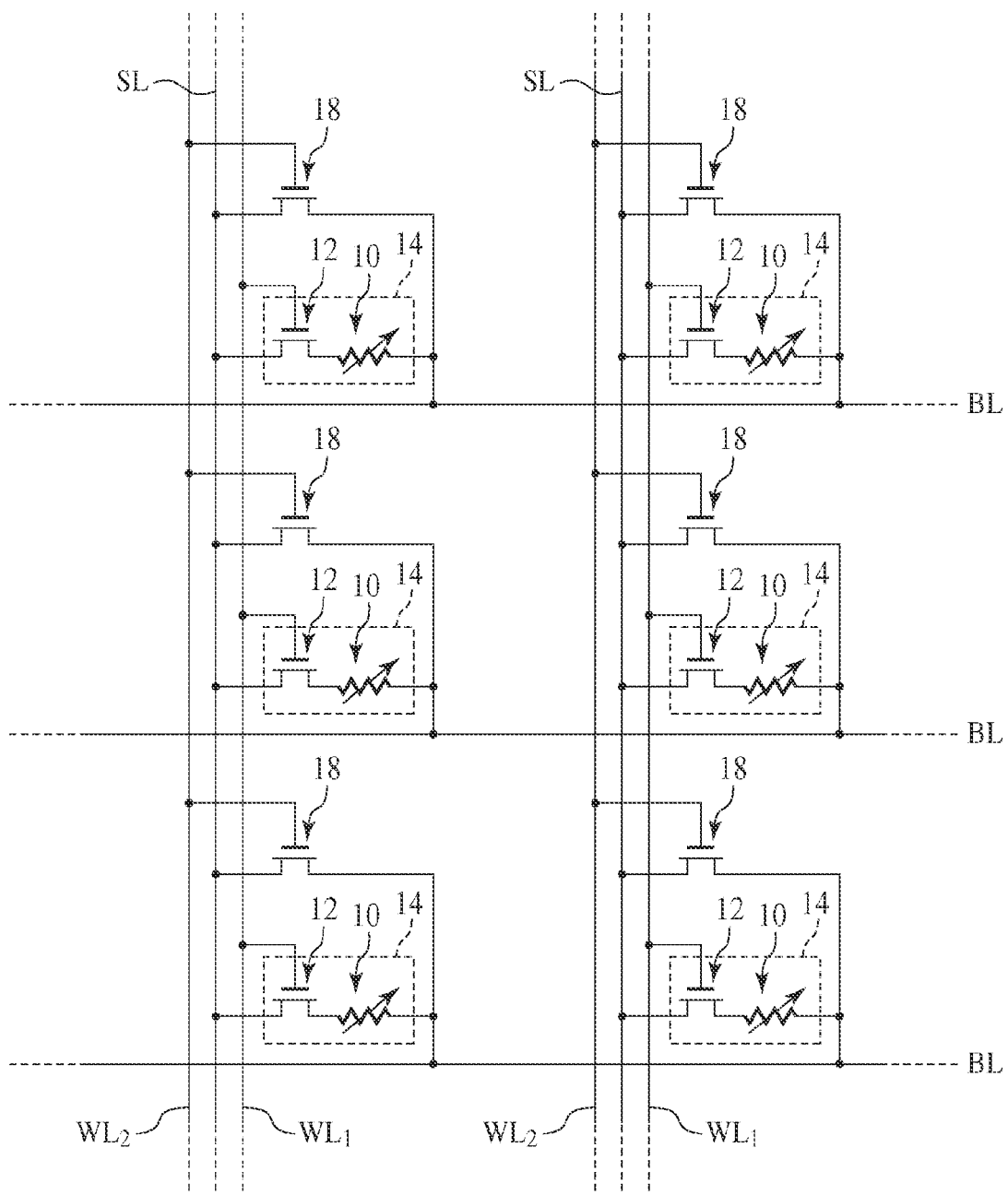
FIG. 26 the circuit diagram of the nonvolatile semiconductor memory device according to a ninth embodiment.
Figure 27:
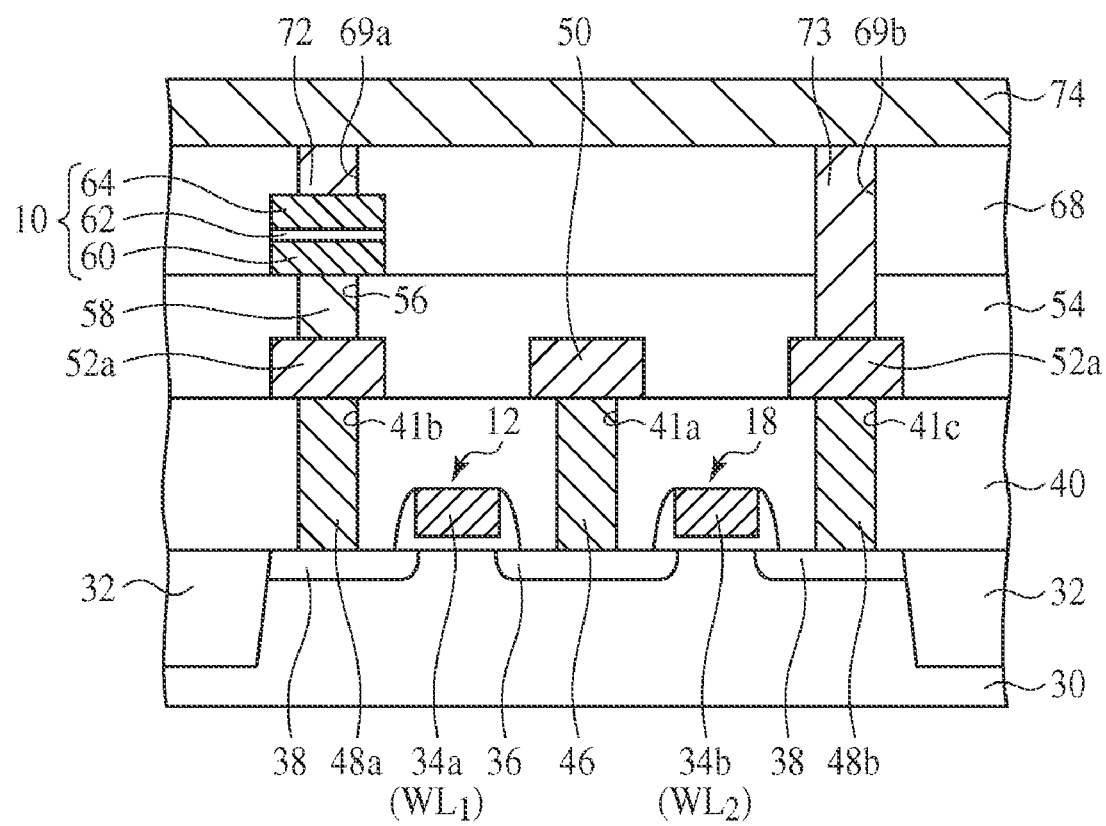
FIG. 27 is a sectional view of the nonvolatile semiconductor memory device according to the ninth embodiment, which illustrates the structure.

The nonvolatile semiconductor memory device according to a ninth embodiment will be explained with reference to FIGS. 26 and 27. FIG. 26 is the circuit diagram of the nonvolatile semiconductor memory device according to the present embodiment. FIG. 27 is a sectional view of the nonvolatile semiconductor memory device according to the present embodiment. The same members of the present embodiment as those of the nonvolatile semiconductor memory device and its reading method according to the first to the eighth embodiments illustrated in FIGS. 1A to 25 are represented by the same reference numbers not to repeat or to simplify their explanation.

The nonvolatile semiconductor memory device according to the present embodiment is characterized mainly in that when information written in the resistance memory elements 10 is read, the ON resistance (channel resistance) of the second transistors 18 are controlled to thereby contact the resistors in parallel with the resistance memory elements 10.

(Circuit Structure of the Nonvolatile Semiconductor Memory Device)

First, the circuit structure of the nonvolatile semiconductor memory device according to the present embodiment will be explained with reference to FIG. 26.

As illustrated in FIG. 26, in each memory cell 14, the second transistor 18 is connected in parallel with the memory cell 14.

In each memory cell 14, one, i.e., the drain terminal, of the source/drain diffused layers of the second transistor 18 is electrically connected to one end of the resistance memory element 10 and the associated bit line BL.

The other, the source terminal, of the source/drain diffused layers of the second transistor 18 is electrically connected to the associated source line SL.

In the present embodiment, when information written in the resistance memory element 10 is read, a voltage is applied to the gate terminal of the second transistor 18 so that the resistance value (ON resistance) of the source-to-drain of the second transistor 18 becomes sufficiently large for the resistance value of the resistance memory element 10 in the low resistance state and becomes sufficiently small for the resistance value of the resistance memory element 10 in the high resistance state.

In the present embodiment as well, when information written in the resistance memory elements 10 is read, the resistors whose resistance value is relatively small and whose resistance value scatter is small are connected in parallel with the memory cells 14, whereby the scatter of the read current can be reduced.

Thus, the nonvolatile semiconductor memory device according to the present embodiment is constituted.

(Structure of the Nonvolatile Semiconductor Memory Device)

Next, the structure of the nonvolatile semiconductor memory device according to the present embodiment will be explained with reference to FIG. 27.

As illustrated in FIG. 27, on a semiconductor substrate 30, the first transistor 12 including a gate electrode 34a and source/drain diffused layers 36, 38, and the second transistor 18 including a gate electrode 34b and source/drain diffused layers 36, 38 are formed.

On the semiconductor substrate 30 with the first transistor 12 and the second transistor 18 formed on, an inter-layer insulation film 40 is formed.

In the inter-layer insulation film 40, a contact plug 46 connected to the source/drain diffused layer 36, a contact plug 48a connected to the source/drain diffused layer 38, and a contact plug 48b connected to the source/drain diffused layer 38 are buried.

On the inter-layer insulation film 40, a source line 50(SL) electrically connected to the source/drain diffused layer 36 via the contact plug 46, a relay interconnection 52a electrically connected to the source/drain diffused layer 38 via the contact plug 48a, and a relay interconnection 52a electrically connected to the source/drain diffused layer 38 via the contact plug 48b are formed.

On the inter-layer insulation film 40 with the source line 50 and the relay interconnections 52a formed on, an inter-layer insulation film 54 is formed. In the inter-layer insulation film 54, a contact plug 58 connected to the relay interconnection 52a is buried.

On the inter-layer insulation film 54 with the contact plug 58 buried in, the resistance memory element 10 is formed.

On the inter-layer insulation film 54 with the resistance memory element 10 formed on, an inter-layer insulation film 68 is formed. In the inter-layer insulation film 68, a contact plug 72 connected to the upper electrode 64 of the resistance memory element 10 is buried. In the inter-layer insulation film 68 and the inter-layer insulation film 54, a contact plug 73 connected to the relay interconnection 52a is buried.

On the inter-layer insulation film 68 with the contact plugs 72, 73 buried in, a bit line 74(BL) is formed. The bit line 74 is electrically connected to the upper electrode 64 of the resistance memory element 10 via the contact plug 72. The bit line 74 is electrically connected to the source/drain diffused layer 38 of the second transistor 18 via the contact plug 73, etc.

Thus, the nonvolatile semiconductor memory device according to the present embodiment is constituted.

The writing method of the nonvolatile semiconductor memory device according to the present embodiment is the same as the writing method of the nonvolatile semiconductor memory device according to the first embodiment, and its explanation will not be repeated.

(Reading Method)

Next, the reading method of the nonvolatile semiconductor memory device according to the present embodiment will be explained with reference to FIG. 26.

When information written in the resistance memory elements 10 of the memory cells 14 is read, the word line WL1 connected to a memory cell 14 to be read is selected by a row selector (not illustrated). Specifically, a prescribed voltage is applied by the row selector to the word line WL1 connected to the memory cell 14 to be read. The source line SL is connected to a prescribed reference potential, e.g., the ground potential. Thus, the first transistor 12 of the memory cell 14 to be read is turned on-state.

To the word line WL2 connected to the memory cell 14 to be read, a voltage is applied by the row selector (control circuit) not illustrated. At this time, the voltage to be applied to the word line WL2 is suitably controlled so that the resistance (ON resistance) of the source-to-drain of the second transistor becomes sufficiently large for the resistance value of the resistance memory element 10 in the low resistance state and becomes sufficiently small for the resistance value of the resistance memory element 10 in the high resistance state. Thus, the resistance (resistor) of the source-to-drain of the second transistor is connected in parallel with the memory cell 14.

Next, the bit line BL connected to the memory cell 14 to be read is selected by the column selector (not illustrated). Thus, the bit line BL selected by the column selector is connected to the read circuit (not illustrated). When the high resistance state has been written in the resistance memory element 10 of the memory cell 14 to be read, a relatively small current flows in the bit line BL. On the other hand, when the low resistance state has been written in the resistance memory element 10 of the memory cell 14 to be read, a relatively large current flows in the bit line BL. The read circuit detects the current flowing in the bit line BL by the sense amplifier and judges whether the resistance memory element is in the low resistance sate or the high resistance state. That is, the read circuit reads information written in the resistance memory element 10, based on the current flowing in the bit line BL.

In the nonvolatile semiconductor memory device according to the present embodiment, when information written in a resistance memory element 10 is read, it is possible that the resistance of the source-to-drain of the second transistor 18 is controlled to thereby connect the resistor in parallel with the resistance memory element 10.

[j] Tenth Embodiment

Figure 28:
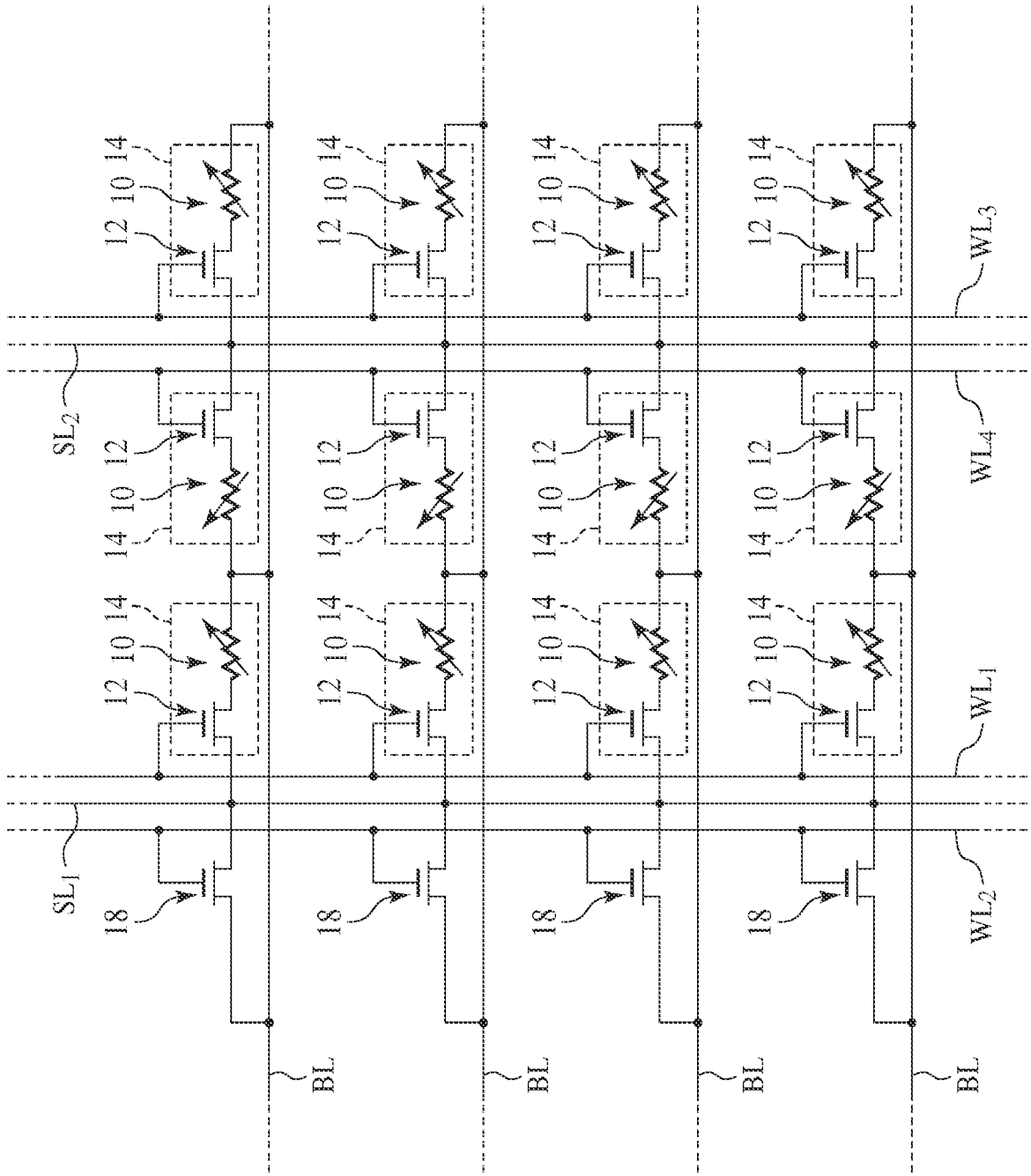
FIG. 28 is the circuit diagram of the nonvolatile semiconductor memory device according to a tenth embodiment.

The nonvolatile semiconductor memory device according to a tenth embodiment will be explained with reference to FIG. 28. FIG. 28 is the circuit diagram of the nonvolatile semiconductor memory device according to the present embodiment. The same members of the present embodiment as those of the nonvolatile semiconductor memory device and its reading method according to the first to the ninth embodiments illustrated in FIGS. 1A to 27 are represented by the same reference numbers not to repeat or to simplify their explanation.

The nonvolatile semiconductor memory device according to the present embodiment is characterized mainly in that the second transistor which is to be connected in parallel with the resistance memory elements 10 when information written in the resistance memory elements 10 is common among a plurality of memory cells 14 present in one and the same column.

As illustrated in FIG. 28, in each column, the second transistor 18 has one, i.e., the drain terminal, of the source/drain electrically connected to the associated bit line BL. That is, one ends of the resistance memory elements 10 present in one and the same column are connected to the common second transistor 18 via the bit line BL.

In each column, the other, the source terminal, of the source/drain diffused layers of the second transistor 18 is electrically connected to the associated word line WL2.

Thus, the nonvolatile semiconductor memory device according to the present embodiment is constituted.

As described above, the second transistor 18 may be common among a plurality of memory cells 14 present in one and the same column.

The writing method of the nonvolatile semiconductor memory device according to the present embodiment is the same as the writing method of the nonvolatile semiconductor memory device according to the second embodiment, and its explanation will not be repeated.

(Reading Method)

Next, the reading method of the nonvolatile semiconductor memory device according to the present embodiment will be explained with reference to FIG. 28.

When information written in the resistance memory elements 10 of the memory cells 14 is read, the word lines WL1, WL3, WL4, . . . connected to a memory cell 14 to be read is selected by a row selector (not illustrated). Specifically, a prescribed voltage is applied by the row selector to the word line WL1, WL3, WL4, . . . connected to the memory cell 14 to be read. The source lines SL1, SL2, are connected to a prescribed reference potential, e.g., the ground potential. Thus, the first transistor 12 of the memory cell 14 to be read is turned on-state.

To the word line WL2 connected to the second transistor 18, a voltage is applied by the row selector (not illustrated). At this time, the voltage to be applied to the word line WL2 is suitably controlled so that the resistance (ON resistance) of the source-to-drain of the second transistor becomes sufficiently large for the resistance value of the resistance memory element 10 in the low resistance state and becomes sufficiently small for the resistance value of the resistance memory element 10 in the high resistance state. Thus, the resistance (resistor) of the source-to-drain of the second transistor is connected in parallel with the memory cell 14.

Then, the bit line BL connected to the memory cell 14 to be read is selected by a column selector (not illustrated). Thus, the bit line BL selected by the column selector is connected to the read circuit (not illustrated). When the high resistance state has been written in the resistance memory element 10 of the memory cell 14 to be read, a relatively small current flows in the bit line BL. On the other hand, when the low resistance state has been written in the resistance memory 10 of the memory cell 14 to be read, a relatively large current flows in the bit line BL. The read circuit detects the current flowing in the bit line BL by the sense amplifier and judges whether the resistance memory element 10 has the low resistance state or the high resistance state. That is, the read circuit read the information written in the resistance memory element 10, based on the current flowing in the bit line BL.

As described above, the resistor 16 may be common among a plurality of memory cells 14 present in one and the same column.

[k] Eleventh Embodiment

Figure 29:
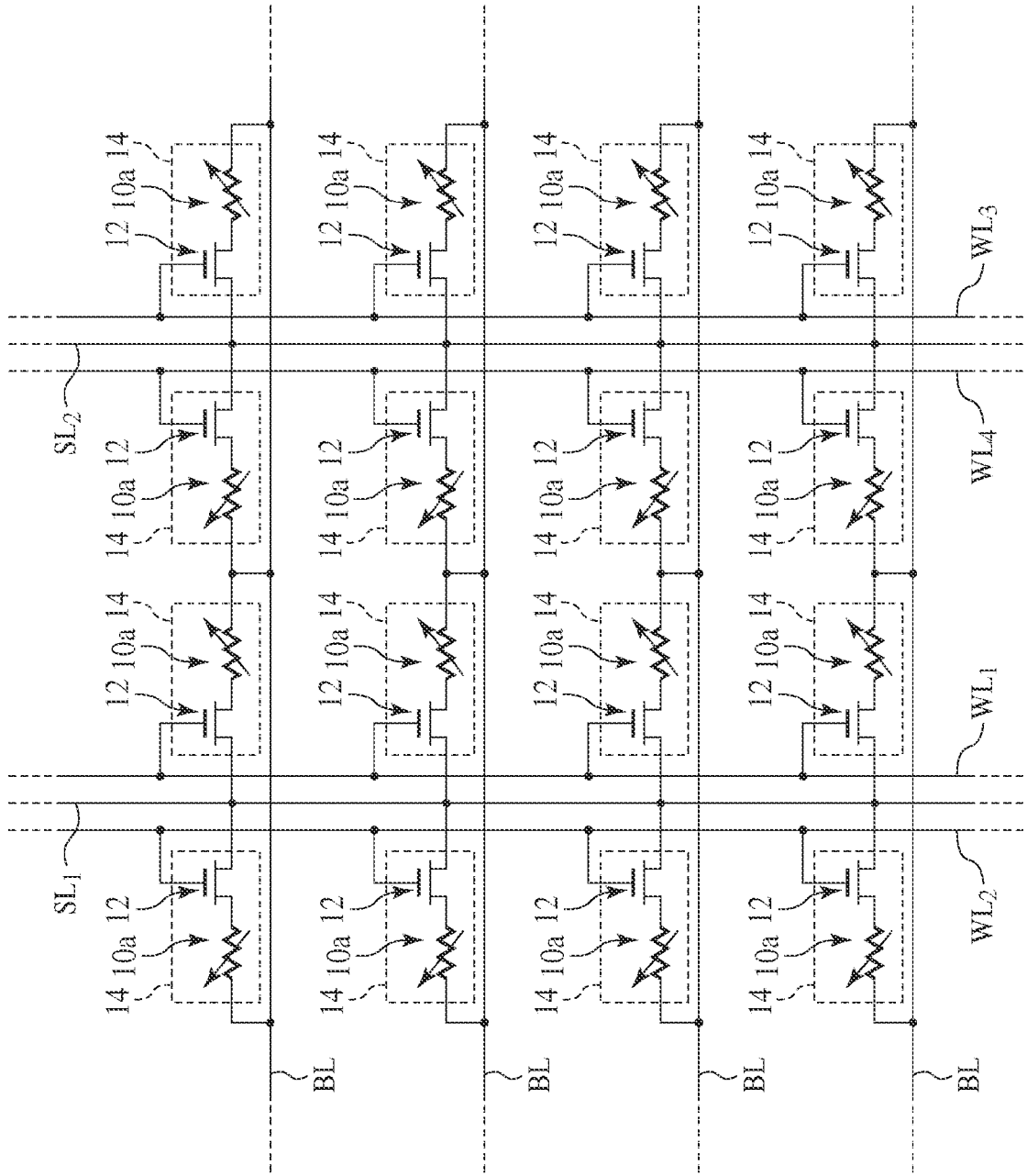
FIG. 29 the circuit diagram of the nonvolatile semiconductor memory device according to an eleventh embodiment.
Figure 30:
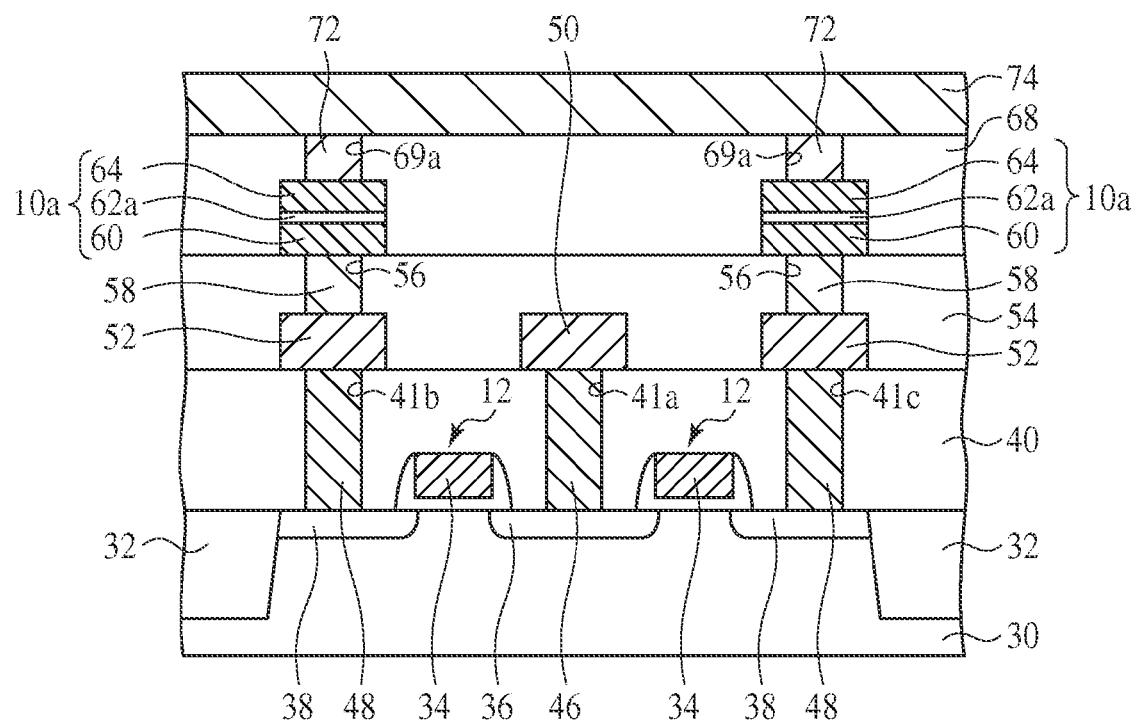
FIG. 30 is a sectional view of the nonvolatile semiconductor memory device according to the eleventh embodiment, which illustrates the structure.

The nonvolatile semiconductor memory device according to an eleventh embodiment will be explained with reference to FIG. 29. FIG. 29 is the circuit diagram of the nonvolatile semiconductor memory device according to the present embodiment. FIG. 30 is a sectional view of the nonvolatile semiconductor memory device according to the present embodiment, which illustrates the structure. The same members of the present embodiment as those of the nonvolatile semiconductor memory device and its reading method according to the first to the tenth embodiments illustrated in FIGS. 1A to 28 are represented by the same reference numbers not to repeat or to simplify their explanation.

The nonvolatile semiconductor memory device according to the present embodiment is characterized mainly in that a dopant impurity for reducing the electric resistance of the resistance memory layer 62a of the resistance memory element 10a is implanted in the resistance memory layer 62a.

(Circuit Structure of the Nonvolatile Semiconductor Memory Device)

First, the circuit diagram of the nonvolatile semiconductor memory device according to the present embodiment will be explained with reference to FIG. 29.

As illustrated in FIG. 29, a plurality of word lines WL1, WL2 and a plurality of source lines SL are arranged row-wise (longitudinally in the drawing). A plurality of bit lines BL are arranged column-wise (transversely in the drawing).

At the respective intersections of the word lines WL1, WL2 and the bit lines BL, memory cells 14 each including a resistance memory element 10a and a transistor (selective transistor) 12 are formed.

In each memory cell 14, the resistance memory element 10a has one end electrically connected to the associated bit line BL. In each memory cell 14, the other end of the resistance memory element 10 is electrically connected on one, i.e., the drain terminal, of the source/drain diffused layers of the transistor 12.

In each memory cell 14, the other, i.e., the source terminal, of the source/drain diffused layer of the transistor 12 is electrically connected to the associated source line SL. The source line SL is common among the memory cells 14 adjacent column-wise.

In each memory cell 14, the gate electrode, i.e., the gate terminal, of the transistor 12 is electrically connected to the respective word lines WL1, WL2.

The bit lines have one end connected to a column selector (not illustrated) for suitably selecting the bit lines BL. The ends of the word lines WL1, WL2, . . . have one end connected to a row selector (not illustrated) for suitably selecting the word lines WL1, WL2. The source lines SL have one ends connected to another row selector for suitably grounding the source lines SL.

Thus, the nonvolatile semiconductor memory device according to the present embodiment is constituted.

(Structure of the Nonvolatile Semiconductor Memory Device)

Then, the structure of the nonvolatile semiconductor memory device according to the present embodiment will be explained with reference to FIG. 30.

As illustrated in FIG. 30, on a semiconductor substrate 30, transistors 12 each having a gate electrode 34 and source/drain diffused layers 36, 38 are formed.

On the semiconductor substrate 30 with the first transistors 12 formed on, an inter-layer insulation film 40 is formed.

In the inter-layer insulation film 40, a contact plug 46 connected to the source/drain diffused layer 36, and contact plugs 48 connected to the source/drain diffused layers 38 are buried.

On the inter-layer insulation film 40, a source line 50(SL) electrically connected to the source/drain diffused layer 36 via the contact pug 46, and relay interconnections 52 electrically connected to the source/drain diffused layers 38 via the contact plugs 48 are formed.

On the inter-layer insulation film 40 with the source line 50 and the relay interconnections 52 formed on, an inter-layer insulation film 54 is formed. In the inter-layer insulation film 54, a contact plug 58 connected to the relay interconnection 52 is buried.

On the inter-layer insulation film 54 with the contact plug 58 buried in, a resistance memory elements 10a are formed. Resistance memory element 10a comprises a lower electrode 60 electrically connected to the source/drain diffused layer 38 via the contact plug 58, etc., a resistance memory layer 62a formed of a resistance memory material formed on the lower electrode 60, and an upper electrode 64 formed on the resistance memory layer 62a. As the material of the lower electrode 60 and the upper electrode 64, platinum, for example, is used. As the material of the resistance memory layer 62a, $NiO_X$, for example, is used. In the resistance memory element 62a, a dopant impurity for decreasing the electric resistance of the resistance memory element 62a is implanted. Because of $NiO_X$, which is a P-type semiconductor, a P-type dopant impurity is implanted in the resistance memory layer 62a.

As described above with reference to FIGS. 3A to 5B, with the resistance $R_{excl}$ of the region other than the filament region 67 being sufficiently small for the resistance $R_{fila}$ of the filament region 67, the resistance vale of the resistance $R_{excl}$ of the region other than the filament region 67 is dominant in the combined resistance of the resistance $R_{fila}$ of the filament region 67 and the resistance $R_{excl}$ of the region other than the filament region 67. The scatter of the resistance value of the resistance $R_{excl}$ of the region other than the filament region 67 is so little that the area of the region other than the filament region 67 is set sufficiently large, whereby the scatter of the resistance value of the resistance memory element can be made sufficiently small. In the present embodiment, the dopant impurity for decreasing the electric resistance is implanted in the resistance memory layer 62a, whereby the resistance $R_{excl}$ of the region other than the filament region 67 can be sufficiently small, and the resistance memory element 10a can have little scatter of the resistance value in the high resistance state.

On the inter-layer insulation film 54 with the resistance memory elements 10 formed on, an inter-layer insulation film 68 is formed. In the inter-layer insulation film 68, contact plugs 72 connected to the respective upper electrodes 64 of the resistance memory elements 10 are buried.

On the inter-layer insulation film 68 with the contact plugs 72 buried in, a bit line 74(BL) is formed. The bit line 74 is electrically connected to the upper electrodes 64 of the resistance memory elements 10 via the contact plugs 72.

Thus, the nonvolatile semiconductor memory device according to the present embodiment is constituted.

As described above, according to the present embodiment, because of the dopant impurity implanted in the resistance memory layer 62a for decreasing the electric resistance, the resistance $R_{excl}$ of the region other than the filament region 67 (see FIGS. 3A and 3B) can be made sufficiently small, whereby the resistance memory element 10a whose scatter of the resistance value in the high resistance state is little can be provided. Thus, according to the present embodiment, the nonvolatile semiconductor memory device can effectively prevent read errors.

Next, the writing method and the reading method of the nonvolatile semiconductor memory device according to the present embodiment will be explained with reference to FIG. 29.

(Writing Method)

First, the reset of the resistance memory elements 10a, i.e., the write of the high resistance state in the resistance memory elements 10a will be explained with reference to FIG. 29.

When the high resistance state is written in a resistance memory element 10a, the word line WL1, WL2 connected to the memory cell 14 to be written is selected by a row selector (not illustrated). Specifically, a prescribed voltage is applied to the word line WL1, WL2 connected to the memory cell 14 to be written by the row selector. The source line SL is connected to a prescribed reference potential, e.g., the ground potential. Thus, the transistor 12 of the memory cell 14 to be written is turned on-state.

Next, the bit line BL connected to the memory cell 14 to be written is selected by the column selector (not illustrated). Specifically, a prescribed voltage is applied for a prescribed period of time to the bit line BL connected to the memory cell 14 to be written.

Thus, the high resistance state is written in the resistance memory element 10a of the memory cell 14 to be written.

Next, the set of the resistance memory elements 10a, i.e., the write of the low resistance state in the resistance memory elements 10a will be explained with reference to FIG. 29.

When the low resistance state is written in a resistance memory element 10a, the word line WL1, WL2 connected to the memory cell 14 to be written is selected by the row selector (not illustrated). Specifically, a prescribed voltage is applied to the word line WL1, WL2 connected to the memory cell 14 to be written. The source line SL is connected to a prescribed reference potential, e.g., the ground potential. Thus, the transistor 12 of the memory cell 14 to be written is turned on-state.

Then, the bit line BL connected to the memory cell 14 to be written is selected by the column selector (not illustrated). Specifically, a prescribed voltage is applied for a prescribed period of time to the bit line BL connected to the memory cell 14 to be written.

Thus, the low resistance state is written in the resistance memory element 10a of the memory cell 14 to be written.

(Reading Method)

Next, the reading method of the nonvolatile semiconductor memory device according to the present embodiment will be explained with reference to FIG. 29.

When information written in the resistance memory elements 10a of the memory cells 14 is read, the word line WL1, WL2 connected to a memory cell 14 to be read is selected by the row selector (not illustrated). Specifically, a prescribed voltage is applied by the row selector to the word line WL1, WL2 connected to the memory cell 14 to be read. The source line SL is connected to a prescribed reference potential, e.g., the ground potential. Thus, the first transistor 12 of the memory cell 14 to be read is turned on-state.

Next, the bit line BL connected to the memory cell 14 to be read is selected by the column selector (not illustrated). Thus, the bit line BL selected by the column selector is connected to the read circuit (not illustrated). When the high resistance state has been written in the resistance memory element 10a of the memory cell 14 to be read, a relatively small current flows in the bit line BL. On the other hand, when the low resistance state has been written in the resistance memory element 10a of the memory cell 14 to be read, a relatively large current flows in the bit line BL. The read circuit detects the current flowing in the bit line BL by the sense amplifier and judges whether the resistance memory element 10a in the low resistance state or the high resistance state. That is, the read circuit read the information written in resistance memory element 10a, based on the current flowing in the bit line BL.

[Modified Embodiments]

The embodiment is not limited to the above-described embodiments and can cover other various modifications.

For example, in the above-described embodiments, as the resistance memory material forming the resistance memory layer 62, $NiO_X$ is used. However, the resistance memory material forming the resistance memory layer 62 is not limited to $NiO_X$. The resistance memory material forming the resistance memory layer 62 can be, e.g., $TiO_X$, $SrTiO_X$, $YO_X$, $CeO_X$, $CoO_X$, $MgO_X$, $ZnO_X$, $ZrO_X$, $WO_X$, $NbO_X$, $TaO_X$, $CrO_X$, $MnO_X$, $AlO_X$, $VO_X$, $SiO_X$ or others.

As the electrode material forming the lower electrode 60 and the upper electrode 64, platinum is used. However, the electrode material forming the lower electrode 60 and the upper electrode 64 is not limited to platinum. The electrode material forming the lower electrode 60 and the upper electrode 64 can be, e.g., Ir, W, Ni, Au, Cu, Ag, Pd, Zn, Cr, Al, Mn, Ta, Si, TaN, TiN, Ru, ITO, NiO, IrO, SrRuO, $CoSi_2$, $WSi_2$, NiSi, $MoSi_2$, $TiSi_2$, Al—Si alloy, Al—Cu alloy, Al—Si—Cu alloy or others.

In the eleventh embodiment, as a dopant impurity, Li is implanted in the resistance memory layer 62a formed of $NiO_X$. However, the dopant impurity to be implanted in the resistance memory layer 62a is not limited to Li. When an N-type semiconductor is used as the material of the resistance memory layer 62a, an N-type dopant impurity may be implanted. A P-type dopant impurity may be implanted when a P-type semiconductor is used as the material of the resistance memory layer 62a. For example, $TiO_2$, $SrTiO_3$ or $ZnO_X$, which are N-type semiconductors, is used as the material of the resistance memory layer 62a, an N-type dopant impurity may be implanted in the resistance memory layer 62a. For example, $TiO_2$ is used as the material of the resistance memory layer 62a, Nb or others, for example, may be implanted as the N-type dopant impurity. When $SrTiO_3$ is used as the material of the resistance memory layer 62a, Nb or others, for example, may be implanted as the N-type dopant impurity. When $ZnO_X$ is used as the material of the resistance memory layer 62a, Al, In, Ga or others, for example, may be implanted as the N-type dopant impurity. When $SnO_X$ is used as the material of the resistance memory layer 62a, Sb or others, for example, may be implanted as the dopant impurity. When $CdO_X$ is used as the material of the resistance memory layer 62a, In or others, for example, may be implanted as the dopant impurity. When $In_2O_3$ is used as the material of the resistance memory layer 62a, Sn or others, for example, may be implanted as the dopant impurity. When $CoO_X$, $MnO_X$, $Bi_2O_3$ or $Cr_2O_3$, which are P-type semiconductors, are used as the material of the resistance memory layer 62a, a P-type dopant impurity may be implanted in the resistance memory layer 62a. When $CoO_X$ is used as the material of the resistance memory layer 62a, Li or others, for example, may be implanted as the P-type dopant impurity. When $MnO_X$ is used as the material of the resistance memory layer 62a, Li or others, for example, may be implanted as the P-type dopant impurity. When $Ni_2O_3$ is sued as the material of the resistance memory layer 62a, Ba or other, for example, may be implanted as the P-type dopant impurity. When $Cr_2O_3$ is used as the material of the resistance memory layer 62*a*, Mg or others, for example, may be implanted as the P-type dopant impurity.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A nonvolatile semiconductor memory device comprising:
   a memory cell including a resistance memory element which memorizes a high resistance state or a low resistance state, switches the high resistance state and the low resistance state by voltage application, one end of the resistance memory element being coupled to a bit line, the other end of the resistance memory element being coupled to a source line via the first transistor; and
   a resistor whose resistance value is higher than a resistance value of the resistance memory element in the low resistance state and lower than a resistance value of the resistance memory element in the high resistance state, one end of the resistor being directly electrically connected to said one end of the resistance memory element and the bit line, the other end of the resistor being coupled to the source line via the second transistor.

2. The nonvolatile semiconductor memory device according to claim 1, wherein
   the resistor is formed of a polysilicon layer.

3. The nonvolatile semiconductor memory device according to claim 1, wherein
   the resistor is formed of an impurity diffused layer.

4. The nonvolatile semiconductor memory device according to claim 1, wherein
   the resistor is formed of another resistance memory element, and
   a device area of said another resistance memory element is larger than a device area of the resistance memory element.

5. The nonvolatile semiconductor memory device according to claim 1, wherein
   a plurality of said memory cells are laid out in a matrix, and
   the resistor is provided for each of said a plurality of memory cells.

6. The nonvolatile semiconductor memory device according to claim 1, wherein
   a plurality of said memory cells are laid out in a matrix, and
   said one ends of a plurality of said resistance memory elements preset in one and the same column are commonly coupled to said one end of the resistor via the bit line.

7. The nonvolatile semiconductor memory device according to claim 1, wherein
   the resistance memory element comprises the first electrode, a resistance memory layer formed over the first electrode, and the second electrode formed over the resistance memory layer, and
   the resistance memory layer is formed of $NiO_x$, $TiO_x$, $SrTiO_x$, $YO_x$, $CeO_x$, $CoO_x$, $MgO_x$, $ZnO_x$, $ZrO_x$, $WO_x$, $NbO_x$, $TaO_x$, $CrO_x$, $MnO_x$, $AlO_x$, $VO_x$ or $SiO_x$.

8. The nonvolatile semiconductor memory device according to claim 1, wherein
   the resistance memory element comprises the first electrode, a resistance memory layer formed over the first electrode, and the second electrode formed over the resistance memory layer, and
   the first electrode or the second electrode is formed of Pt, Ir, W, Ni, Au, Cu, Ag, Pd, Zn, Cr, Al, Mn, Ta, Si, TaN, TiN, Ru, ITO, NiO, IrO, SrRuO, $CoSi_2$, $WSi_2$, NiSi, $MoSi_2$, $TiSi_2$, Al—Si alloy, Al—Cu alloy or Al—Si—Cu alloy.

9. A reading method of a nonvolatile semiconductor memory device comprising:
   a memory cell including a resistance memory element which memorizes a high resistance state or a low resistance state, switches the high resistance state and the low resistance state by voltage application, one end of the resistance memory element being coupled to a bit line, the other end of the resistance memory element being coupled to a source line via the first transistor; and
   a resistor whose resistance value is higher than a resistance value of the resistance memory element in the low resistance state and lower than a resistance value of the resistance memory element in the high resistance state, one end of the resistor being directly electrically connected to said one end of the resistance memory element and the bit line, the other end of the resistor being coupled to the source line via the second transistor,
   information written in the memory cell being read, based on a current flowing in the bit line when a prescribed voltage is applied to a gate terminal of the first transistor so that the first transistor is turned on-state, a prescribed voltage is applied to a gate terminal of the second transistor so that the second transistor is turned on-state, the source line is grounded, and a prescribed voltage is applied to the bit line.

* * * * *